(12) United States Patent
Otake et al.

(10) Patent No.: US 12,419,126 B2
(45) Date of Patent: Sep. 16, 2025

(54) PHOTODETECTOR

(71) Applicant: SONY SEMICONDUCTOR SOLUTIONS CORPORATION, Kanagawa (JP)

(72) Inventors: Yusuke Otake, Kanagawa (JP); Akira Matsumoto, Kanagawa (JP); Junpei Yamamoto, Kanagawa (JP); Ryusei Naito, Nagasaki (JP); Masahiko Nakamizo, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/378,504

(22) Filed: Oct. 10, 2023

(65) Prior Publication Data

US 2024/0038810 A1   Feb. 1, 2024

Related U.S. Application Data

(63) Continuation of application No. 17/490,829, filed on Sep. 30, 2021, now Pat. No. 12,046,618, which is a
(Continued)

(30) Foreign Application Priority Data

Oct. 18, 2016   (JP) .................................. 2016-204475
Mar. 2, 2017    (JP) .................................. 2017-039336
(Continued)

(51) Int. Cl.
*H10F 39/00*   (2025.01)
*H10F 30/225*  (2025.01)
(Continued)

(52) U.S. Cl.
CPC ......... *H10F 39/807* (2025.01); *H10F 30/225* (2025.01); *H10F 39/199* (2025.01);
(Continued)

(58) Field of Classification Search
None
See application file for complete search history.

(56) References Cited

U.S. PATENT DOCUMENTS 10,446,601 B2   10/2019   Otake et al.
10,580,817 B2    3/2020   Otake et al.
(Continued)

FOREIGN PATENT DOCUMENTS

CN   104576667 A     4/2015
CN   104620385       5/2015
(Continued)

OTHER PUBLICATIONS

Official Action for U.S. Appl. No. 17/490,829, dated Dec. 22, 2023, 13 pages.
(Continued)

*Primary Examiner* — Feifei Yeung Lopez
(74) *Attorney, Agent, or Firm* — SHERIDAN ROSS P.C.

(57) ABSTRACT

A sensor includes a first substrate including at least a first pixel. The first pixel includes an avalanche photodiode to convert incident light into electric charge and includes an anode and a cathode. The cathode is in a well region of the first substrate. The first pixel includes an isolation region that isolates the well region from at least a second pixel that is adjacent to the first pixel. The first pixel includes a hole accumulation region between the isolation region and the well region. The hole accumulation region is electrically connected to the anode.

20 Claims, 56 Drawing Sheets

Related U.S. Application Data continuation of application No. 16/905,485, filed on Jun. 18, 2020, now abandoned, which is a continuation of application No. 16/694,195, filed on Nov. 25, 2019, now Pat. No. 10,804,309, which is a continuation of application No. 16/409,494, filed on May 10, 2019, now Pat. No. 10,580,817, which is a continuation of application No. 16/060,509, filed as application No. PCT/JP2017/037748 on Oct. 18, 2017, now Pat. No. 10,446,601.

(30) Foreign Application Priority Data

Jun. 9, 2017 (JP) ................................ 2017-114380
Aug. 4, 2017 (JP) ................................ 2017-152060

(51) Int. Cl.
  *H10F 39/12* (2025.01)
  *H10F 77/30* (2025.01)
  *H10F 77/40* (2025.01)

(52) U.S. Cl.
  CPC ....... *H10F 39/8027* (2025.01); *H10F 39/803* (2025.01); *H10F 39/8033* (2025.01); *H10F 39/8057* (2025.01); *H10F 39/809* (2025.01); *H10F 39/811* (2025.01); *H10F 77/331* (2025.01); *H10F 77/413* (2025.01); *H10F 39/8037* (2025.01); *H10F 39/8063* (2025.01)

(56) References Cited

U.S. PATENT DOCUMENTS

| | | | |
|---|---|---|---|
| 10,804,309 B2 | 10/2020 | Otake et al. | |
| 2009/0200625 A1 | 8/2009 | Venezia et al. | |
| 2010/0148040 A1 | 6/2010 | Sanfilippo | |
| 2010/0247403 A1* | 9/2010 | Hancock | A61L 2/14 422/186.29 |
| 2011/0272561 A1 | 11/2011 | Sanfilippo | |
| 2013/0193546 A1 | 8/2013 | Webster et al. | |
| 2014/0291481 A1 | 10/2014 | Zhang et al. | |
| 2014/0291793 A1 | 10/2014 | Tanaka | |
| 2015/0076649 A1 | 3/2015 | Kim | |
| 2015/0200314 A1 | 7/2015 | Webster | |
| 2015/0255495 A1 | 9/2015 | Park | |
| 2015/0285625 A1 | 10/2015 | Deane | |
| 2015/0333210 A1 | 11/2015 | Teva et al. | |
| 2016/0020239 A1 | 1/2016 | Liu et al. | |
| 2016/0204150 A1 | 7/2016 | Oh et al. | |
| 2016/0218236 A1 | 7/2016 | Dhulla et al. | |
| 2016/0353084 A1 | 12/2016 | Sun et al. | |
| 2017/0031010 A1 | 2/2017 | Suzuki et al. | |
| 2017/0062501 A1 | 3/2017 | Velichko et al. | |
| 2017/0263798 A1 | 9/2017 | Suzuki et al. | |
| 2018/0090526 A1* | 3/2018 | Mandai | H01L 27/14609 |
| 2020/0321369 A1 | 10/2020 | Otake et al. | |
| 2022/0020789 A1 | 1/2022 | Otake et al. | |

FOREIGN PATENT DOCUMENTS

| | | |
|---|---|---|
| CN | 104779317 | 7/2015 |
| CN | 105374834 A | 3/2016 |
| CN | 105593995 | 5/2016 |
| EP | 2787531 | 10/2014 |
| JP | 2009-525619 | 7/2009 |
| JP | 2010-219339 | 9/2010 |
| JP | 2012-015274 | 1/2012 |
| JP | 2013-048278 | 3/2013 |
| JP | 2013118345 A | 6/2013 |
| JP | 2013-175494 | 9/2013 |
| JP | 2014-192348 | 10/2014 |
| JP | 2014192348 A | 10/2014 |
| JP | 2014-225647 | 12/2014 |
| JP | 2015-032663 | 2/2015 |
| JP | 2015-041746 | 3/2015 |
| JP | 2016-054478 | 4/2016 |
| JP | 2018-201005 | 12/2018 |
| KR | 10-2014-0119648 | 10/2014 |
| KR | 10-2014-0141823 | 12/2014 |
| KR | 20150135265 A | 12/2015 |
| WO | WO 2008/048694 | 4/2008 |
| WO | WO 2008/129433 | 10/2008 |

OTHER PUBLICATIONS

Jackson et al., "Towards integrated single photon counting microarrays," Optical Engineering, vol. 42, No. 1, Jan. 2003, pp. 112-118.
International Search Report and Written Opinion prepared by the European Patent Office on Jan. 8, 2018, for International Application No. PCT/JP2017/037748.
Official Action for U.S. Appl. No. 16/060,509, dated Jan. 11, 2019, 10 pages.
Notice of Allowance for U.S. Appl. No. 16/060,509, dated May 28, 2019, 8 pages.
Official Action for U.S. Appl. No. 16/409,494, dated Jul. 11, 2019, 6 pages.
Notice of Allowance for U.S. Appl. No. 16/409,494, dated Oct. 18, 2019, 7 pages.
Notice of Allowance for U.S. Appl. No. 16/409,494, dated Jan. 15, 2020, 5 pages.
Official Action for U.S. Appl. No. 16/694,195, dated Apr. 8, 2020, 7 pages.
Notice of Allowance for U.S. Appl. No. 16/694,195, dated Jun. 8, 2020, 7 pages.
Official Action for U.S. Appl. No. 16/905,485, dated Jul. 13, 2020, 15 pages.
Official Action for U.S. Appl. No. 16/905,485, dated Dec. 11, 2020, 6 pages.
Official Action for U.S. Appl. No. 16/905,485, dated Mar. 23, 2021, 14 pages.
Official Action for U.S. Appl. No. 16/905,485, dated Jul. 1, 2021 9 pages.
Official Action for U.S. Appl. No. 17/490,829, dated Nov. 18, 2022, 10 pages.

* cited by examiner

FIG.18
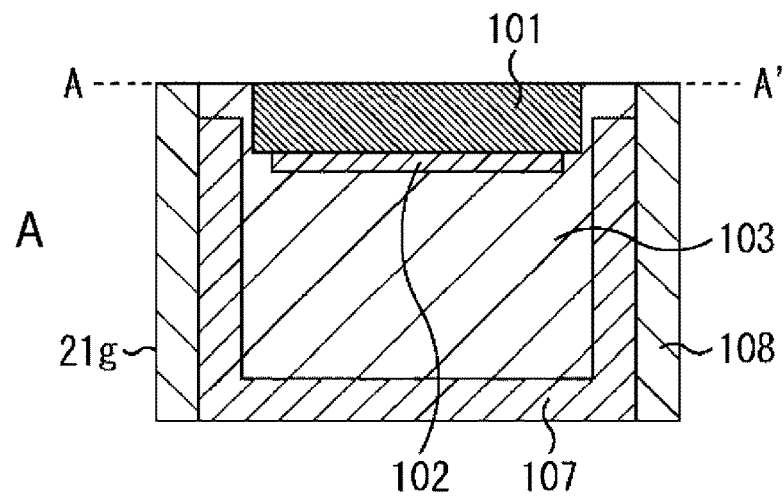
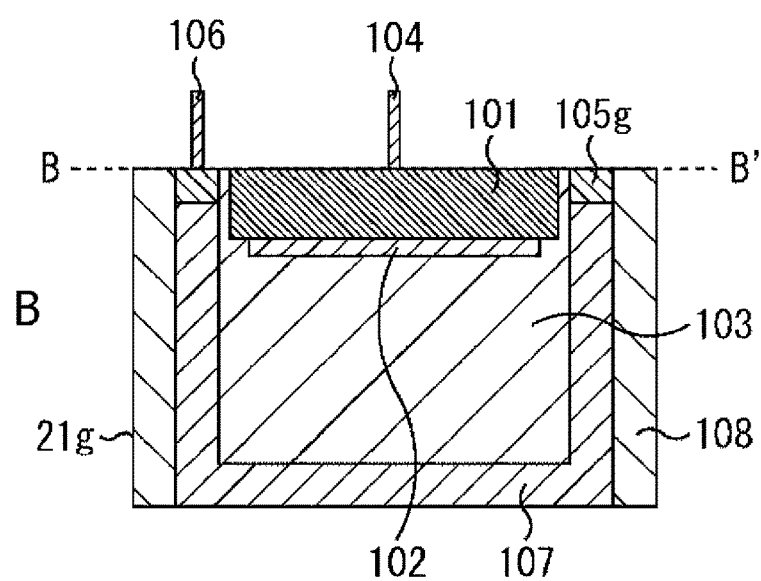

FIG.53
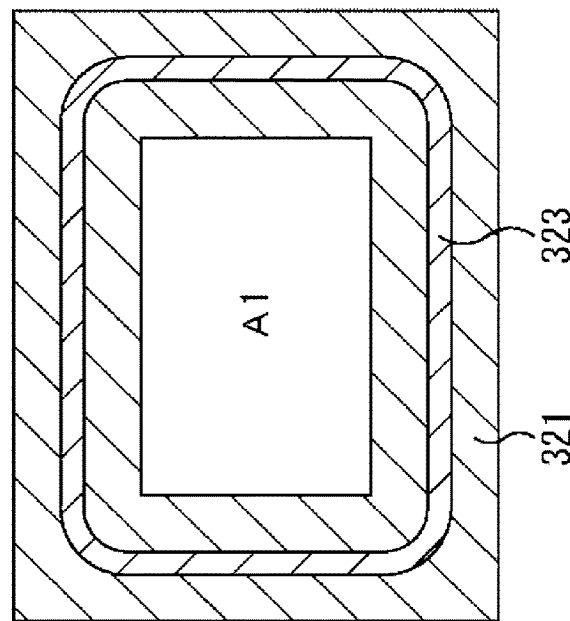
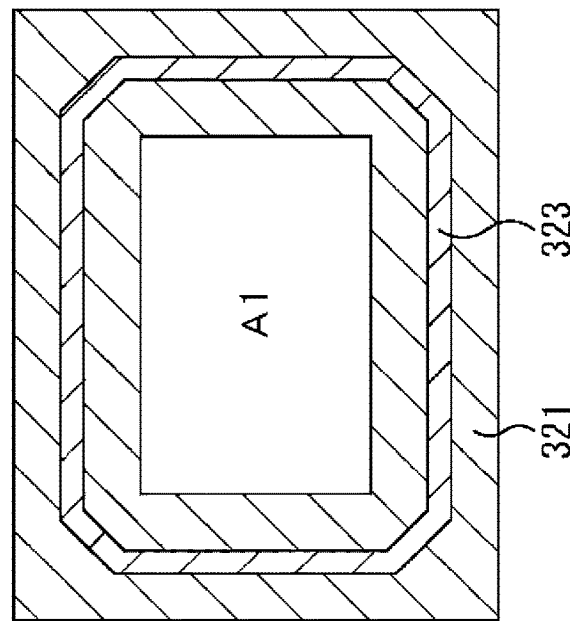

PHOTODETECTOR

CROSS REFERENCE TO RELATED APPLICATIONS

This application is a continuation of and claims priority to U.S. patent application Ser. No. 17/490,829, filed Sep. 30, 2021, which is a continuation of and claims priority to U.S. patent application Ser. No. 16/905,485, filed Jun. 18, 2020, which is a continuation of and claims priority to U.S. patent application Ser. No. 16/694,195, filed Nov. 25, 2019, now U.S. Pat. No. 10,804,309, which is a continuation of and claims priority to U.S. patent application Ser. No. 16/409,494, filed May 10, 2019, now U.S. Pat. No. 10,580,817, which is a continuation of and claims priority to U.S. patent application Ser. No. 16/060,509, filed Jun. 8, 2018, now U.S. Pat. No. 10,446,601, which is a national stage application under 35 U.S.C. 371 and claims the benefit of PCT Application No. PCT/JP2017/037748 having an international filing date of Oct. 18, 2017, which designated the United States, which PCT application claimed the benefit of Japanese Patent Application No. 2016-204475, filed Oct. 18, 2016; Japanese Patent Application No. 2017-039336, filed Mar. 2, 2017; Japanese Patent Application No. 2017-114380 filed Jun. 9, 2017; and Japanese Patent Application No. 2017-152060, filed Aug. 4, 2017, the entire contents of each of which are incorporated herein by reference.

TECHNICAL FIELD

The present technology relates to a photodetector, for example, a photodetector which is suitable for application to an avalanche photodiode.

BACKGROUND ART

An avalanche photodiode (APD) has a Geiger mode in which it is operated with a bias voltage lower than a breakdown voltage and a linear mode in which it is operated with a slightly high bias voltage in the vicinity of the breakdown voltage. The avalanche photodiode in the Geiger mode is also called single photon avalanche diode (SPAD).

The SPAD is a device capable of detecting a single photon on a pixel basis, by a process in which carriers generated by photoelectric conversion are multiplied in a high-electric-field PN junction region provided on a pixel basis.

In PTL 1, there is proposed a technology in which a layer for forming a high-electric-field region is embedded and is depleted by a bias, for the purpose of enhancing sensitivity of SPAD pixels. In PTL 2, there is proposed a technology for realizing a reduction of crosstalk to neighboring pixels due to light emission in a high-electric-field region, by a structure having an isolation between pixels.

CITATION LIST

Patent Literature

[PTL 1]
JP 2015-41746A
[PTL 2]
JP 2013-48278A

SUMMARY OF INVENTION

Technical Problems

In PTL 1, light emission in a high-electric-field region in a pixel at the time of multiplication of carriers may cause a photon to be incident on a neighboring pixel, whereby a signal may be detected in the neighboring pixel in an unintended manner. In addition, a well potential may be varied by a current at the time of multiplication, whereby electric fields in the neighboring pixels may be varied and SPAD characteristics may be varied.

In PTL 2, an isolation region is formed between pixels in order to reduce crosstalk. Physical isolation between the pixels by use of an insulating film is the most effective in reducing the crosstalk. However, it is generally known that a dark current is generated at an interface between the insulating film and silicon. According to PTL 2, therefore, a dark current may be generated. Multiplication of the dark current generated at the interface may worsen DCR (dark count rate).

The present technology has been made in consideration of the above-mentioned circumstances. Accordingly, it is an object of the present technology to enable provision of an APD that is capable of reducing crosstalk and suppressing DCR.

Solution to Problem

According to an aspect of the present technology, a sensor includes a first substrate including at least a first pixel. The first pixel includes an avalanche photodiode to convert incident light into electric charge and includes an anode and a cathode. The cathode is in a well region of the first substrate. The first pixel includes an isolation region that isolates the well region from at least a second pixel that is adjacent to the first pixel. The first pixel includes a hole accumulation region between the isolation region and the well region. The hole accumulation region is electrically connected to the anode.

According to a second aspect of the present technology, a sensor includes substrate including at least one pixel. The at least one pixel includes an avalanche photodiode to convert incident light into electric charge and includes a cathode of a first conductivity type and an anode of a second conductivity type. The cathode is in a well region of the first conductivity type, and the anode is at a perimeter of the well region. The at least one pixel includes a first material of the second conductivity type around the well region. The first material is electrically connected to the anode. The at least one pixel includes an insulating material around the first material and the anode.

According to a third aspect of the present technology, a sensor includes a first substrate including at least a first pixel in a pixel region. The first pixel includes an avalanche photodiode to convert incident light to electric charge and includes a first region, a second region, and a third region. The first and third regions are a first conductivity type and are stacked. The second region is a second conductivity type. The first pixel includes an isolation region that isolates the third region from at least a second pixel, wherein the isolation region penetrates through the first substrate. The first pixel includes a charge accumulation region of the second conductivity type between the third region and the isolation region. The charge accumulation region is electrically connected to the second region.

In at least one additional aspect of the present technology, a high-electric-field region, an isolation region for isolation from neighboring pixels, and an electron accumulation region that accumulates electrons on a side wall of the isolation region are provided, and the electron accumulation region is electrically connected with an anode.

Advantageous Effects of Invention

According to an aspect of the present technology, an APD capable of reducing crosstalk and suppressing DCR can be provided.

Note that the effect described here is not necessarily restrictive, and any of the effects described herein may be attained.

BRIEF DESCRIPTION OF DRAWINGS

FIG. 18 includes a sectional view of another configuration of the APD.
FIG. 53 is a plan view for explaining shapes of a trench in the configuration of the peripheral region.

DESCRIPTION OF EMBODIMENTS

Modes for carrying out the present technology (hereinafter referred to as embodiments) will be described below.

The present technology as described below is applicable to a photodetector. In addition, since the present technology is applicable particularly to an avalanche photodiode (APD) as a photodetector, description will be made here taking an APD as an example. An APD has a Geiger mode in which it is operated with a bias voltage lower than its breakdown voltage and a linear mode in which it is operated at a slightly high bias voltage in the vicinity of the breakdown voltage. The APD in the Geiger mode is also called single photon avalanche diode (SPAD).

The SPAD is a device capable of detecting a single photon on a pixel basis, by a process in which carriers generated by photoelectric conversion are multiplied in a high-electric-field PN junction region provided on a pixel basis. When the present technology is applied to an SPAD among APDs, a higher effect can be obtained.

<Front Side Illumination Type Pixel>

Figure 1:
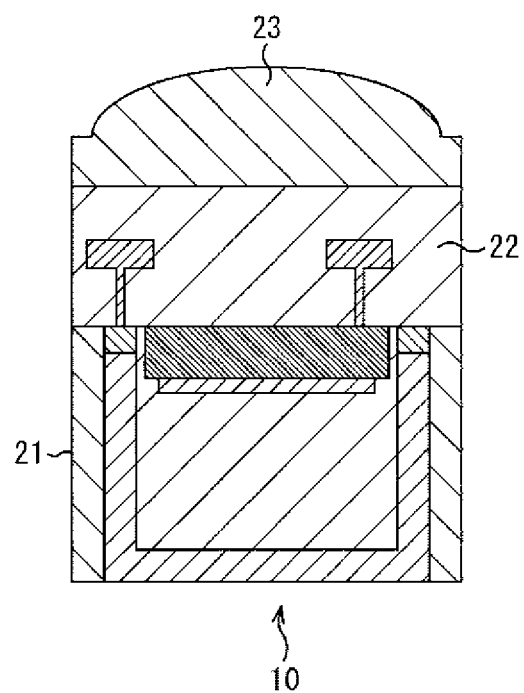
FIG. 1 depicts a configuration of a first embodiment of an APD to which the present technology has been applied.

FIG. 1 depicts a configuration of a front side illumination type APD. A pixel 10, when referred to from the lower side in the figure, has a configuration in which a wiring layer 22 is stacked on an APD 21, and an on-chip lens 23 is stacked on the wiring layer 22. Detailed configuration of the APD 21 will be described later.

Light is incident from the on-chip lens 23 side (in FIG. 1, the upper side), and is incident on the APD 21 through the wiring layer 22. In the case of the front side illumination type APD 10, a circuit is disposed in a region outside a pixel area, and the circuit is disposed in a same substrate.

<Backside Illumination Type APD>

Figure 2:
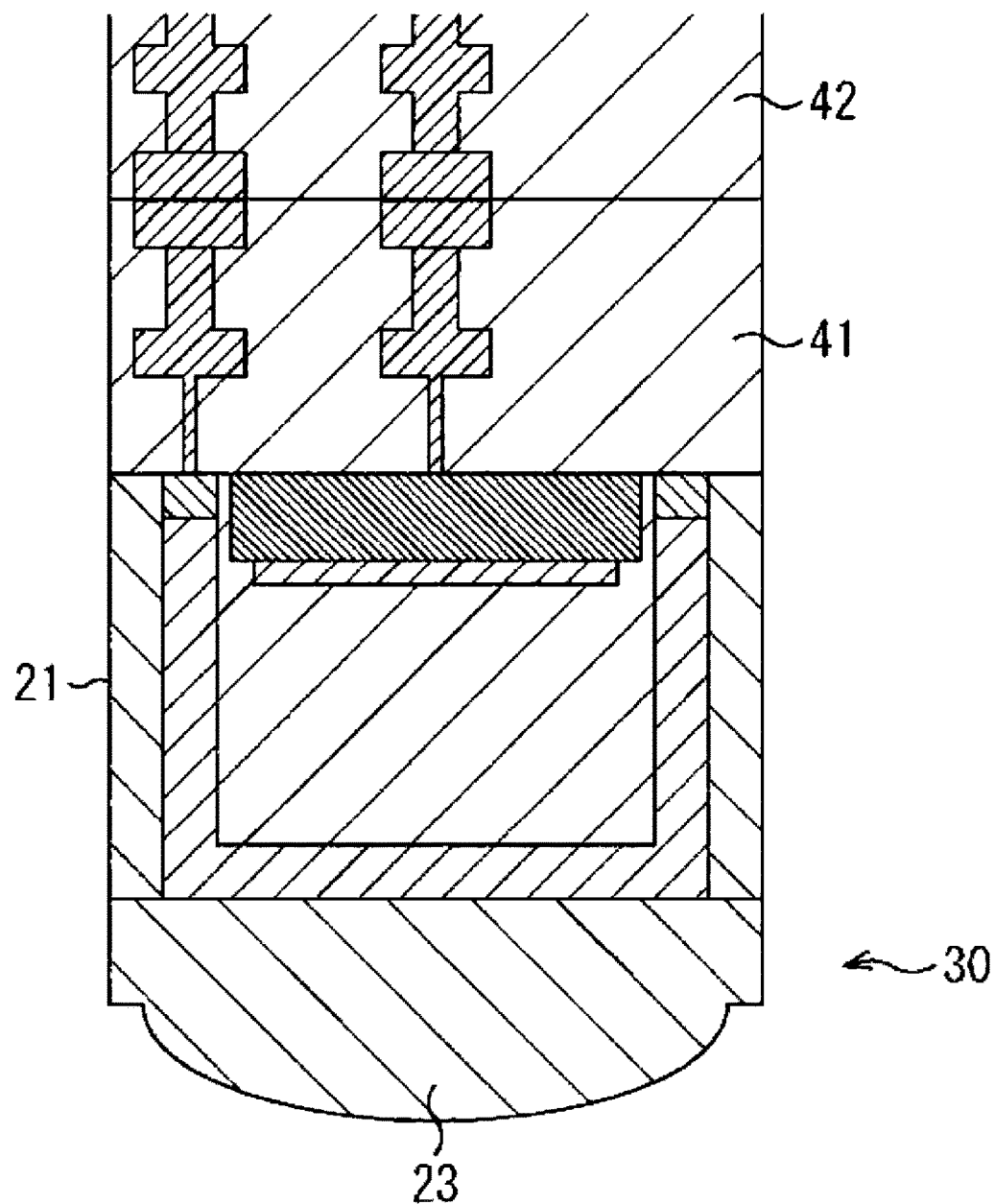
FIG. 2 depicts another configuration of the APD.

FIG. 2 depicts a configuration of a backside illumination type pixel. A pixel 30, when referred to from the lower side in the figure, has a configuration in which an APD 21 is stacked on an on-chip lens 23, a sensor substrate 41 is stacked on the APD 21, and a circuit substrate 42 is stacked on the sensor substrate 41.

Light is incident from the on-chip lens 23 side (in FIG. 2, the lower side), and is incident on the APD 21. In the case of the backside illumination type pixel 30, a configuration in which the circuit is stacked as the circuit substrate 42 as depicted in FIG. 2 may be adopted, or a configuration in which the circuit is disposed in a region outside the pixel area and is disposed in the same substrate may be adopted.

The present technology is applicable to both the front side illumination type pixel 10 as depicted in FIG. 1 and the backside illumination type pixel 30 as depicted in FIG. 2. The following description will be made taking the backside illumination type pixel 30 as an example. In the following description, only the APD 21 is illustrated, and the on-chip lens 23 is omitted from illustration.

Configuration of APD in First Embodiment

Figure 3:
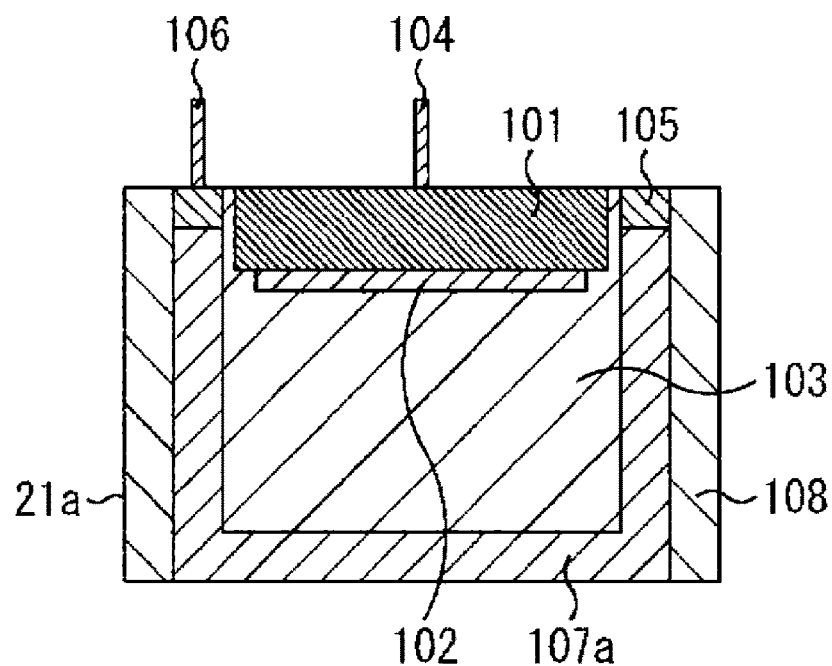
FIG. 3 is a sectional view of the APD.

FIG. 3 depicts a sectional configuration in a first embodiment of the APD 21. As depicted in FIG. 3, an APD 21a includes an n-type semiconductor region 101 of which the conductivity type is n type (first conductivity type), and a p-type semiconductor region 102 of which the conductivity type is p type (second conductivity type) and which is formed under the n-type semiconductor region 101. The n-type semiconductor region 101 and the p-type semiconductor region 102 are formed in a well layer 103.

The well layer 103 may be a semiconductor region of n-type conductivity, or may be a semiconductor region of p-type conductivity. In addition, the well layer 103 is preferably an n-type or p-type semiconductor region of a low concentration of not more than 1E14 order, for example, whereby the well layer 103 can be easily depleted, and enhanced PDE can be realized.

The n-type semiconductor region 101 is a semiconductor region of n-type conductivity which includes, for example, Si (silicon) and has a high impurity concentration. The p-type semiconductor region 102 is a semiconductor region of p-type conductivity which has a high impurity concentration. The p-type semiconductor region 102 constitutes a pn junction at its interface with the n-type semiconductor region 101. The p-type semiconductor region 102 has a multiplication region in which carriers generated by incidence of light to be detected are put to avalanche multiplication. The p-type semiconductor region 102 is preferably in a depleted state, whereby enhanced PDE can be realized.

The n-type semiconductor region 101 functions as a cathode, and is connected to a circuit through a contact 104. An anode 105 opposed to the cathode is formed in the same layer as the n-type semiconductor region 101, between the n-type semiconductor region 101 and an isolation region 108. The anode 105 is connected to a circuit through a contact 106.

The isolation region 108 for isolating the APDs 21a from each other is formed, and a hole accumulation region 107a is formed between the isolation region 108 and the well layer 103. The hole accumulation region 107a is formed on the lower side of the anode 105, in the state of being electrically connected with the anode 105. In addition, the hole accumulation region 107a is formed between the well layer 103 and the isolation region 108. Further, the hole accumulation region 107a is also formed under the well layer 103 (on the back side of the APD 21a).

The hole accumulation region 107a is formed at a part where different materials make contact. In the example depicted in FIG. 3, the isolation region 108 includes, for example, a silicon oxide film, which is a different material from the well layer 103. Therefore, the hole accumulation region 107a is formed for suppressing a dark current generated at the interface.

In addition, in the case where the APD 21a is applied to the backside illumination type, for example as depicted in FIG. 2, the on-chip lens 23 is stacked on the lower side (on the side opposite to the side where the n-type semiconductor region 101 is formed) of the well layer 103, and, in this case, the hole accumulation region 107a is formed also at the interface with the well layer 103 on the side where the on-chip lens 23 is formed.

Besides, in the case where the APD 21a is applied to the front side illumination type, for example as depicted in FIG. 1, the silicon substrate is present on the lower side (on the side opposite to the side where the n-type semiconductor region 101 is formed) of the well layer 103, and, therefore, a configuration may be adopted in which the hole accumulation region 107a is not formed. Naturally, even in the case where the APD 21a is applied to the front side illumination type, the hole accumulation region 107a may be formed on the lower side of the well layer 103.

In other words, the hole accumulation region 107a may be formed on other surfaces than the upper surface (the surface on which the n-type semiconductor region 101 is formed) of the well layer 103. Alternatively, the hole accumulation region 107a may be formed on other surfaces than the upper and lower surfaces of the well layer 103.

The hole accumulation region 107a may be formed as a p-type semiconductor region.

Figure 4:
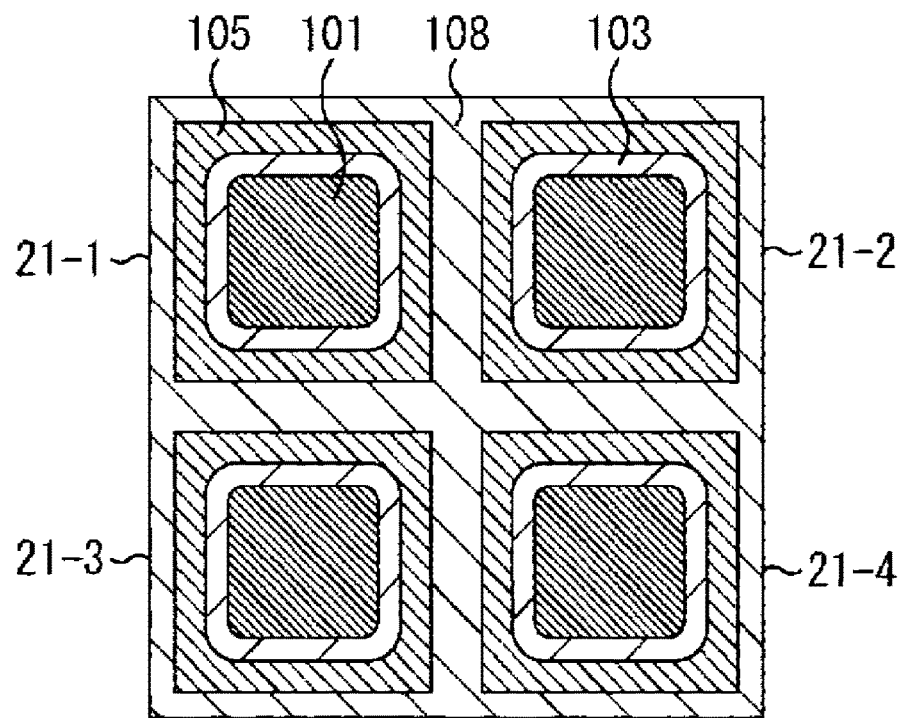
FIG. 4 is a plan view of the APD.

The isolation region 108 is formed between the APDs 21a, to isolate each of the APDs 21a. Specifically, the isolation region 108 is formed in such a manner that multiplication regions are formed in one-to-one correspondence with the APDs 21a. As depicted in FIG. 4, the isolation region 108 is formed in a two-dimensional grid pattern such as to perfectly surround the periphery of each multiplication region (APD 21a). As illustrated in FIG. 3, the isolation region 108 is formed to penetrate from the upper surface side to the lower surface side of the well layer 103 in the stacking direction. Note that other configuration than the configuration in which the isolation region 108 entirely penetrates from the upper surface side to the lower surface side of the well layer 103, for example, a configuration in which the isolation region 108 penetrates only part of the well layer 103 and is inserted into an intermediate portion of the substrate may be adopted.

FIG. 4 is a plan view of the APD 21a, as viewed from the upper surface side (the upward side in FIG. 3, namely, the n-type semiconductor region 101 side). In FIG. 4, an example is depicted in which four (2×2) APDs 21a-1 to 21a-4 are arranged.

As aforementioned, the APDs 21a are isolated from one another by the isolation region 108 formed in a grid pattern. The anodes 105 are formed inside the isolation region 108. The well layer 103 is formed between the anode 105 and the n-type semiconductor region 101. The n-type semiconductor region 101 is formed in a central area of the APD 21a.

Although the hole accumulation region 107a is not seen when viewed from the upper surface side, the hole accumulation region 107a is formed inside the isolation region 108. In other words, the hole accumulation region 107a is formed in a region which is substantially the same as the region of the anode 105.

Figure 5:
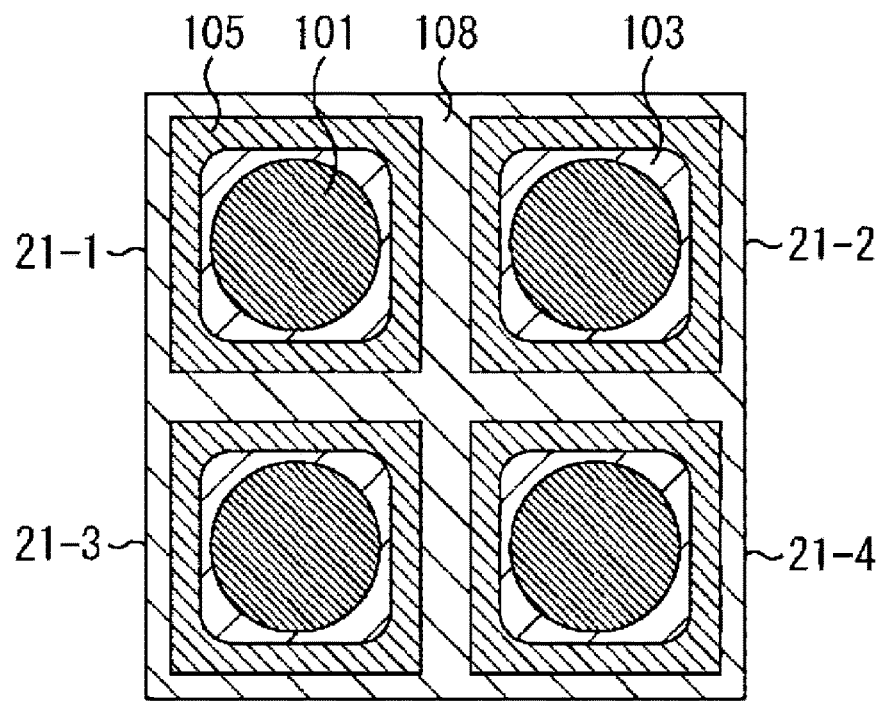
FIG. 5 is a plan view of the APD.

While an example in which the n-type semiconductor region 101 is formed in a tetragonal shape is illustrated in FIG. 4, the n-type semiconductor region 101 may be formed in a circular shape, as illustrated in FIG. 5.

In the case where the n-type semiconductor region 101 is formed in a tetragonal shape as depicted in FIG. 4, the area of the multiplication region (n-type semiconductor region 101) can be secured to be large, so that detection efficiency called PDE (Photon Detection Efficiency) can be enhanced.

In the case where the n-type semiconductor region 101 is formed in a circular shape as depicted in FIG. 5, electric field concentration at edge portions can be suppressed, so that unintentional edge breakdown can be reduced.

Description in the following will be made taking as an example a case in which the n-type semiconductor region 101 is formed in a tetragonal shape as depicted in FIG. 4, but the description may be applied also to a case in which the n-type semiconductor region 101 is formed in a circular shape as depicted in FIG. 5.

With the hole accumulation region 107a thus formed at the interface, electrons generated at the interface can be trapped, and DCR (dark count rate) can be suppressed. In addition, while the hole accumulation region 107a is described and description is made here taking as an example a case in which holes are accumulated and electrons are trapped, a configuration may be adopted in which electrons are accumulated and holes are trapped, as in an APD 21j (FIG. 23) that will be described as a tenth embodiment. In the case where holes are trapped, also, it is possible to suppress DCR.

In addition, with the isolation region 108 and the hole accumulation region 107a provided, it is possible to reduce electrical crosstalk and optical crosstalk. Besides, with the hole accumulation region 107a provided on side surfaces, lateral electric fields are generated, carriers can be collected into high-electric-field regions more easily, and PDE can be enhanced.

The hole accumulation region 107a can be formed by ion injection, solid-phase diffusion, induction by a fixed charge film, or the like.

Configuration of APD in Second Embodiment

Figure 6:
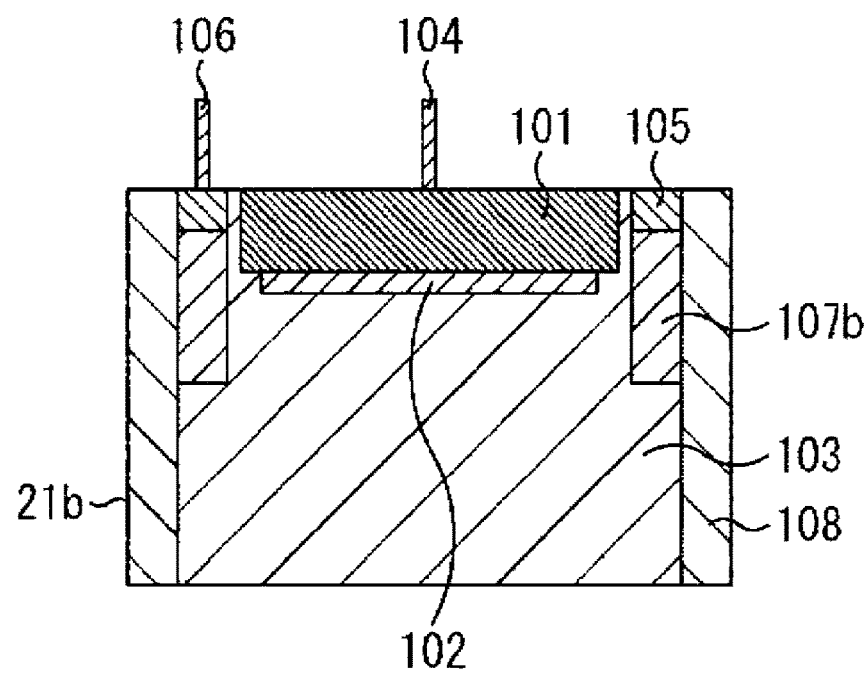
FIG. 6 is a sectional view of another configuration of the APD.

FIG. 6 depicts a sectional configuration in a second embodiment of the APD 21. Of an APD 21b depicted in FIG. 6, the parts similar to those of the APD 21a depicted in FIG. 3 are denoted by the same reference symbols as used above, and descriptions of them are omitted.

The APD 21b illustrated in FIG. 6 differs from the APD 21a depicted in FIG. 3 in the size of the region where the hole accumulation region 107 is formed. A hole accumulation region 107b of the APD 21b depicted in FIG. 6 is formed only at part of the portion where the isolation region 108 is formed.

As depicted in FIG. 6, the hole accumulation region 107b is formed in a region of at least part of a side wall of the isolation region 108. In addition, the hole accumulation region 107b thus formed is formed in the state of being electrically connected with the anode 105.

When the APD 21b depicted in FIG. 6 is viewed from the upper surface side, it is seen as depicted in FIG. 4 or FIG. 5. Besides, also in the APD 21b, like in the APD 21a (FIG. 3), the hole accumulation region 107b is formed under the anode 105. Like the anode 105 which is formed inside the isolation region 108 in such a manner as to continuously surround the well layer 103, the hole accumulation region 107b is also formed inside the isolation region 108 in such a manner as to continuously surround the well layer 103.

Also in the case where the hole accumulation region 107 is formed in this way, the formation of the hole accumulation region 107b in the vicinity of a high-electric-field region ensures that generation of a dark current from a portion near the high-electric-field region can be restrained, and DCR can be suppressed.

Also in the APD 21b, like in the APD 21a depicted in FIG. 3, there can be expected such effects as a reduction of crosstalk, an effect by which carriers can be easily collected into the high-electric-field region, and an effect by which PDE can be enhanced.

In addition, in the case where the hole accumulation region 107b is formed by ion injection, it is possible to reduce the number of ion injection steps required. For instance, in a case where the hole accumulation region 107a is formed ranging to a depth portion of a silicon substrate, as in the APD 21a depicted in FIG. 3, ion injection should be carried out multiple times, for example, n times. On the other hand, in a case where the hole accumulation region 107b is formed in part of a silicon substrate, as in the APD 21b depicted in FIG. 6, it is sufficient to carry out ion injection a number of times less than n times; thus, the number of ion injection steps required can be reduced, and process cost can be lowered.

According to the APD 21b in the second embodiment, DCR and process cost can be well balanced.

Configuration of APD in Third Embodiment

Figure 7:
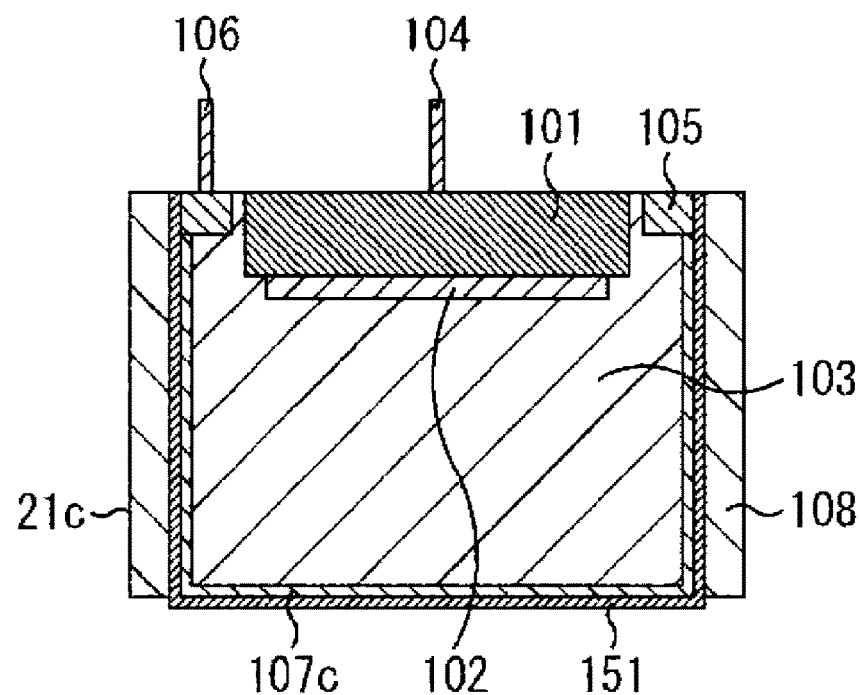
FIG. 7 is a sectional view of another configuration of the APD.

FIG. 7 depicts a sectional configuration in a third embodiment of the APD 21. Of an APD 21c illustrated in FIG. 7, the parts similar to those of the APD 21a depicted in FIG. 3 are denoted by the same reference symbols as used above, and descriptions of them are omitted.

The APD 21c depicted in FIG. 7 differs from the APD 21a depicted in FIG. 3 in that a fixed charge film that generates a hole accumulation region 107 is formed. A fixed charge film 151 is formed at side surfaces inside the isolation region 108, unlike the hole accumulation region 107a of the APD 21a depicted in FIG. 3. In addition, in the example depicted in FIG. 7, the fixed charge film 151 is formed also on the back surface side of the APD 21c.

Note that, like the hole accumulation region 107a of the APD 21a depicted in FIG. 3, the fixed charge film 151 also may not be formed on the back surface side of the APD 21c. In other words, the fixed charge film 151 may be formed only at the side surfaces inside the isolation region 108.

In addition, like in FIG. 6 (second embodiment), the fixed charge film 151 may be formed at part of the isolation region 108.

The fixed charge film 151 is a negative fixed charge film. On the inside of the fixed charge film 151, a hole accumulation region 107c is formed due to induction of holes by the fixed charge film 151. Since the hole accumulation region 107c is thus formed, there can be obtained such effects as suppression of DCR, a reduction of crosstalk, an effect by which carriers can be easily collected into high-electric-field regions due to formation of lateral electric fields, and an effect by which PDE can be enhanced, like in the first and second embodiments.

In addition, it becomes unnecessary to form the hole accumulation region 107c by carrying out ion injection multiple times in a range to a depth portion of silicon; thus, the number of ion injection steps required can be reduced.

Figure 8:
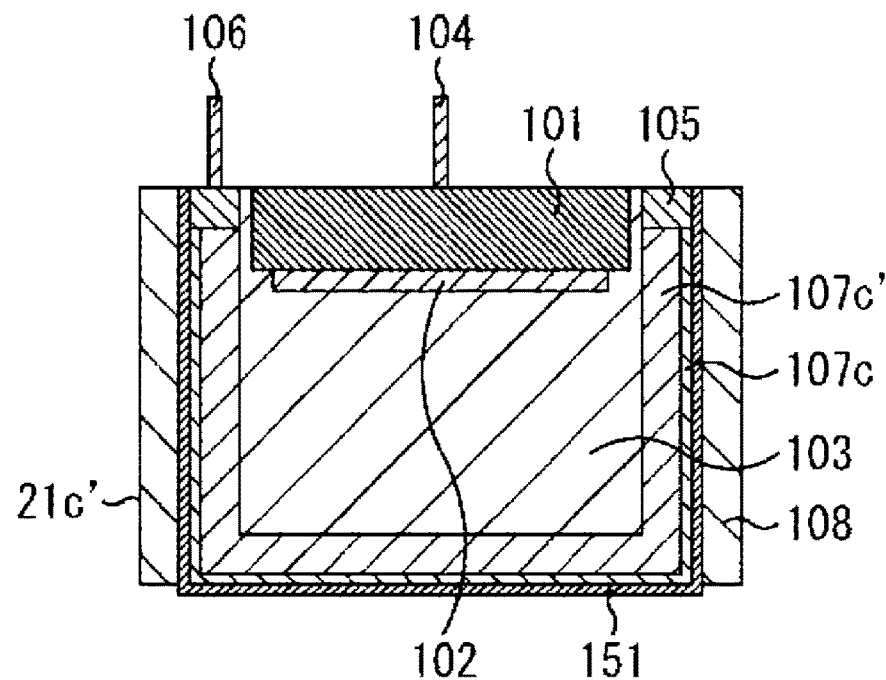
FIG. 8 is a sectional view of another configuration of the APD.

As illustrated in FIG. 8, the first embodiment (FIG. 3) and the third embodiment (FIG. 7) may be combined with each other. Specifically, a configuration may be adopted in which the fixed charge film 151 is formed at side surfaces inside the isolation region 108, and a hole accumulation region 107c' (the dash is affixed for distinction from the hole accumulation region 107c formed by the fixed charge film 151) is formed at side surfaces of the fixed charge film 151.

Besides, a configuration may be adopted in which the fixed charge film 151 and the hole accumulation region 107c' are formed also on the back surface side of the APD 21c or in which they are not formed on the back surface side of the APD 21c.

When the APD 21c depicted in FIG. 7 or FIG. 8 is viewed from the upper surface side, it is seen as depicted in FIG. 4 or FIG. 5. In addition, like in the APD 21a (FIG. 3), in the APD 21c also, the fixed charge film 151 (the hole accumulation region 107c, the hole accumulation region 107c') is formed under the anode 105. Besides, like the anode 105 formed at side walls of the isolation region 108 such as to continuously surround the well layer 103, the fixed charge film 151 (the hole accumulation region 107c, the hole accumulation region 107c') is also formed at side walls of the isolation region 108 such as to continuously surround the well layer 103.

According to the configuration illustrated in FIG. 8, the hole accumulation region 107c' due to the fixed charge film 151 and the hole accumulation region 107c are formed. Therefore, a dark current can be suppressed more assuredly, and a further suppression of DCR can be realized.

Configuration of APD in Fourth Embodiment

Figure 9:
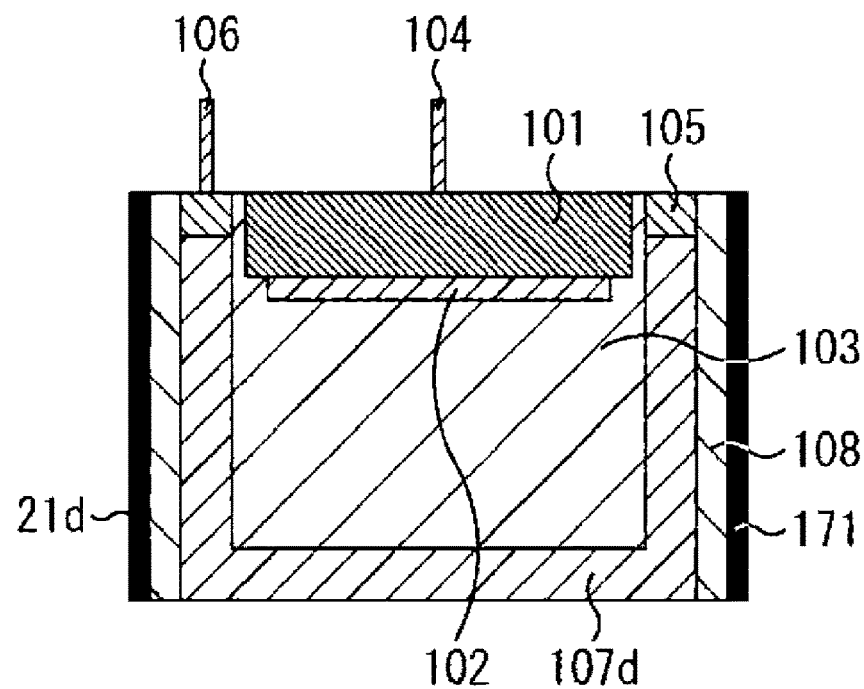
FIG. 9 is a sectional view of another configuration of the APD.

FIG. 9 depicts a sectional configuration in a fourth embodiment of the APD 21. Of an APD 21d depicted in FIG. 9, the parts similar to those of the APD 21a depicted in FIG. 3 are denoted by the same reference symbols as used above, and descriptions of them are omitted.

The APD 21d illustrated in FIG. 9 differs from the APD 21a depicted in FIG. 3 in that a metallic film 171 is formed in the isolation region 108.

Figure 10:
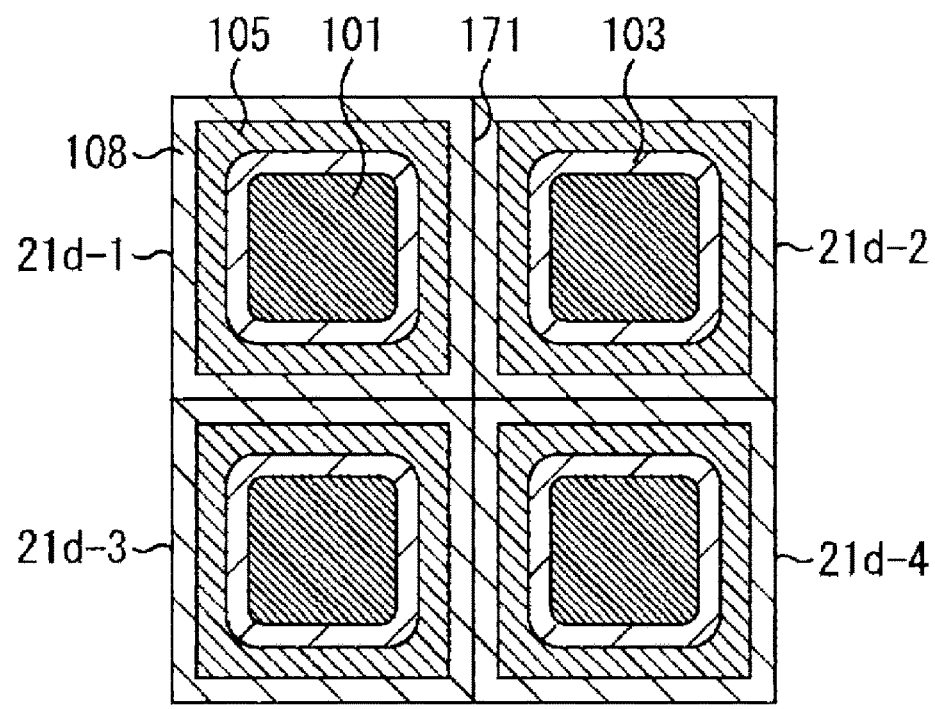
FIG. 10 is a sectional view of another configuration of the APD.

FIG. 10 is a plan view of the APD 21d as viewed from the upper surface side (the upward side in FIG. 3, or the n-type semiconductor region 101 side), depicting an example in which four (2×2) APDs 21d-1 to 21d-4 are arranged.

Like in the first to third embodiments, the isolation region 108 is formed between a plurality of APDs 21d, to isolate each APD 21d. As depicted in FIG. 10, the isolation region 108 is formed in a two-dimensional grid pattern such as to perfectly surround the periphery of each APD 21d.

Further, the metallic film 171 is formed at a central portion of the isolation region 108. Like the isolation region 108, the metallic film 171 is formed between the APDs 21d, is formed at a position for isolating each APD 21d, and is formed in a two-dimensional grid pattern such as to perfectly surround the periphery of each APD 21d.

As depicted in FIG. 9, the isolation region 108 and the metallic film 171 are formed to penetrate from the upper surface side to the lower surface side of the well layer 103 in the stacking direction.

While an example in which the metallic film 171 is formed in the APD 21a described referring to FIG. 3, for example, in the first embodiment has been taken in describing the APD 21d referring to FIG. 9 and FIG. 10, there may be adopted a configuration in which the metallic film 171 is formed in the APD 21b described referring to FIG. 6 in the second embodiment.

In addition, a configuration may be adopted in which the metallic film 171 is formed in the APD 21c (APD 21c') described referring to FIG. 7 or 8 in the third embodiment.

With the isolation region 108 and the metallic film 171 thus formed between the APDs 21d, influences exerted from neighboring APDs 21d can be reduced. For example, crosstalk due to light emission inside the APD 21d can be further reduced.

A configuration may be adopted in which the metallic film 171' is formed inside the isolation region 108, and a hole accumulation region 107d is formed at side walls of the isolation region 108, as depicted in FIG. 9. Alternatively, a configuration may be adopted in which a metallic film 171 is formed inside the isolation region 108, but the hole accumulation region 107d is not formed at the side surfaces, as depicted in FIG. 11.

Figure 11:
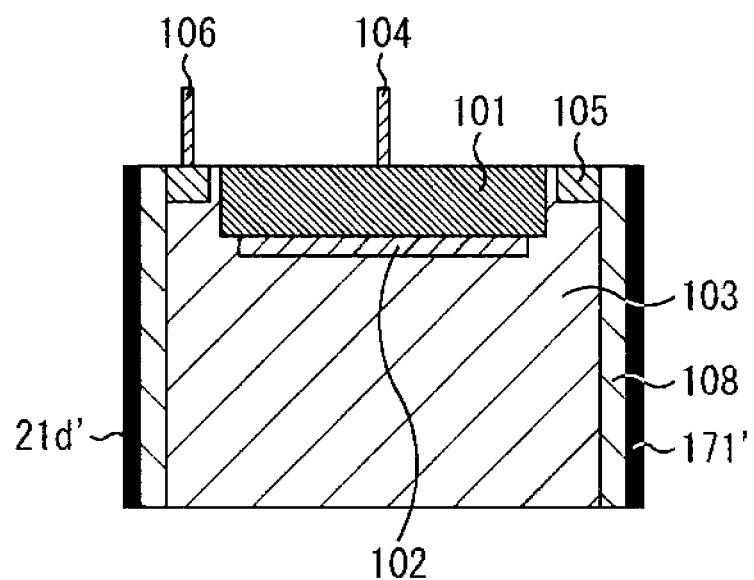
FIG. 11 is a sectional view of another configuration of the APD.

As illustrated in FIG. 11, the metallic film 171' is formed on a side surface on one side of the isolation region 108, and a voltage is impressed on the metallic film 171'. With the voltage impressed on the metallic film 171', a hole accumulation region 107d' (not depicted in FIG. 11) is formed in the vicinity of the metallic film 171'.

Also in the case of this configuration in which a voltage is impressed on the metallic film 171' to form the hole accumulation region 107d' (not depicted) in the vicinity of the metallic film 171', a configuration is realized in which electrons generated at the interface between the well layer 103 and the isolation region 108 can be trapped, so that a dark current generated at the interface can be reduced.

In the APD 21d depicted in FIG. 9, also, it is possible to impress a voltage on the metallic film 171 to thereby form the hole accumulation region 107d' in the vicinity of the metallic film 171. Where the hole accumulation region 107d formed by ion injection and the hole accumulation region 107d' formed by the metallic film 171 are combined with each other, a further reduction of DCR can be achieved.

In addition, though not illustrated, where a fixed charge film 151 is formed like in the third embodiment and the hole accumulation region 107c formed by the fixed charge film 151 and the metallic film 171 (the hole accumulation region 107d' formed thereby) are combined with each other, a further reduction in DCR can be achieved.

Configuration of APD in Fifth Embodiment

Figure 12:
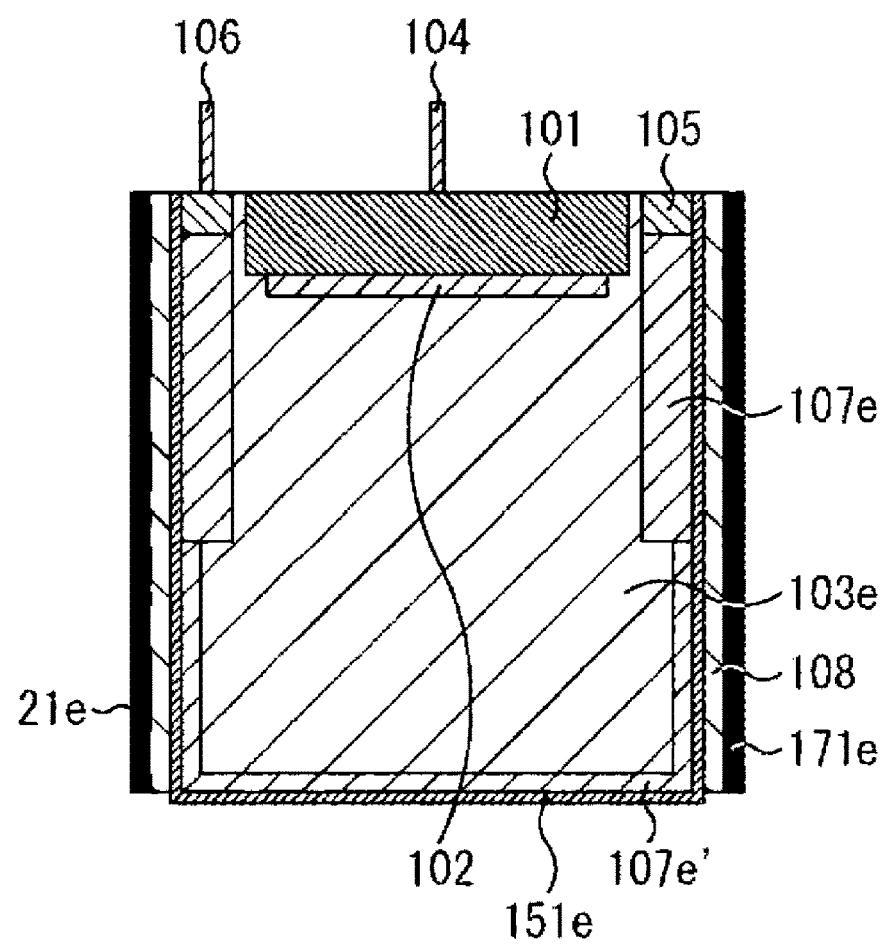
FIG. 12 is a sectional view of another configuration of the APD.

FIG. 12 depicts a sectional configuration in a fifth embodiment of the APD 21. Of an APD 21e illustrated in FIG. 12, the parts similar to those of the APD 21a depicted in FIG. 3 are denoted by the same reference symbols as used above, and descriptions of them are omitted.

The APD 21e depicted in FIG. 12 differs from the APD 21a depicted in FIG. 3 in that a well layer 103e is configured to be larger in thickness (depth).

A depth region of the well layer 103e (silicon substrate) is depleted from the back surface to a high-electric-field region by application of a bias. As the silicon film thickness is larger, quantum efficiency at long wavelengths such as near infrared light is enhanced. However, as the place where carriers are generated by photoelectric conversion becomes far from the high-electric-field region, PDE is lowered. Therefore, the silicon film thickness should be set while taking a balance of characteristics.

Even in the case where the silicon film thickness is enlarged, the hole accumulation region 107a can be formed in such a manner as to surround the well layer 103, like in the first embodiment (FIG. 3).

As has been described in the second embodiment, however, for forming the hole accumulation region 107a ranging to a depth portion of the silicon substrate it may be necessary to carry out ion injection multiple times, leading to an increase in the number of steps. In addition, an acceleration energy for ion injection is limited on a process basis, and, therefore, it is difficult to form the hole accumulation region 107a ranging to the depth portion of the silicon substrate having a large silicon film thickness.

In view of this, in the case where the silicon substrate is thick, a configuration in which the hole accumulation region 107a is formed in the vicinity of a part where the n-type semiconductor region 101 is formed in the well layer 103 and in which the hole accumulation region 107a is not formed in a depth portion of the silicon substrate, may be adopted, like in the second embodiment (FIG. 6).

However, in a depth portion of the silicon substrate, it may be impossible to suppress DCR without providing a mechanism for suppressing DCR. Therefore, a mechanism for suppressing DCR is provided also in the depth portion of the silicon substrate. As an example of such a mechanism, a fixed charge film 151 is formed, like in the third embodiment (FIG. 7).

Further, for reducing influences of neighboring APDs 21e, a metallic film 171 is formed in the isolation region 108, like in the fourth embodiment (FIG. 9).

An APD 21e illustrated in FIG. 12 depicts an example in which the silicon film thickness is large and the second to fourth embodiments are combined together. Specifically, the APD 21e depicted in FIG. 12 has a configuration in which a metallic film 171e is formed in the isolation region 108, and a fixed charge film 151e is formed at a side surface on the well layer 103e side. In addition, a hole accumulation region 107e is formed at part of side surfaces on the well layer 103e side of the fixed charge film 151e.

Besides, the fixed charge film 151e is formed also on the back surface side of the APD 21e. Note that a configuration may be adopted in which the fixed charge film 151e is not formed on the back surface side of the APD 21e.

Thus, in the case where the silicon film thickness of the APD 21e is large, a structure in which the hole accumulation region 107e and the fixed charge film 151e are formed on the high-electric-field region side where the n-type semiconductor region 101 is formed gives a configuration in which electrons generated at the interface between the well layer 103e and the isolation region 108 can be trapped, so that a dark current generated at the interface can be reduced.

In addition, in the case where the silicon film thickness of the APD 21e is large, a structure in which the fixed charge film 151e is formed in a depth portion (on the back surface side) of the APD 21e gives a configuration in which the hole accumulation region 107 (not depicted) due to the fixed charge film 151e is formed, and electrons generated at the interface between the well layer 103e and the isolation region 108 can be trapped, so that a dark current generated at the interface can be reduced.

Further, a voltage may be impressed on the metallic film 171e such that a hole accumulation region 107e' is formed owing to the metallic film 171e. In this case, electrons can be trapped also in the hole accumulation region 107e' owing to the metallic film 171e, so that the dark current can be further reduced.

With the configuration as depicted in FIG. 12, the dark current can be reduced and DCR can be suppressed, in the whole part of the APD 21e having a large silicon film thickness. Besides, like in the first to fourth embodiments, there can be obtained such effects as a reduction of crosstalk, an effect by which carriers can be easily collected into high-electric-field regions due to formation of lateral electric fields, and an effect by which PDE can be enhanced.

When the APD 21e illustrated in FIG. 12 is viewed from the upper surface side (the side where the n-type semiconductor region 101 is formed), the APD 21e appears to have the metallic film 171e formed at a substantially central portion of the isolation region 108, as depicted in FIG. 10.

Figure 13:
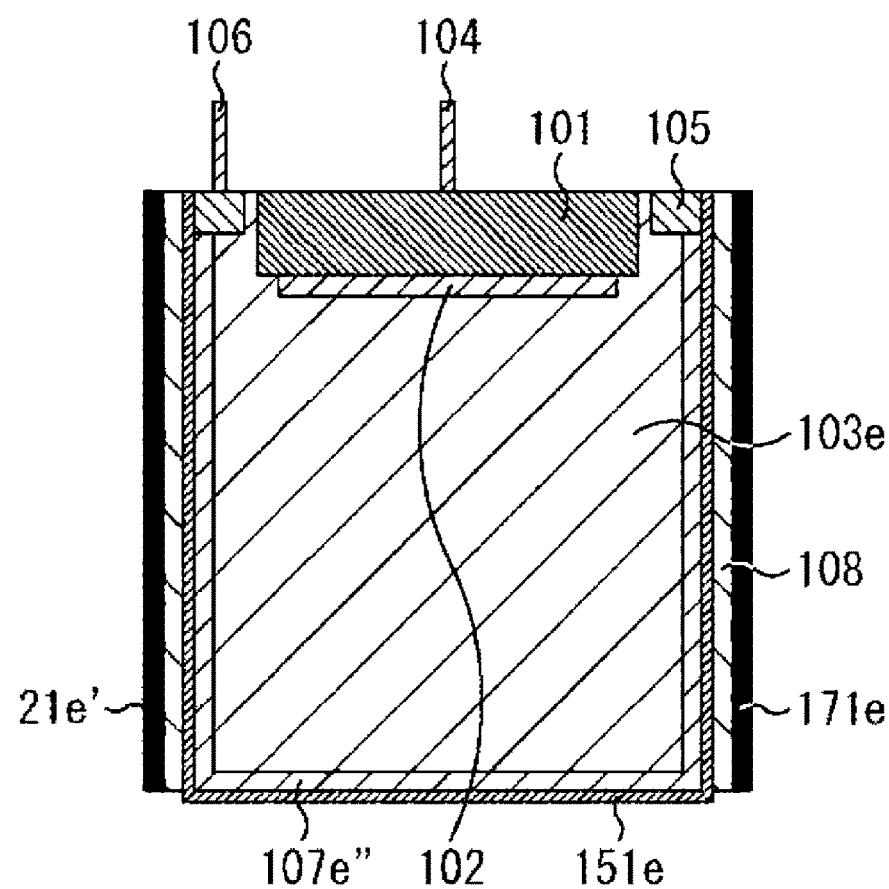
FIG. 13 is a sectional view of another configuration of the APD.

As illustrated in FIG. 13, a configuration may be adopted which is obtained by eliminating the hole accumulation region 107e from the APD 21e depicted in FIG. 12. In an APD 21e' depicted in FIG. 13, the metallic film 171e is formed in the isolation region 108, and the fixed charge film 151e is formed on the well layer 103e side.

In such a configuration, also, a hole accumulation region 107e" is formed owing to the fixed charge film 151e, so that there can be obtained such effects as a reduction of DCR, a reduction of crosstalk, an effect by which carriers can be easily collected into high-electric-field regions due to formation of lateral electric fields, and an effect by which PDE can be enhanced. Naturally, the hole accumulation region 107e formed by ion injection may be combined with this, whereby a further reduction of DCR can be achieved.

In addition, with a voltage impressed on the metallic film 171e, the hole accumulation region 107e" is formed, so that there can be obtained such effects as a reduction of DCR, a reduction of crosstalk, an effect by which carriers can be easily collected into high-electric-field regions due to formation of lateral electric fields, and an effect by which PDE can be enhanced.

Figure 14:
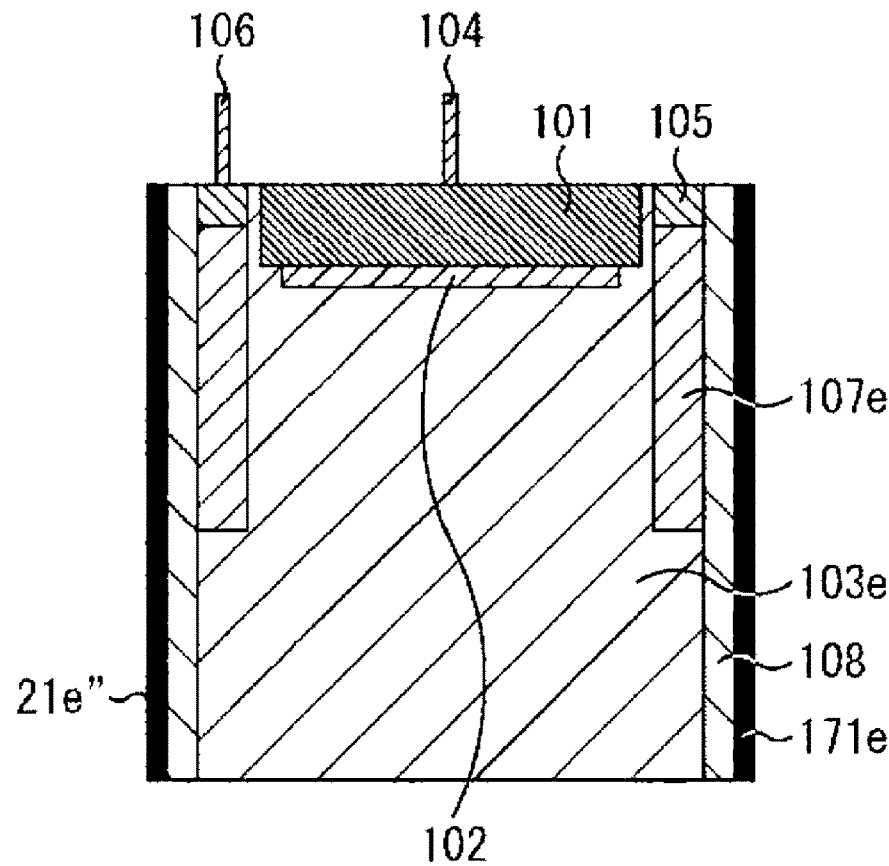
FIG. 14 is a sectional view of another configuration of the APD.

As illustrated in FIG. 14, a configuration may be adopted which is obtained by eliminating the fixed charge film 151e from the APD 21e depicted in FIG. 12. In an APD 21e'' depicted in FIG. 14, the metallic film 171e is formed in the isolation region 108, and the hole accumulation region 107e is formed at side walls of the well layer 103e.

In the case of such a configuration, also, since the hole accumulation region 107e is formed, there can be obtained such effects as a reduction of DCR, a reduction of crosstalk, an effect by which carriers can be easily collected into high-electric-field regions due to formation of lateral electric fields, and an effect by which PDE can be enhanced.

In addition, application of a voltage to the metallic layer 171e forms a hole accumulation region (the hole accumulation region formed by applying a voltage to the metallic layer 171e is not depicted in FIG. 14), so that there can be obtained such effects as a reduction of DCR, a reduction of crosstalk, an effect by which carriers can be easily collected into high-electric-field regions, and an effect by which PDE can be enhanced.

Configuration of APD in Sixth Embodiment

Figure 15:
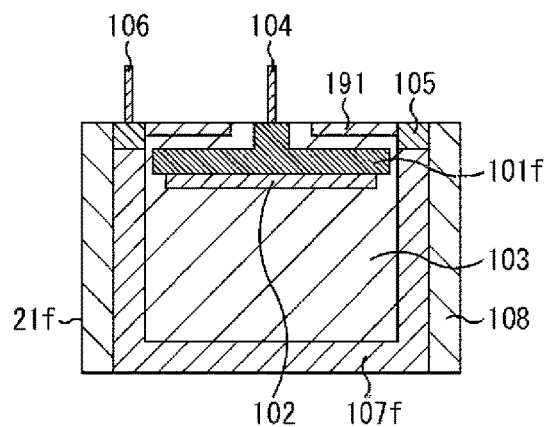
FIG. 15 is a sectional view of another configuration of the APD.

FIG. 15 depicts a sectional configuration in a sixth embodiment of the APD 21. Of an APD 21f illustrated in FIG. 15, the parts similar to those of the APD 21a depicted in FIG. 3 are denoted by the same reference symbols as used above, and descriptions of them are omitted.

The APD 21f depicted in FIG. 15 differs from the APD 21a depicted in FIG. 3 in the shape of the n-type semiconductor region 101 and in the position where the n-type semiconductor region 101 is formed. Of the n-type semiconductor region 101f of the APD 21f depicted in FIG. 15, other portions than a portion connected with the contact 104 are embedded in the well layer 103. In the example illustrated in FIG. 15, the n-type semiconductor region 101 is formed such as to have a projected portion at a substantially central portion.

In the APD 21f depicted in FIG. 15, a high concentration diffusion layer (in this case, the n-type semiconductor region 101 functioning as a cathode) that takes electrical contact is formed separate from a high concentration diffusion layer (in this case, an anode 105) of opposite conductivity type that takes a different potential.

Referring to FIG. 15, the n-type semiconductor region 101f is formed with a projected portion (hereinafter referred to as projected portion 101f), and the n-type semiconductor region 101f as a whole inclusive of the projected portion 101f is formed at a position separate from the anode 105.

Figure 16:
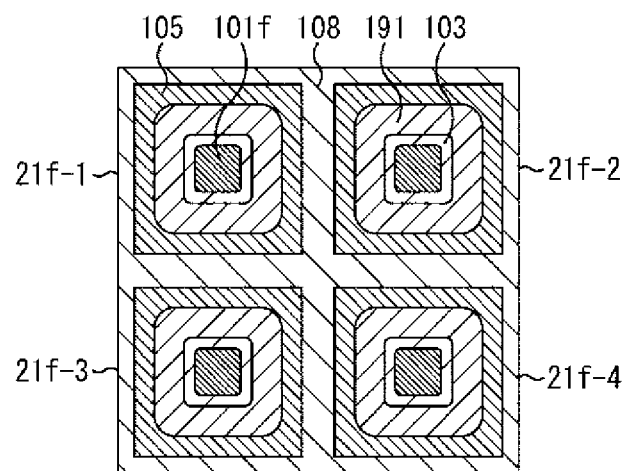
FIG. 16 is a plan view of another configuration of the APD.

When the APD 21f is viewed from the upper surface side (the n-type semiconductor region 101f side), it is seen as depicted in FIG. 16. In FIG. 16 is depicted an example in which four (2×2) APDs 21f-1 to 21f-4 are arranged. When one APD 21f is viewed from above, the projected portion 101f of the n-type semiconductor region 101f to be connected with the contact 104 is disposed in a central area thereof, and the anode 105 is formed at a position separate from the projected portion 101f such as to surround the projected portion 101f.

Between the n-type semiconductor region 101f and the anode 105, the n-type semiconductor region 101 may be formed in an exposed state, or may be configured to be covered with a semiconductor region 191 of an opposite conductivity type, as depicted in FIG. 15. The semiconductor region 191 of the opposite conductivity type may be a p-type semiconductor region 191, for example. Besides, the semiconductor region 191 of the opposite conductivity type may also be a layer formed by ion injection, like a hole accumulation region 107f, for example.

In this way, of a region constituting the high-electric-field region, other portions than a portion connected with a wiring for the cathode are formed in the silicon substrate, and the semiconductor region 191 (hole accumulation region) is formed on a surface of the silicon substrate, in a region between the portion (projected portion 101f) connected with the wiring for the cathode and the anode 105.

Thus, the area of a high-concentration impurity region connected with the contact 104 (in this case, the n-type semiconductor region 101f connected with the contact 104) is reduced, whereby DCR can be suppressed. Besides, in this case, the shape of the n-type semiconductor region 101f forming the cathode is set to be the shape having the projected portion as depicted in FIG. 15, whereby PDE can be maintained, since the area of the high-electric-field region itself is not reduced.

In addition, like in the first to fifth embodiments, there can be obtained such effects as a reduction of DCR, a reduction of crosstalk, an effect by which carriers can be easily collected into high-electric-field regions due to formation of lateral electric fields, and an effect by which PDE can be enhanced.

Besides, while an example in which the sixth embodiment is applied to the first embodiment (FIG. 3) has been described here, the sixth embodiment, specially, the configuration in which the n-type semiconductor region 101 having a projected portion is formed and the substrate surface is covered with the semiconductor region 191 of the opposite conductivity type, may be applied to the second to fifth embodiments.

Configuration of APD in Seventh Embodiment

Figure 17:
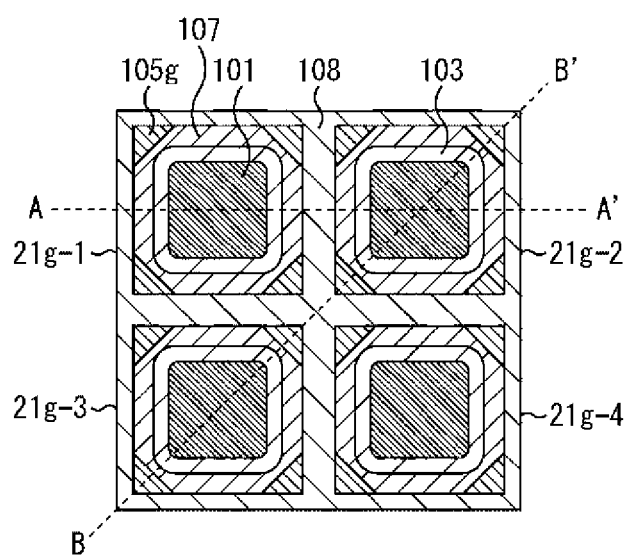
FIG. 17 is a plan view of another configuration of the APD.

FIG. 17 depicts a plan-view configuration in a seventh embodiment of the APD 21. Of an APD 21g illustrated in FIG. 17, the parts similar to those of the APD 21a depicted in FIG. 4 are denoted by the same reference symbols as used above, and descriptions of them are omitted.

The APD 21g depicted in FIG. 17 differs from the APD 21a depicted in FIG. 4 in that the area of the anode 105g is reduced.

FIG. 17 is a plan view of the APD 21g in the case where the APD 21g is viewed from the upper surface side (the n-type semiconductor region 101 side), and depicts an example in which four (2×2) APDs 21g-1 to 21g-4 are arranged. Referring to the APD 21g-1, for example, the anode 105g of the APD 21g-1 is formed only at four corners adjacent to the isolation region 108.

Of the APD 21g depicted in FIG. 17, a sectional view taken along line A-A' is depicted in FIG. 18A, while a sectional view taken along line B-B' is depicted in FIG. 18B. FIG. 18A depicts a section of a portion where the anode 105g is not formed, whereas FIG. 18B depicts a section of a portion where the anode 105g is formed.

As depicted in FIG. 18A, there is a portion where the anode 105g is not formed, and as depicted in FIG. 18B, there is a portion where the anode 105 is formed. Thus, the anodes 105g are formed at parts of the inner periphery of the isolation region 108. As a result, the area of a high-concentration diffusion layer taking electrical contact (in this case, the area of the anode 105g connected with the contact 106) can be reduced, and this high-concentration diffusion layer can be separated from a high-concentration diffusion layer of an opposite conductivity type that takes another potential (in this case, the n-type semiconductor region 101 constituting the cathode connected with the contact 104).

With such a configuration, damage defects can be reduced, electric field relaxation can be realized, and DCR can be suppressed.

In addition, since the hole accumulation region 107 is formed, like in the first to sixth embodiments, there can be obtained such effects as a reduction of DCR, a reduction of crosstalk, an effect by which carriers can be easily collected into high-electric-field regions due to formation of lateral electric fields, and an effect by which PDE can be enhanced.

Note that while an example in which the anode 105g of the APD 21g is formed only at each of the four corners inside the isolation region 108 has been depicted in the description here, the anode 105g may be formed in other region than the four corners, for example, only at part of the inner periphery of the isolation region 108, such as only at an edge (side) inside the isolation region 108.

While an example in which the seventh embodiment is applied to the first embodiment (FIG. 3) has been depicted here, the seventh embodiment, specifically, the configuration in which the anode 105 is formed at only part of the inner periphery of the isolation region 108, may be applied to the second to sixth embodiments.

Configuration of APD in Eighth Embodiment

Figure 19:
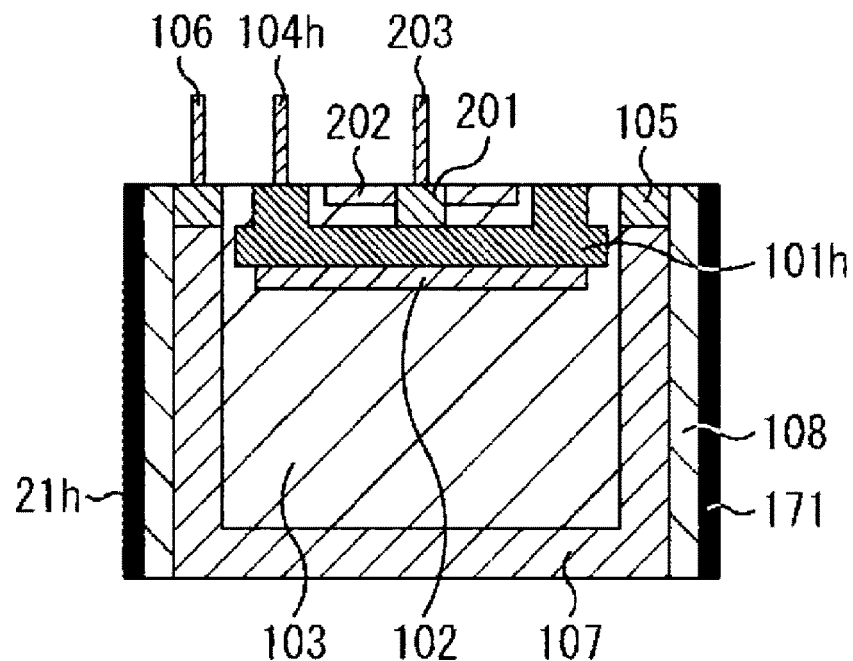
FIG. 19 is a sectional view of another configuration of the APD.

FIG. 19 depicts a sectional configuration in an eighth embodiment of the APD 21. Of an APD 21h illustrated in FIG. 19, the parts similar to those of the APD 21a depicted in FIG. 3 are denoted by the same reference symbols as used above, and descriptions of them are omitted.

The APD 21h depicted in FIG. 19 differs from the APD 21a depicted in FIG. 3 in the shape of the n-type semiconductor region 101h. Of an n-type semiconductor region 101h of the APD 21h depicted in FIG. 19, other portions than a portion connected with a contact 104h are embedded in the well layer 103. In the example illustrated in FIG. 19, the n-type semiconductor region 101 is formed to have a projected portion.

Figure 20:
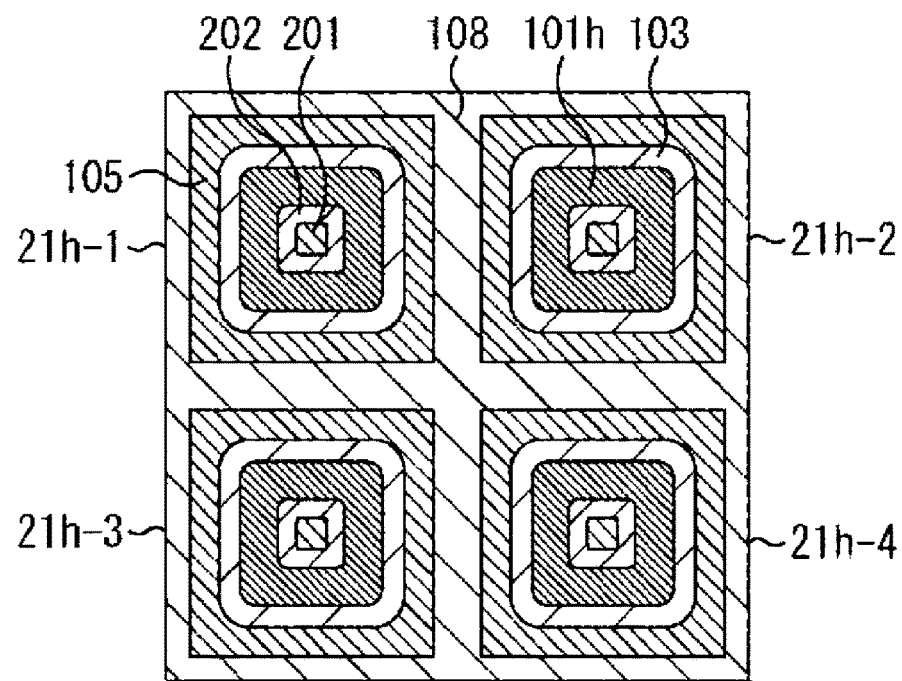
FIG. 20 is a plan view of another configuration of the APD.

Note that while the projected portions are formed on the left and right sides of the n-type semiconductor region 101h in FIG. 19 since FIG. 19 is a sectional view of the APD 21a, the projected portion is formed continuously to form a ring in plan view, as depicted in FIG. 20.

In addition, the n-type semiconductor region 101h is formed at a central portion thereof with a p-type semiconductor region 201 for connection with a layer 202 formed at a silicon surface. The p-type semiconductor region 201 and the layer 202 are set at the same potential, which is different from the potential of the anode 105.

For example, the layer 202 may be set to the same potential as a ground (GND) or the cathode. In addition, by being configured to be at the same potential as the ground (GND) or the cathode, the layer 202 functions also as a hole accumulation region.

In this way, the hole accumulation region (layer 202) is formed in a region other than the cathode region at the surface of the silicon substrate (other than the projected portion 101h of the n-type semiconductor region 101h), and the cathode constituting a high-electric-field region is embedded in the inside of silicon.

For example, like in the APD 21f depicted in FIG. 15 in the sixth embodiment, of the region constituting the high-electric-field region, other portions than the portion connected with the contact of the cathode are embedded in the silicon substrate. In addition, the layer 202 is formed at the surface of the silicon substrate, in a substantially central area of the n-type semiconductor region 101h, in a region (a region surrounded by the projected portion 101h) between the portions (projected portion 101h) connected with the wiring for the cathode. Further, a voltage (the same potential as the GND or the cathode) is impressed on the layer 202, whereby the layer 202 is caused to function as a hole accumulation region.

By such a configuration, the amount of damage due to inflow of a dark current generated at the silicon surface and formation of a high-electric-field region can be reduced, and DCR can be suppressed. Besides, in the case where the layer 202 is set to the same potential as the cathode, circuit configuration can be simplified without increasing voltage systems.

In the APD 21h in the eighth embodiment, also, like in the first to seventh embodiments, there can be obtained such effects as a reduction of DCR, a reduction of crosstalk, an effect by which carriers can be easily collected into high-electric-field regions due to formation of lateral electric fields, and an effect by which PDE can be enhanced.

In addition, while an example in which the eighth embodiment is applied to the first embodiment (FIG. 3) has been depicted here, the eighth embodiment, specifically, the configuration in which the n-type semiconductor region 101 having the projected portion is formed and the region surrounded by the projected portion is covered with the layer 202 of the opposite conductivity type, may be applied to the second to seventh embodiments.

Configuration of APD in Ninth Embodiment

Figure 21:
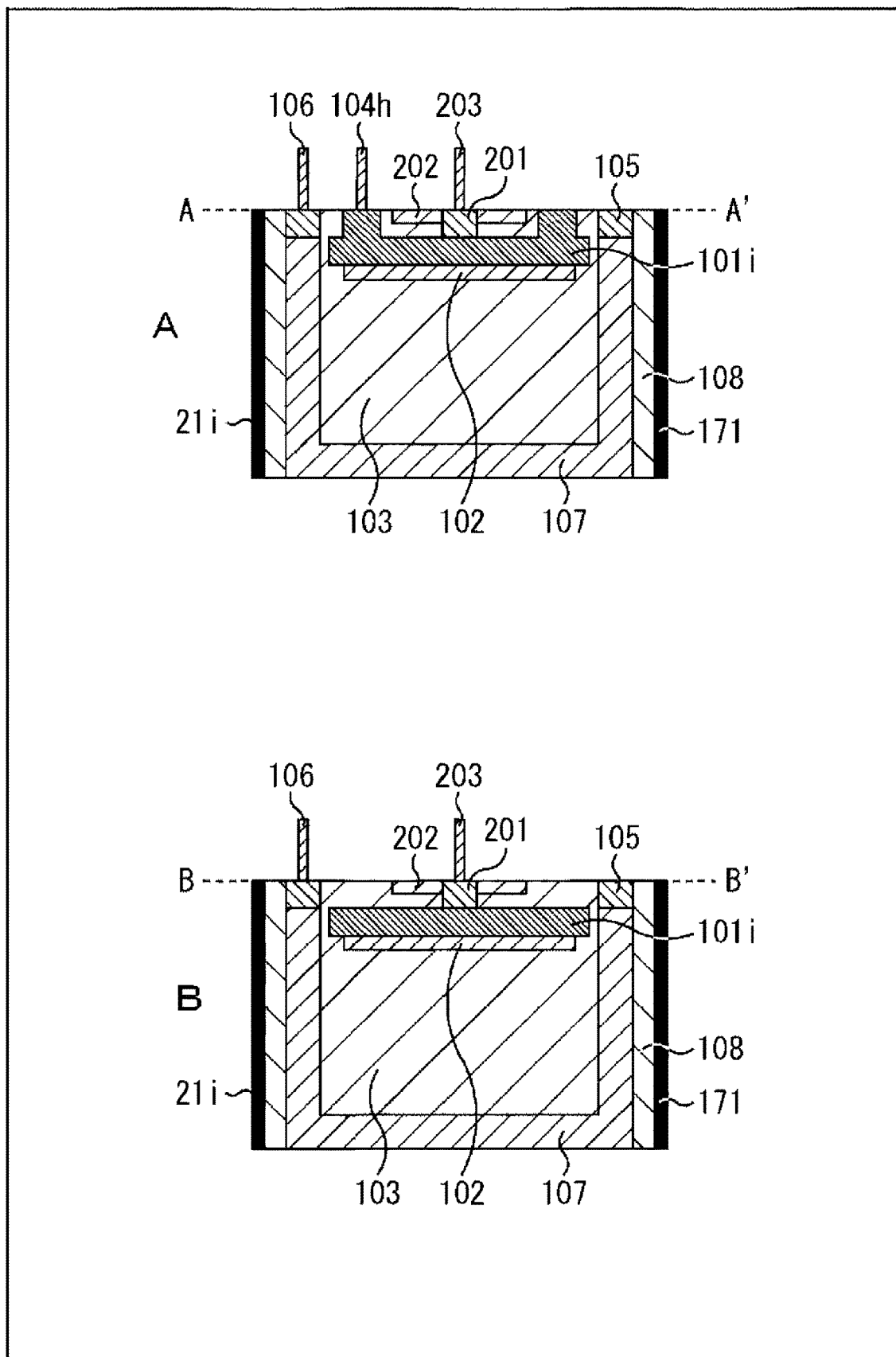
FIG. 21 includes a sectional view of another configuration of the APD.

FIGS. 21A and 21B depict sectional configurations in a ninth embodiment of the APD 21. Of an APD 21i illustrated in FIGS. 21A and 21B, the parts similar to those of the APD 21a depicted in FIG. 3 are denoted by the same reference symbols as used above, and descriptions of them are omitted.

The APD 21i illustrated in FIG. 21A is the same in structure as the APD 21h depicted in FIG. 19. The configuration in a section of the APD 21i in the ninth embodiment is the same as that of the APD 21h depicted in FIG. 19, but the configuration in another section is different from that of the APD 21h depicted in FIG. 19, as illustrated in FIG. 21B.

While the APD 21h in the eighth embodiment above has been an example in which the projected portion 101h of the n-type semiconductor region 101h is formed continuously (formed in a predetermined shape, for example, a tetragonal shape), the APD 21i in the ninth embodiment has a configuration in which a projected portion 101i of an n-type semiconductor region 101i is formed discontinuously.

Figure 22:
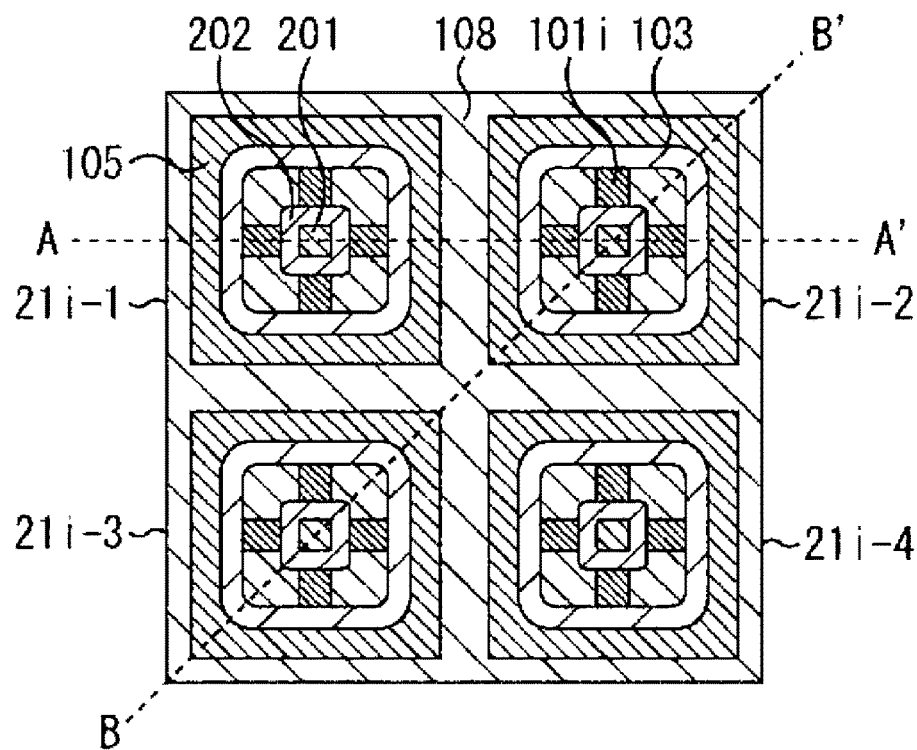
FIG. 22 is a plan view of another configuration of the APD.

FIG. 22 is a plan view of the APD 21i. Referring to the APD 21i-1, for example, depicted in FIG. 22, the projected portion 101i of the n-type semiconductor region 101i is formed only at part of the inside of the anode 105. In the example depicted in FIG. 22, the projected portions 101i are formed at four parts. The projected portions 101i at the four parts are each formed at a substantially central portion of an edge (a side) of the n-type semiconductor region 101i.

Note that a case in which the projected portions 101i of the n-type semiconductor region 101i are each formed at a substantially central portion of an edge (a side) of the n-type semiconductor region 101i has been taken as an example here, the projected portions 101i may each be formed at part of the n-type semiconductor region 101i, specifically, in a region other than the central portion of an edge (a side), for example, in a corner portion of the n-type semiconductor region 101i.

Of the APD 21i having the configuration depicted in FIG. 22, a sectional view taken along line A-A' is as depicted in FIG. 21A, and a sectional view taken along line B-B' is as depicted in FIG. 21B.

The APD 21i in the ninth embodiment, like the APD 21h in the eighth embodiment, has a configuration in which the hole accumulation region (layer 202) is formed in a region other than the cathode region (in this case, other than the projected portion 101i of the n-type semiconductor region 101i) of a surface of a silicon substrate, and the cathode constituting a high-electric-field region is embedded in the inside of silicon.

By such a configuration, the amount of damage due to inflow of a dark current generated at a silicon surface and formation of a high-electric-field region can be reduced, and DCR can be suppressed. Besides, in the case where the layer 202 is set to the same potential as that of the cathode, circuit configuration can be simplified without increasing voltage systems.

In addition, in the APD 21i in the ninth embodiment, the part of the projected portion 101i is smaller than the part of the projected portion 101h of the APD 21h in the eighth embodiment, so that damage defects can be further reduced, more relaxation of electric field can be realized, and DCR can be further suppressed.

In the APD 21i in the ninth embodiment, also, like in the first to eighth embodiments, there can be obtained such effects as a reduction of DCR, a reduction of crosstalk, an effect by which carriers can be easily collected into high-electric-field regions due to formation of lateral electric fields, and an effect by which PDE can be enhanced.

Besides, while an example in which the ninth embodiment is applied to the first embodiment (FIG. 3) has been depicted here, the ninth embodiment, specifically, the configuration in which the n-type semiconductor region 101 having the projected portion is formed, the region surrounded by the projected portion is covered with the layer 202 of the opposite conductivity type, or the potential of the layer 202 is maintained at a predetermined potential, may be applied to the second to seventh embodiments.

Configuration of APD in Tenth Embodiment

Figure 23:
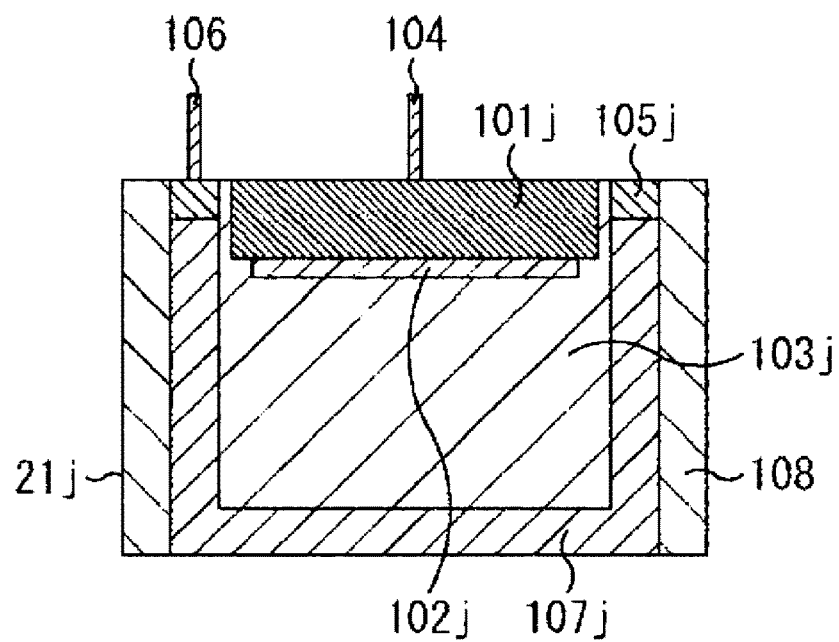
FIG. 23 is a sectional view of another configuration of the APD.

FIG. 23 depicts a sectional configuration in a tenth embodiment of the APD 21. An APD 21j illustrated in FIG. 23 is different in polarity from, but is the same in configuration as, the APDs 21 in the first to ninth embodiments.

The APD 21j depicted in FIG. 23 has the same configuration as, but is configured to be different in polarity from, the APD 21a in the first embodiment depicted in FIG. 3.

The APD 21j depicted in FIG. 23 includes a p-type semiconductor region 101j the conductivity of which is p type, and an n-type semiconductor region 102j which is formed under the p-type semiconductor region 101j and the conductivity of which is n type. The p-type semiconductor region 101j and the n-type semiconductor region 102j are formed in a well layer 103j.

The well layer 103j may be a semiconductor region of n-type conductivity, or may be a semiconductor region of p-type conductivity.

The p-type semiconductor region 101j functions as an anode, and is connected to a circuit through the contact 104. A cathode 105j opposed to the anode is formed between the p-type semiconductor region 101j and the isolation region 108, in the same layer as the p-type semiconductor region 101j. The cathode 105j is connected to a circuit through the contact 106.

Between the isolation region 108 and the well layer 103j is formed an electron accumulation region 107j, which may be formed as an n-type semiconductor region. The electron accumulation region 107j is formed on the lower side of the cathode 105j, and is formed in the state of being electrically connected with the cathode 105j. In addition, the electron accumulation region 107j is formed between the well layer 103j and the isolation region 108, and on the lower side (on the back surface side of the APD 21j) of the well layer 103j.

In the case of the APD 21j in which polarity is thus reversed, holes are trapped in the electron accumulation region 107j. In the case where holes are trapped, also, DCR can be suppressed, like in the case where electrons are trapped.

To the APD 21j in which the polarity is thus reversed, also, the first to ninth embodiments can be applied. The descriptions of the cases where the first to ninth embodiments are applied and the polarity is reversed are similar to those of the above-described cases, and, accordingly, detailed description thereof is omitted here.

The APD 21j illustrated in FIG. 23 is an example in which the polarity of the APD 21a in the first embodiment depicted in FIG. 3 is reversed. The p-type semiconductor region 101j of the APD 21j may be formed in a tetragonal shape in plan-view layout, like the n-type semiconductor region 101 of FIG. 4, or may be formed in a circular shape in plan-view layout, like the n-type semiconductor region 101 of FIG. 5.

In addition, the electron accumulation region 107j of the APD 21j depicted in FIG. 23 may not be formed ranging to a depth portion of the silicon substrate but may be formed only at part of the inside of the isolation region 108 on the p-type semiconductor region 101j side, like the n-type semiconductor region 101 in the second embodiment (FIG. 6).

Figure 24:
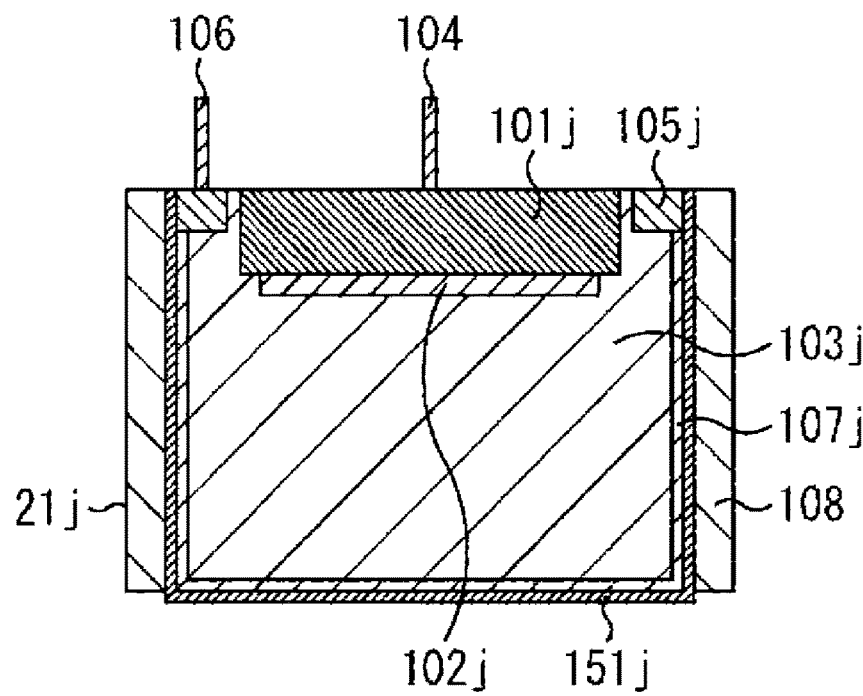
FIG. 24 is a sectional view of another configuration of the APD.

Besides, like the APD 21c depicted in the third embodiment (FIGS. 7 and 8), the APD 21j may be formed with a fixed charge film 151j, as depicted in FIG. 24. In the APD 21j with the reversed polarity, the fixed charge film 151j is a positive fixed charge film.

In addition, like the APD 21d depicted in the fourth embodiment (FIG. 9), the APD 21j may be formed with a metallic film 171 in the isolation region 108, though not illustrated. Besides, an electron accumulation layer may also be formed, by forming the metallic film 171 and impressing a voltage on the metallic film 171.

Besides, like the APD 21e depicted in the fifth embodiment (FIG. 12), the APD 21j may have a configuration in which the well layer 103j is deep, and the electron accumulation region 107j and the fixed charge film 151j are combined with each other, though not illustrated. Further, the metallic film 171 may be combined with this. In addition, the electron accumulation region 107j and the metallic film 171 may be combined with each other.

In addition, like the APD 21f depicted in the sixth embodiment (FIG. 15), the APD 21j may have a configuration in which the p-type semiconductor region 101j is shaped to have a projected portion in a substantially central area, and only a region connected to the contact 104 of the p-type semiconductor region 101j is exposed to the surface of the silicon substrate, though not illustrated.

Besides, like the APD 21g depicted in the seventh embodiment (FIG. 17), the APD 21j may have a configuration in which the region where the cathode 105j is formed is reduced (a configuration in which the cathode 105j is formed only at part of the inside of the isolation region 108), though not illustrated.

In addition, like the APD 21h depicted in the eighth embodiment (FIG. 19), the APD 21j may have a configuration in which the p-type semiconductor region 101j is shaped to have a projected portion near an end, only the region connected to the contact 104 of the p-type semiconductor region 101j is exposed to the surface of the silicon substrate, and a layer 202j is formed in a central area, though not illustrated. In this case, the layer 202j is set to the same potential as that of the ground (GND) or the anode.

Besides, like the APD 21i depicted in the ninth embodiment (FIGS. 21A and 21B), the APD 21j may have a configuration in which the p-type semiconductor region 101j is shaped to have a projected portion, only the region connected to the contact 104 of the p-type semiconductor region 101j is exposed to the surface of the silicon substrate, the projected portion is formed discontinuously, and a layer 202j is formed in a central area, though not illustrated. In this case, the layer 202j is set to the same potential as that of the ground (GND) or the anode.

In this way, the first to ninth embodiments can also be applied to the APD 21 reversed in polarity. In this case, like in the first to ninth embodiments, there can be obtained such effects as a reduction of DCR, a reduction of crosstalk, an effect by which carriers can be easily collected into high-electric-field regions due to formation of lateral electric fields, and an effect by which PDE can be enhanced.

Configuration of APD in Eleventh Embodiment

Figure 25:
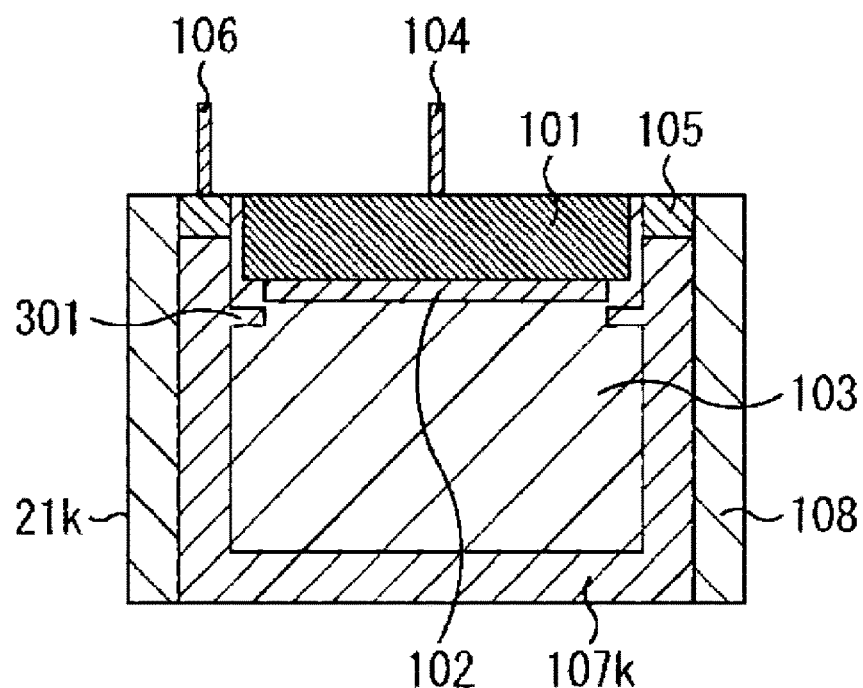
FIG. 25 is a sectional view of another configuration of the APD.

FIG. 25 depicts a sectional configuration in an eleventh embodiment of the APD 21. An APD 21k illustrated in FIG. 25 is the same in basic configuration as the APDs 21 in the first to tenth embodiments, but differs from those APDs 21 in that edge breakdown can be prevented (or alternatively, mitigated) without generating a lowering in PDE or an increase of dark signals.

While description will be made here by taking as an example a case where a configuration capable of preventing (or alternatively, mitigating) edge breakdown without generating a lowering in PDE or an increase of dark signals is applied to the APD 21a in the first embodiment depicted in FIG. 3, the configuration is also applicable to the second to tenth embodiments.

In the configuration of the APD 21k illustrated in FIG. 25, a block layer 301 is formed on the well layer 103 side of a side wall of a hole accumulation region 107k. The block layer 301 is provided for blocking electrons that might reach an n-type semiconductor region 101 without passing through the multiplication region. Here, the electrons which reach the n-type semiconductor region 101 without passing through the multiplication region will now be described.

Description will be made referring again to the APD 21a depicted in FIG. 3, for example. In the APD 21a depicted in FIG. 3, the p-type semiconductor region 102 constituting the multiplication region is formed to be smaller than the n-type semiconductor region 101, for preventing (or alternatively, mitigating) edge breakdown. With such a configuration, edge breakdown can be prevented (or alternatively, mitigated), but PDE may be worsened.

Figure 26:
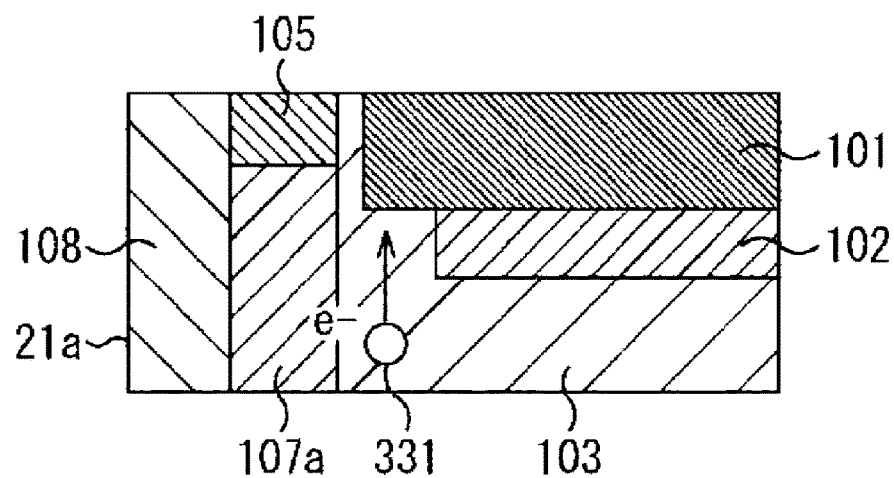
FIG. 26 is a figure for explaining movement of an electron.

FIG. 26 depicts, in an enlarged form, an edge portion of the multiplication region of the APD 21a depicted in FIG. 3. The p-type semiconductor region 102 is formed to be smaller than the n-type semiconductor region 101, whereby generation of edge breakdown can be restrained. When the p-type semiconductor region 102 is formed to be smaller than the n-type semiconductor region 101, an electric field is formed in the direction indicated by the arrow in the figure, in the vicinity of an edge of the multiplication region. Since a conduction electron 331 moves along the direction of the electric field, the conduction electron 331 does not move toward the multiplication region but passes by the edge of the multiplication region (passes on the outside of the p-type semiconductor region 102), to reach the cathode (n-type semiconductor region 101).

The conduction electrons 331 reaching the n-type semiconductor region 101 in this way are not multiplied because they do not pass the multiplication region, so that a signal is not detected at the cathode. If there are such conduction electrons 331 that are not detected, PDE would be lowered.

In view of this, as illustrated in FIG. 25, the block layer 301 is provided for reducing the number of the conduction electrons 331 which would reach the n-type semiconductor region 101 without passing through the multiplication region. Where the block layer 301 is thus provided, the conduction electrons 331 are caused to pass through the multiplication region. This will be described referring to FIG. 27.

Figure 27:
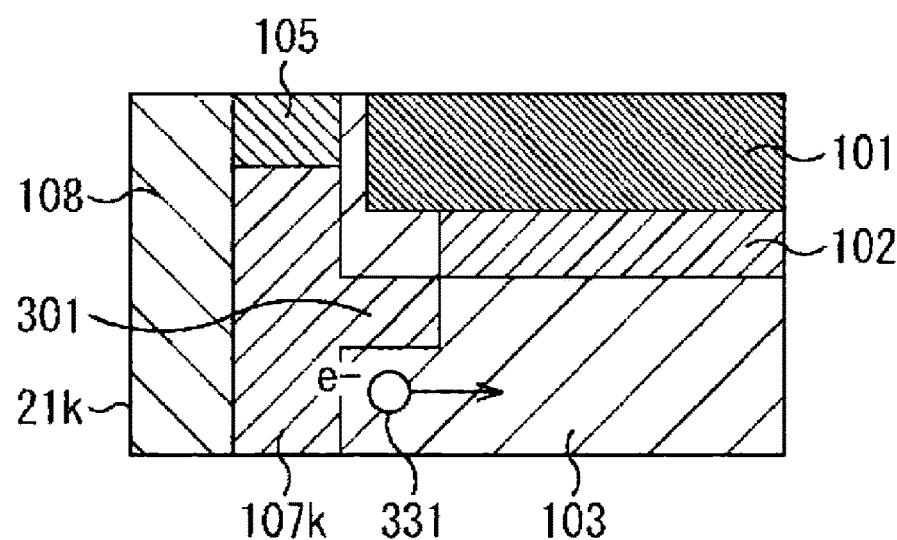
FIG. 27 is a figure for explaining movement of an electron.

FIG. 27 depicts, in an enlarged form, an edge portion of the multiplication region of the APD 21k depicted in FIG. 25. In the vicinity of the edge of the multiplication region, an electric field is formed in the direction indicated by the arrow in the figure, namely, in the direction toward the center of the APD 21k.

Since the conduction electron 331 moves along the direction of the electric field, the conduction electron 331 goes toward the center of the APD 21k, and, as a result, moves toward the p-type semiconductor region 102 and, hence, toward the multiplication region. Therefore, the conduction electrons 331 pass through the multiplication region, to reach the cathode (n-type semiconductor region 101).

Thus, with the block layer 301 provided, a potential barrier is formed, whereby even those conduction electrons 331 which would not reach the multiplication region if the block layer 301 is absent can be made to reach the multiplication region, so that PDE can be prevented (or alternatively, mitigated) from being lowered. In addition, where the p-type semiconductor region 102 constituting the multiplication region is formed to be smaller than the n-type semiconductor region 101, it is also possible to prevent (or alternatively, mitigate) edge breakdown.

In the APD 21k illustrated in FIG. 25, the block layer 301 is formed in a projecting shape at side walls on the well layer 103 side of the hole accumulation region 107k. The block layer 301 can be formed as a p-type semiconductor region, like the hole accumulation region 107k.

Figure 28:
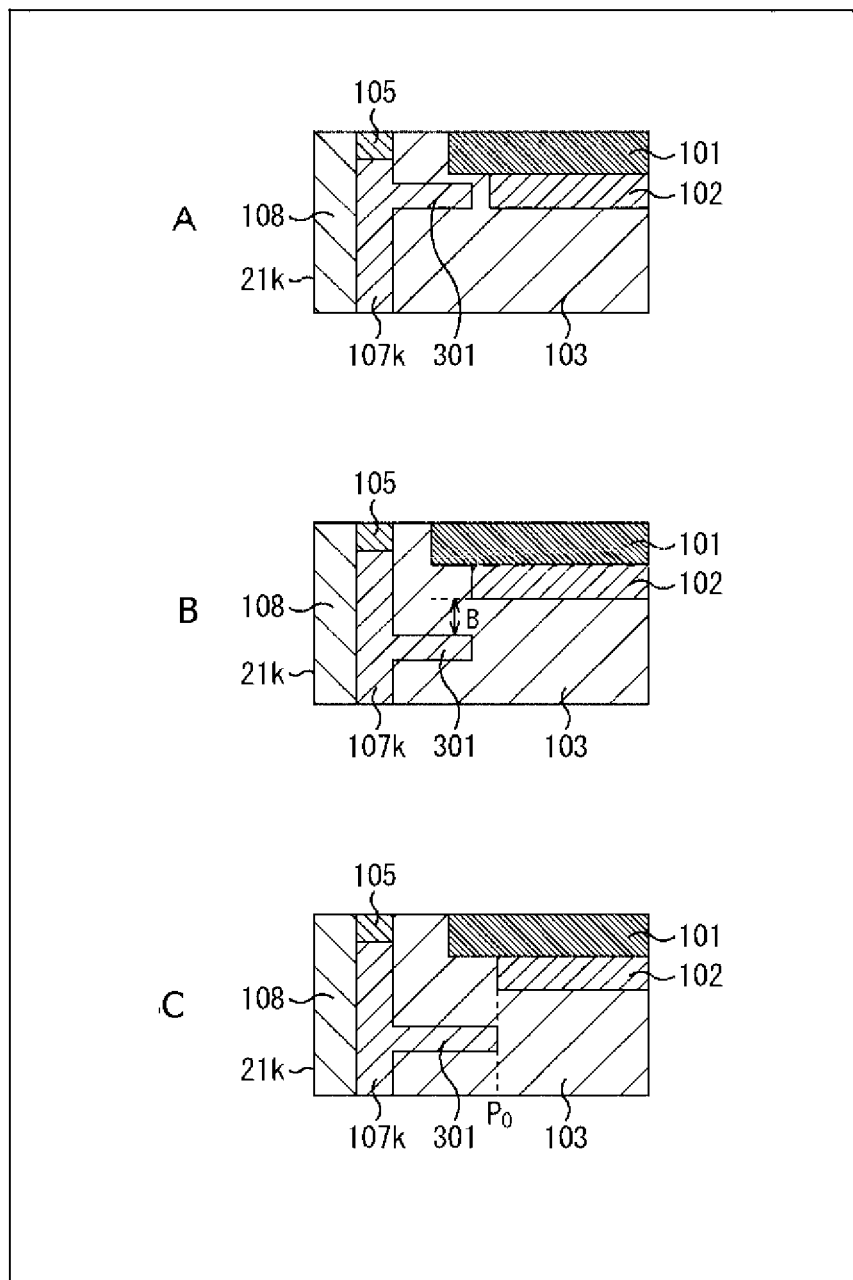
FIG. 28 includes a figure for explaining the position of a block layer.

The block layer 301 may be formed in substantially the same layer as the p-type semiconductor region 102, as illustrated in FIG. 28A. In addition, as depicted in FIG. 28B, the block layer 301 may be formed at a position on the lower side in the figure than the p-type semiconductor region 102, in other words, at a position nearer to the incidence surface side than the p-type semiconductor region 102 when viewed from the incidence surface (the lower surface in the figure) side. In FIG. 28B, an upper edge of the block layer 301 is spaced by a distance B from a lower edge of the p-type semiconductor region 102.

Thus, when the p-type semiconductor region 102 is taken as a reference, the block layer 301 is provided in the range from the same position as the p-type semiconductor region 102 to the position slightly spaced (the position spaced by the distance B) therefrom.

Note that when the distance B is enlarged, namely, when the block layer 301 is largely spaced from the p-type semiconductor region 102, the conduction electrons 331 may bypass the block layer 301 to reach the n-type semiconductor region 101, which may lessen the effect of the block layer 301 as a potential barrier. Therefore, the distance B is set within such a range as to avoid such an unfavorable situation. Accordingly, as depicted in FIG. 27, for example, the distance B may be 0, and the block layer 301 may be formed in such a position that the lower edge of the p-type semiconductor region 102 and the upper edge of the block layer 301 are in the same position.

As depicted in FIGS. 28A and 28B, the block layer 301 is formed at a deeper position (a deeper position in terms of a position on the opposite side from the cathode) than the depth of the multiplication region (the region including a boundary region between the n-type semiconductor region 101 and the p-type semiconductor region 102).

In addition, the block layer 301 may be equivalent to or different from the hole accumulation region 107k in concentration. For example, the concentration of the block layer 301 may be approximately 1e16 to 1E20/cm^3. Note that the optimum concentration for the block layer 301 depends on the size and structure of the APD 21k, the impurity concentration of the wafer, etc.; therefore, the optimum concentration for the block layer 301 is set taking such factors into consideration.

The block layer 301 may be formed such that an end portion of the p-type semiconductor region 102 and an end portion of the block layer 301 are substantially on the same line, when viewed vertically, as illustrated in FIG. 28C. For example, when the position of the end portion of the p-type semiconductor region 102 is assumed to be a position P0, then the block layer 301 may be formed such that the end portion of the block layer 301 is located around the position P0 (in the left-right direction in the figure).

It is considered that when the block layer 301 is formed such that the end portion of the block layer 301 is located at the position P0, the block layer 301 can be formed such as to serve effectively as a potential barrier and to prevent (or alternatively, mitigate) the multiplication region from being narrowed.

On the other hand, when the block layer 301 is so formed that the end portion of the block layer 301 is spaced from the position P0, the function of the block layer 301 as a potential barrier may be lowered. Therefore, the block layer 301 is so formed that its end portion is located as close as possible to the position P0, whereby a configuration can be realized in which the conduction electrons 331 can be blocked efficiently.

Thus, the block layer 301 is formed in the vicinity of the end portion of the p-type semiconductor region 102. Besides, with the block layer 301 formed in the vicinity of the end portion of the p-type semiconductor region 102, more conduction electrons 331 can be guided into the multiplication region, and PDE can be enhanced thereby.

A plan view of the APD 21k, when the APD 21k is viewed from the upper surface side (the upward side in FIG. 25, or the n-type semiconductor region 101 side), is as depicted in FIG. 4. Since the description referring to FIG. 4 has been made above, an overlapping description is omitted.

The APD 21a depicted in FIG. 4 is read (differently) as APD 21k. Each of the APDs 21k is isolated by the isolation region 108 formed in a grid pattern. The anode 105 is formed inside the isolation region 108. The well layer 103 is formed between the anode 105 and the n-type semiconductor region 101. The n-type semiconductor region 101 is formed in a central area of the APD 21k.

The hole accumulation region 107k is formed inside the isolation region 108, though not seen when viewed from the upper surface side. In other words, the hole accumulation region 107k is formed in substantially the same region as that of the anode 105. In addition, although the block layer 301 is not seen when viewed from the upper surface side, the block layer 301 is formed such as to overlap with that portion of the well layer 103 which is located between the anode 105 and the n-type semiconductor region 101 and with part of the n-type semiconductor region 101.

While the n-type semiconductor region 101 depicted in FIG. 4 represents an example of being formed in a tetragonal shape, the n-type semiconductor region 101 may be formed in a circular shape as depicted in FIG. 5.

In the case where the n-type semiconductor region 101 is formed in a tetragonal shape as illustrated in FIG. 4, the area of the multiplication region (n-type semiconductor region 101) can be secured to be large, so that detection efficiency called PDE can be enhanced.

In the case where the n-type semiconductor region 101 is formed in a circular shape as depicted in FIG. 5, electric field concentration at edge portions can be restrained, so that unintentional edge breakdown can be suppressed.

Meanwhile, the configuration in which the block layer 301 is formed thereby to prevent (or alternatively, mitigate) edge breakdown and to ensure that conduction electrons 331 tending to reach the n-type semiconductor region 101 without passing through the multiplication region are guided to pass through the multiplication region may be a configuration in which the hole accumulation region 107k and the isolation region 108 are eliminated. For example, an APD 21k' having a configuration as illustrated in FIG. 29 may be adopted.

Figure 29:
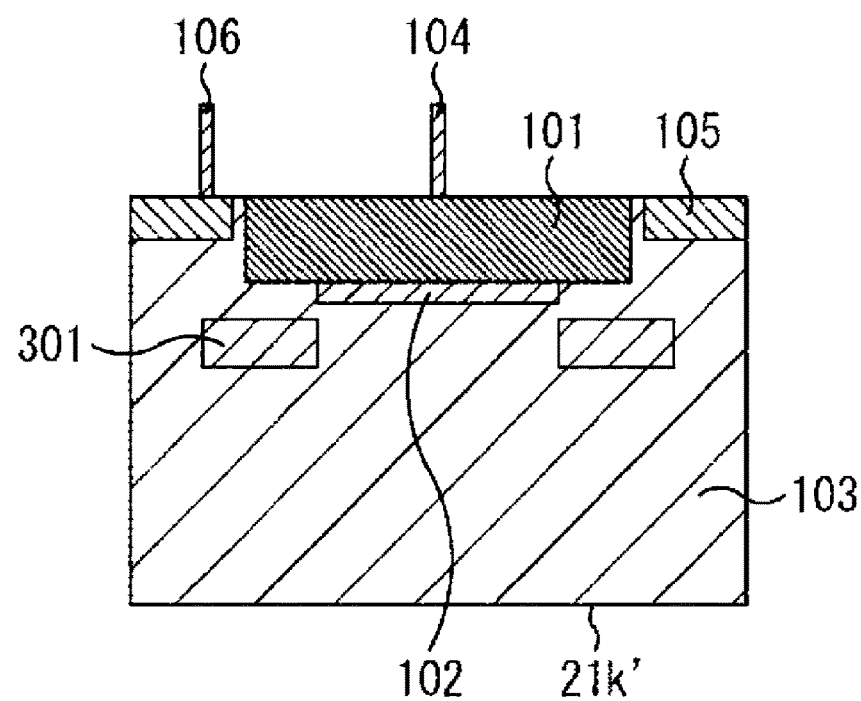
FIG. 29 is a sectional view of another configuration of the APD.

The APD 21k' depicted in FIG. 29 has a configuration obtained by eliminating the hole accumulation region 107k and the isolation region 108 from the APD 21k depicted in FIG. 25. The block layer 301 is formed at a deeper position than the multiplication region, in such a size as to cover at least a region corresponding to the difference between the size of the n-type semiconductor region 101 and the size of the p-type semiconductor region 102.

Figure 30:
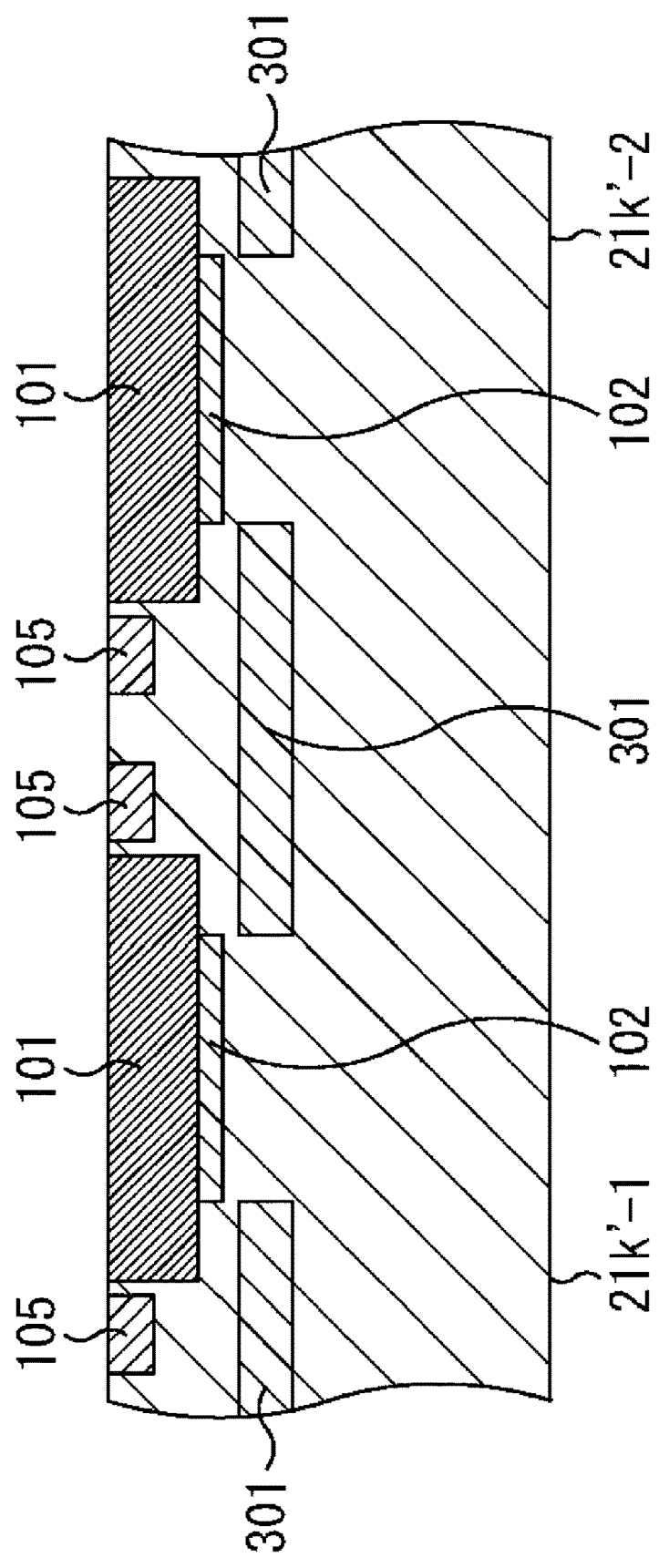
FIG. 30 is a sectional view of another configuration of the APD.

In the case where the APD 21k' is configured in this way, a configuration in which adjacent APDs 21k' share the block layer 301, as illustrated in FIG. 30, for example, may also be adopted. An APD 21k'-1 and an APD 21k'-2 depicted in FIG. 30 are adjacent APDs 21k', and the block layer 30 is formed in such a size as to extend over both the APD 21k'-1 and the APD 21k'-2, and functions both as a potential barrier in the APD 21k'-1 and as a potential barrier in the APD 21k'-2.

In this way, the block layer 301 may be formed in such size and shape as to be shared by a plurality of APDs 21k'.

Note that, while a configuration of the APD 21k' in which the hole accumulation region 107k and the isolation region 108 are eliminated has been taken as an example in the above description, the present technology is applicable to other configurations than the configuration in which the hole accumulation region 107k and the isolation region 108 are omitted. Thus, a configuration in which only either one of the hole accumulation region 107k and the isolation region 108 is eliminated may be adopted.

Thus, the APD 21k in the eleventh embodiment is provided with the high-electric-field region (multiplication region) and with the block layer for blocking electrons from moving to the side of an end portion of the high-electric-field region, the block layer being provided at a position deeper than the high-electric-field region and on the side of the end portion of the high-electric-field region.

The block layer is formed at a deeper position than the high-electric-field region.

The hole accumulation region for trapping electrons is further provided, and the block layer is formed at a side wall of the hole accumulation region.

The isolation region for isolation from neighboring pixels is further provided.

Thus, the p-type semiconductor region 102 is formed to be smaller than the n-type semiconductor region 101, whereby generation of edge breakdown can be restrained. In addition, the formation of the block layer 301 enables a configuration in which more conduction electrons 331 can be made to reach the multiplication region, so that PDE can be enhanced.

Further, with the hole accumulation region 107*k* formed, PDE can be further enhanced. Further, the formation of the isolation region 108 makes it possible to reduce crosstalk. In addition, in these configurations, DCR is not worsened, and the above-mentioned effects can be obtained.

Note that, while an example in which the eleventh embodiment is applied to the first embodiment (FIG. 3) has been depicted here, the eleventh embodiment, specifically, the configuration in which the block layer 301 is provided, is also applicable to the second to tenth embodiments.

Configuration of APD in Twelfth Embodiment

Figure 31:
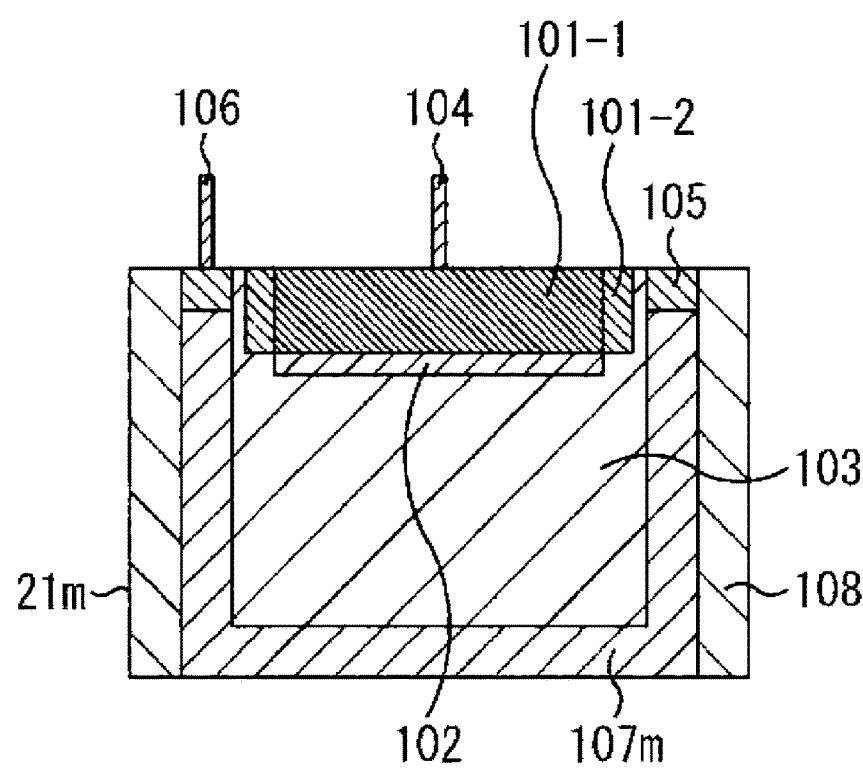
FIG. 31 is a sectional view of another configuration of the APD.

FIG. 31 depicts a sectional configuration in a twelfth embodiment of the APD 21. An APD 21*m* illustrated in FIG. 31 is basically the same in configuration as the APD 21 in the first to tenth embodiment, but differs from the APD 21 in that edge breakdown can be prevented (or alternatively, mitigated) without generating a lowering in PDE or an increase of dark signals.

In addition, the APD 21*m* in the twelfth embodiment is similar to that in the eleventh embodiment in that edge breakdown can be prevented (or alternatively, mitigated) without generating a lowering in PDE or an increase of dark signals.

The configuration of the APD 21*m* depicted in FIG. 31 is similar to the configuration of the APD 21*a* depicted in FIG. 3, but is different in that the n-type semiconductor region 101 is formed in a region of a different impurity concentration. Descriptions of the similar points of the configuration of the APD 21*m* depicted in FIG. 31 to those of the configuration of the APD 21*a* depicted in FIG. 3 are omitted.

The n-type semiconductor region 101 includes an n-type semiconductor region 101-1 having a concentration (referred to as concentration n1) comparable to that in the above-mentioned embodiments and an n-type semiconductor region 101-2 having a concentration (referred to as concentration n2) lower than the concentration n1.

For example, the concentration n2 of the n-type semiconductor region 101-2 may be set a concentration of approximately 0.1 to 0.7 times the concentration n1 of the n-type semiconductor region 101-1. Note that optimum values for the concentration n1 and the concentration n2 depend on the size and structure of the APD 21*m*, impurity concentration of the wafer, etc., and, therefore, the optimum values for the concentration n1 and the concentration n2 are individually set taking such factors into consideration.

Figure 32:
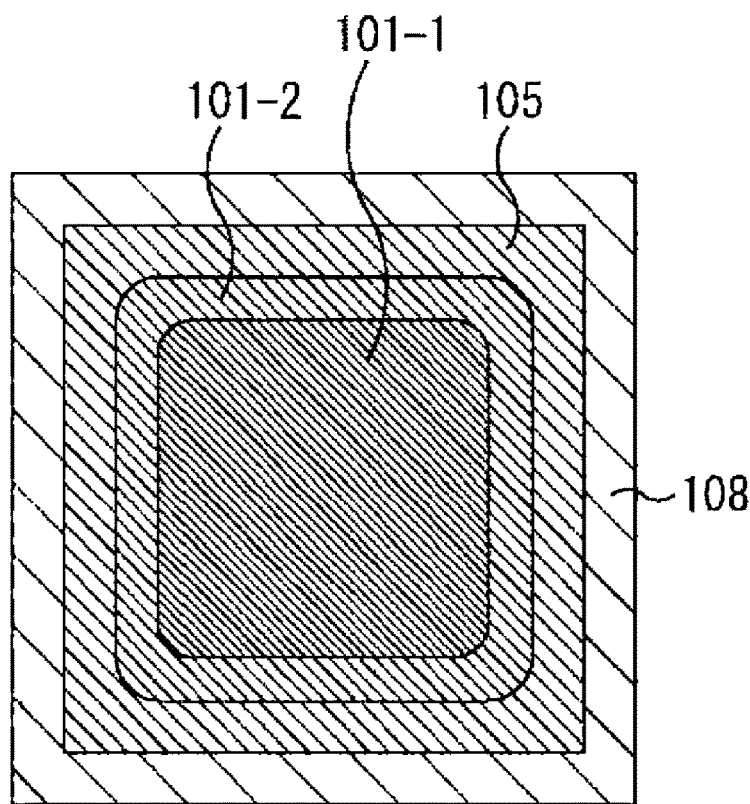
FIG. 32 is a plan view of another configuration of the APD.

The n-type semiconductor region 101-2 is formed at both ends of the n-type semiconductor region 101. Specifically, referring to FIG. 32, when the APD 21*m* is viewed from the upper surface side, the n-type semiconductor region 101-2 is formed such as to surround the periphery of the n-type semiconductor region 101-1. In other words, the n-type semiconductor region 101-1 of the concentration n1 is formed in a central area of the APD 21*m*, and the n-type semiconductor region 101-2 of the concentration n2 is formed in the periphery (outer peripheral area) thereof.

Besides, though not seen when the APD 21*m* is viewed from the n-type semiconductor region 101 side, the p-type semiconductor region 102 is formed on the lower side of the n-type semiconductor region 101. The n-type semiconductor region 101-1 and the p-type semiconductor region 102 may be substantially the same in size. Alternatively, a configuration may be adopted in which the n-type semiconductor region 101-1 is formed as a region smaller than the p-type semiconductor region 102, such that the n-type semiconductor region 101-2 overlaps with part (end portions) of the p-type semiconductor region 102.

Figure 33:
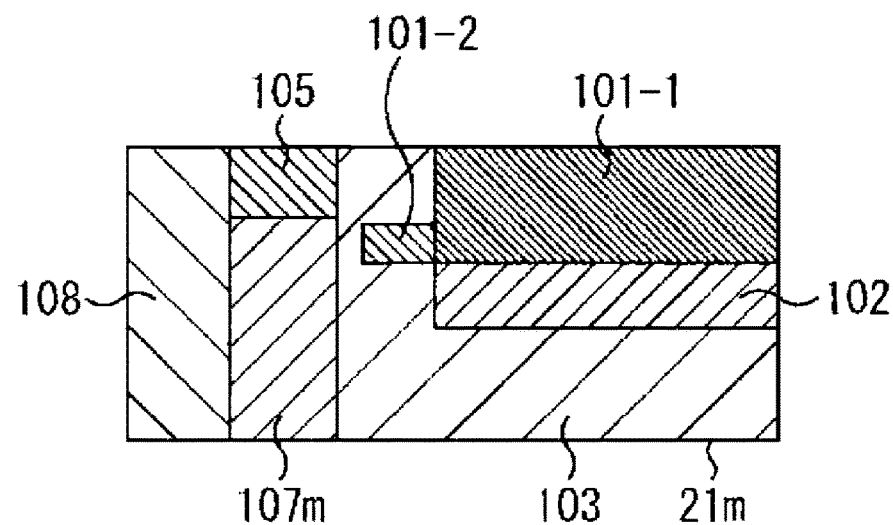
FIG. 33 is a figure for explaining another configuration of an n-type semiconductor region.

In addition, as depicted in FIG. 33, the n-type semiconductor region 101-1 and the n-type semiconductor region 101-2 may not be the same in thickness. Specifically, as illustrated in FIG. 33, the thickness of the n-type semiconductor region 101-2 may be smaller than the thickness of the n-type semiconductor region 101-1.

Thus, the n-type semiconductor region 101 constituting the multiplication region includes two different patterns, namely, a pattern covering the multiplication region (n-type semiconductor region 101-1) and a comparatively smaller pattern (n-type semiconductor region 101-2), the two different patterns being different in the concentration of an n-type impurity used for doping, whereby a configuration can be realized in which edge breakdown can be prevented (or alternatively, mitigated) without generating a lowering in PDE or an increase of dark signals.

Figure 34:
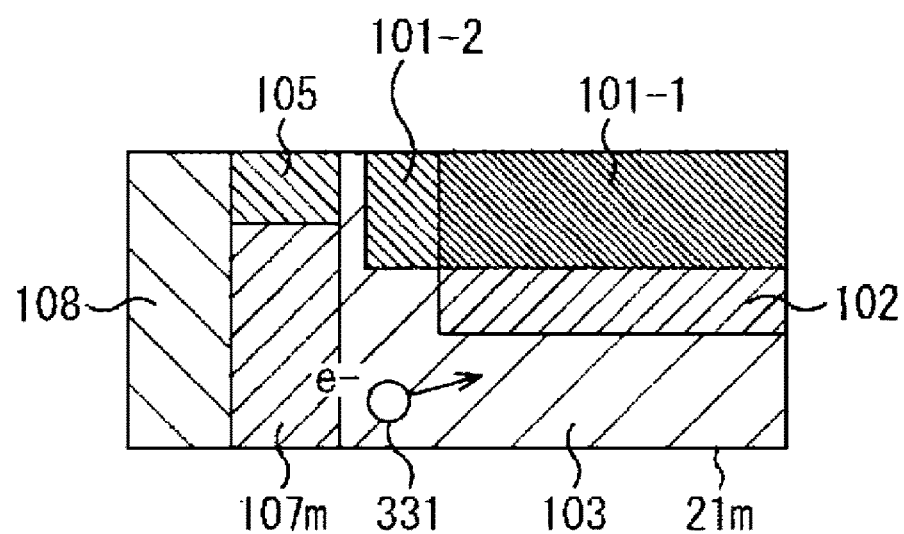
FIG. 34 is a figure for explaining movement of an electron.

FIG. 34 depicts, in an enlarged form, an edge portion of the multiplication region in the APD 21*m* depicted in FIG. 31. When the n-type semiconductor region 101 includes the two regions that differ in concentration, an electric field is weaker in the vicinity of the n-type semiconductor region 101-2 than in the n-type semiconductor region 101-1. In other words, the electric field is relatively stronger in a central area (n-type semiconductor region 101-1) of the n-type semiconductor region 101 than in an outer peripheral area (n-type semiconductor region 101-2) of the n-type semiconductor region 101.

Since a relative difference in electric field can be generated, conduction electrons 331 present in the vicinity of the n-type semiconductor region 101-2, or in the vicinity of an edge of the multiplication region, are drawn toward a relatively stronger electric field. In other words, the conduction electrons 331 present in the vicinity of the edge of the multiplication region can be guided to the multiplication region, so that more conduction electrons 331 can be made to reach the multiplication region.

Thus, the APD 21*m* in the twelfth embodiment has a high-electric-field region (multiplication region) including a first layer and a second layer, and the first layer includes a first region having a first concentration and a second region having a second concentration.

In addition, the second region is formed in an outer peripheral area of the high-electric-field region.

Besides, the first concentration is set higher than the second concentration.

In the APD 21*m* having such a configuration, an n-type semiconductor region of the multiplication region can be formed by use of an n-type impurity doping mask for forming the multiplication region and a p-type impurity doping mask for forming the multiplication region.

Specifically, for example, using the n-type impurity doping mask for forming the multiplication region, the n-type semiconductor region 101 of the concentration n2 is formed, whereby a region corresponding to the n-type semiconductor region 101-2 can be formed. Thereafter, using the p-type impurity doping mask for forming the multiplication region, doping with an n-type impurity is further applied to a region corresponding to the n-type semiconductor region 101-1, whereby the concentration of the n-type impurity is enhanced, and the n-type semiconductor region 101-1 of the concentration n1 can be formed.

Therefore, even in the case of forming the n-type semiconductor region 101 including regions of different concentrations, the formation can be carried out using a comparable number of masks to the number of masks used in forming a conventional APD 21.

Thus, with the p-type semiconductor region 102 formed to be smaller than the n-type semiconductor region 101, generation of edge breakdown can be restrained. In addition, with the n-type semiconductor region 101 formed by forming two regions of different concentrations, more conduction electrons 331 can be made to reach the multiplication region, so that PDE can be enhanced.

Further, with a hole accumulation region 107m formed, PDE can be further enhanced. Note that though not illustrated, the APD 21m in the twelfth embodiment may be provided with a configuration in which the hole accumulation region 107m is eliminated, like the APD 21k in the eleventh embodiment.

Furthermore, with the isolation region 108 formed, crosstalk can be reduced. Note that though not illustrated, the APD 21m in the twelfth embodiment may be provided with a configuration in which the isolation region 108 is eliminated, like the APD 21k in the eleventh embodiment. Note that though not illustrated, the APD 21m in the twelfth embodiment may be provided with a configuration in which the hole accumulation region 107m and the isolation region 108 are eliminated, like the APD 21k in the eleventh embodiment.

In addition, in these configurations, the above-mentioned effects can be obtained, without worsening of DCR.

Note that while an example in which the twelfth embodiment is applied to the first embodiment (FIG. 3) has been described here, the twelfth embodiment, specifically, the configuration in which the n-type semiconductor region 101 having the two regions of different concentrations is provided, may be applied to the second to tenth embodiments.

Besides, the APD 21 can be produced as an APD having both the block layer 301 in the eleventh embodiment and the n-type semiconductor region 101 that has the two regions of different concentrations in the twelfth embodiment.

The above-mentioned fixed charge film 151 (inclusive of 151e and 151j) includes, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. The just-mentioned kinds of films have actually been used as gate insulating films of insulated gate field effect transistors, etc., and film forming methods therefor have been established; accordingly, these films can be easily formed. Examples of the film forming method include a chemical vapor deposition method, a sputtering method, and an atomic layer deposition method. By use of the atomic layer deposition method, a SiO2 layer for reducing interface level can be simultaneously formed in a thickness of approximately 1 nm during film formation, which is preferable.

In addition, examples of other materials than the above-mentioned include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), and yttrium oxide (Y2O3). Further, the above-mentioned fixed charge film 151 having a negative fixed charge may include a hafnium nitride film, an aluminum nitride film, a hafnium oxynitride film or an aluminum oxynitride film.

Besides, the fixed charge film 151 may have silicon (Si) or nitrogen (N) added into the film in such a range as not to spoil insulating properties. The concentration of silicon (Si) or nitrogen (N) is appropriately determined in such a range as not to spoil the insulating properties of the film. With silicon (Si) or nitrogen (N) thus added, heat resistance of the film and ion injection inhibiting capability during the process can be enhanced.

<In Regard of Configuration Inclusive of Peripheral Region>

Figure 35:
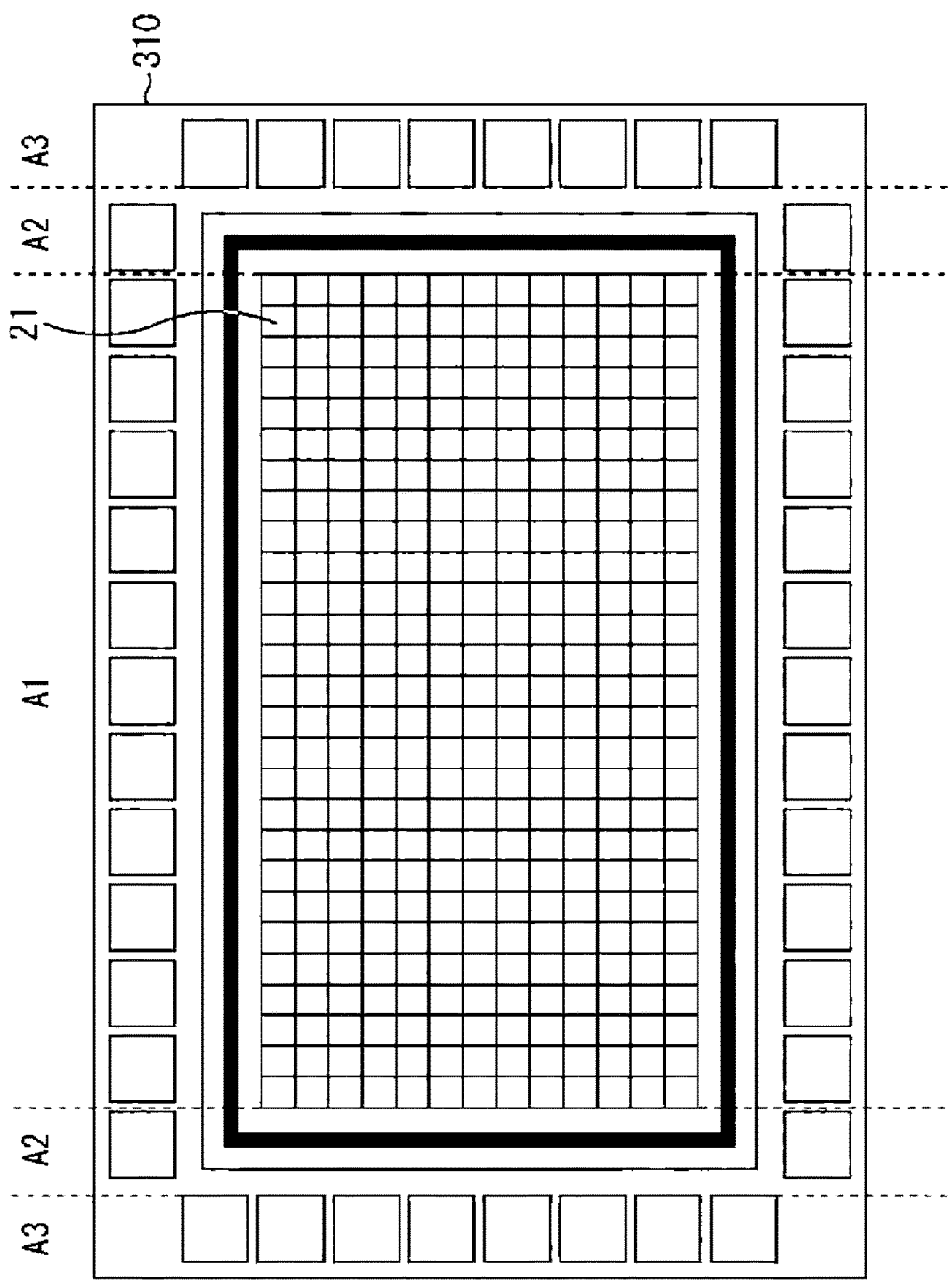
FIG. 35 is a figure for explaining a pixel region, a peripheral region, and a pad region.
Figure 36:
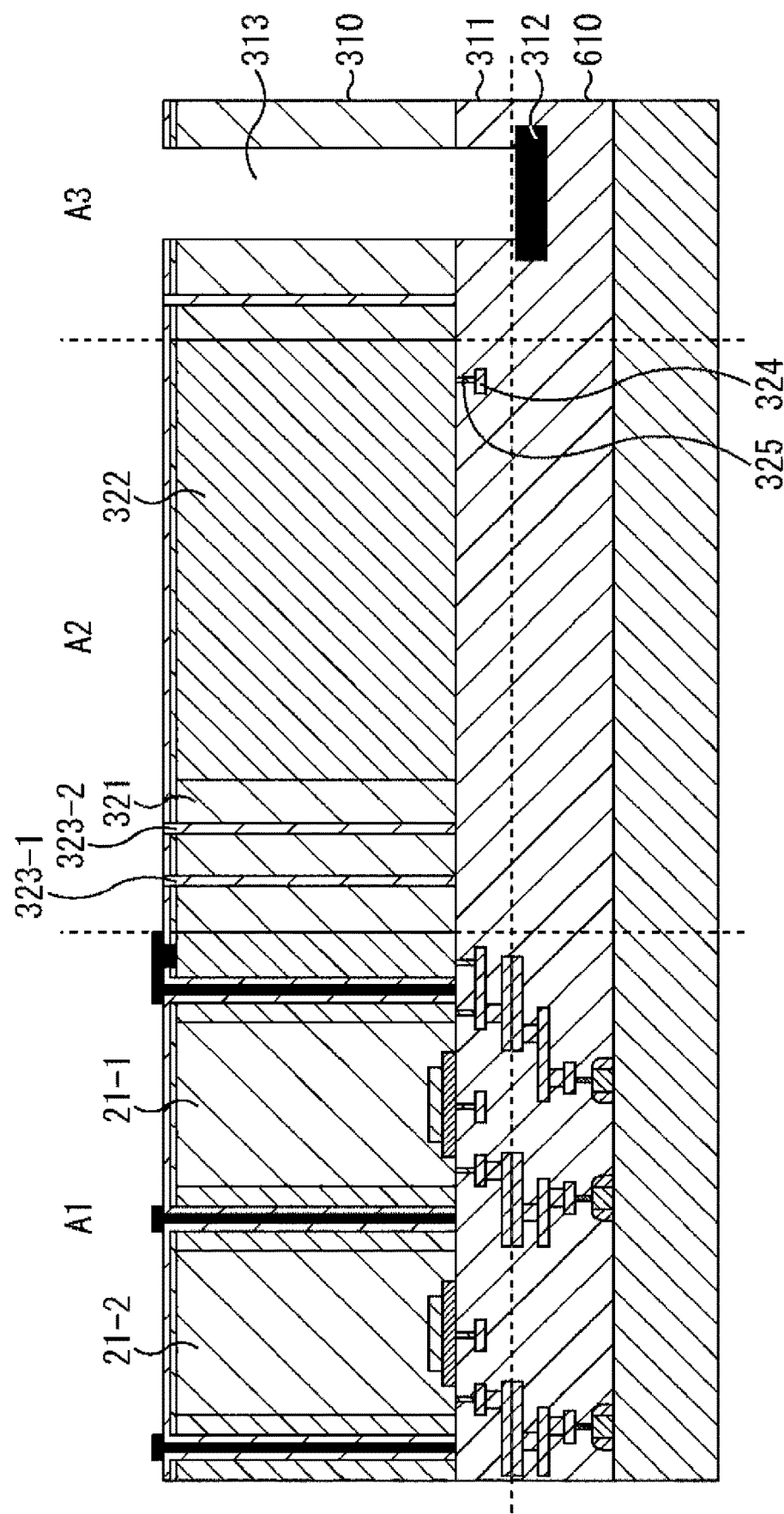
FIG. 36 is a sectional view of an APD.

The APD 21 has been described in the above embodiments. As depicted in FIGS. 35 and 36, the APDs 21 are disposed in an array in a pixel region A1 provided in a sensor chip 310. In FIG. 36, an example is depicted in which an APD 21-1 and an APD 21-2 are disposed in an aligned state in the pixel region A1.

A logic chip 610 is connected to a lower surface (a surface on the side opposite to a light incidence surface) of the sensor chip 310 on which the APDs 21 are disposed. The logic chip 610 is formed with a circuit that processes signals from the APDs 21 and supplies electric power to the APDs 21.

A peripheral region A2 is disposed on the outside of the pixel region A1. Further on the outside of the peripheral region A2, a pad region A3 is disposed.

As depicted in FIG. 36, in the pad region A3, pad openings 313 which are vertical holes extending from an upper end of the sensor chip 310 to reach an inside of a wiring layer 311 and which are holes for wiring to an electrode pad 312 are formed to be aligned in a straight line.

The electrode pad 312 for wiring is provided at a bottom of the pad opening 313. The electrode pad 312 is used, for example, when being connected to a wiring in the wiring layer 311 or when being connected to other external device (chip or the like). In addition, a configuration may be adopted in which a wiring layer near an adhesion surface between the sensor chip 310 and the logic chip 610 functions also as the electrode pad 312.

The wiring layer 311 formed in the sensor chip 310 and the wiring layer formed in the logic chip 610 each include an insulating film and a plurality of wirings. The plurality of wirings and the electrode pad 312 include a metal such as, for example, copper (Cu) or aluminum (Al). Wirings formed in the pixel region A1 and the peripheral region A2 also include a similar material.

The peripheral region A2 is provided between the pixel region A1 and the pad region A3. While the configuration of the peripheral region A2 will be described later, the peripheral region A2 includes an n-type semiconductor region 321 and a p-type semiconductor region 322. In addition, the p-type semiconductor region 322 is connected to a wiring 324 through a contact 325, and the wiring 324 is connected to a ground (GND).

In the example depicted in FIG. 36, in the pixel region A1, the sensor chip 310 and the logic chip 610 are electrically connected in a form in which parts of those wiring layers formed on the side of the adhesion surface between the sensor chip 310 and the logic chip 610 which are located on the most adhesion surface side are directly bonded to each other.

In the n-type semiconductor regions 321, there are formed two trenches, namely, a trench 323-1 and a trench 323-2. The trenches 323 are provided for securely isolating the pixel region A1 and the peripheral region A2. FIG. 36 depicts a case in which two trenches 323 are formed. It is sufficient, however, that at least one trench 323 is formed, as will be described later referring FIG. 51 and subsequent figures.

In the APD 21, as has been described above, a high voltage is impressed between a cathode (contact 104) and an anode 105. Besides, the peripheral region A2 is grounded. For this reason, in an isolation region provided between the pixel region A1 and the peripheral region A2, a high-electric-field region may be generated due to the application of a high voltage to the anode 105, and breakdown may be generated. Although it may be contemplated to broaden the isolation region provided between the pixel region A1 and the peripheral region A2 for the purpose of avoiding the breakdown, broadening the isolation region enlarges the size of the sensor chip 310.

For preventing (or alternatively, mitigating) such breakdown, the trenches 323 are formed. The trenches 323 makes it possible to prevent (or alternatively, mitigate) the breakdown, without broadening the isolation region. The trenches 323 will be described later referring to FIG. 51 and subsequent figures.

First Embodiment of Isolation Region

The APDs 21 are formed with the isolation region for isolation between the APDs 21. For instance, in the APD 21a depicted in FIG. 3, an isolation region 108 is formed.

A detailed configuration of the isolation region 108 will be described below. The isolation region 108 described below will be described taking as an example an isolation region which is provided between the APD 21 disposed in an outermost peripheral area of the pixel region A1 and the peripheral region A2.

Figure 37:
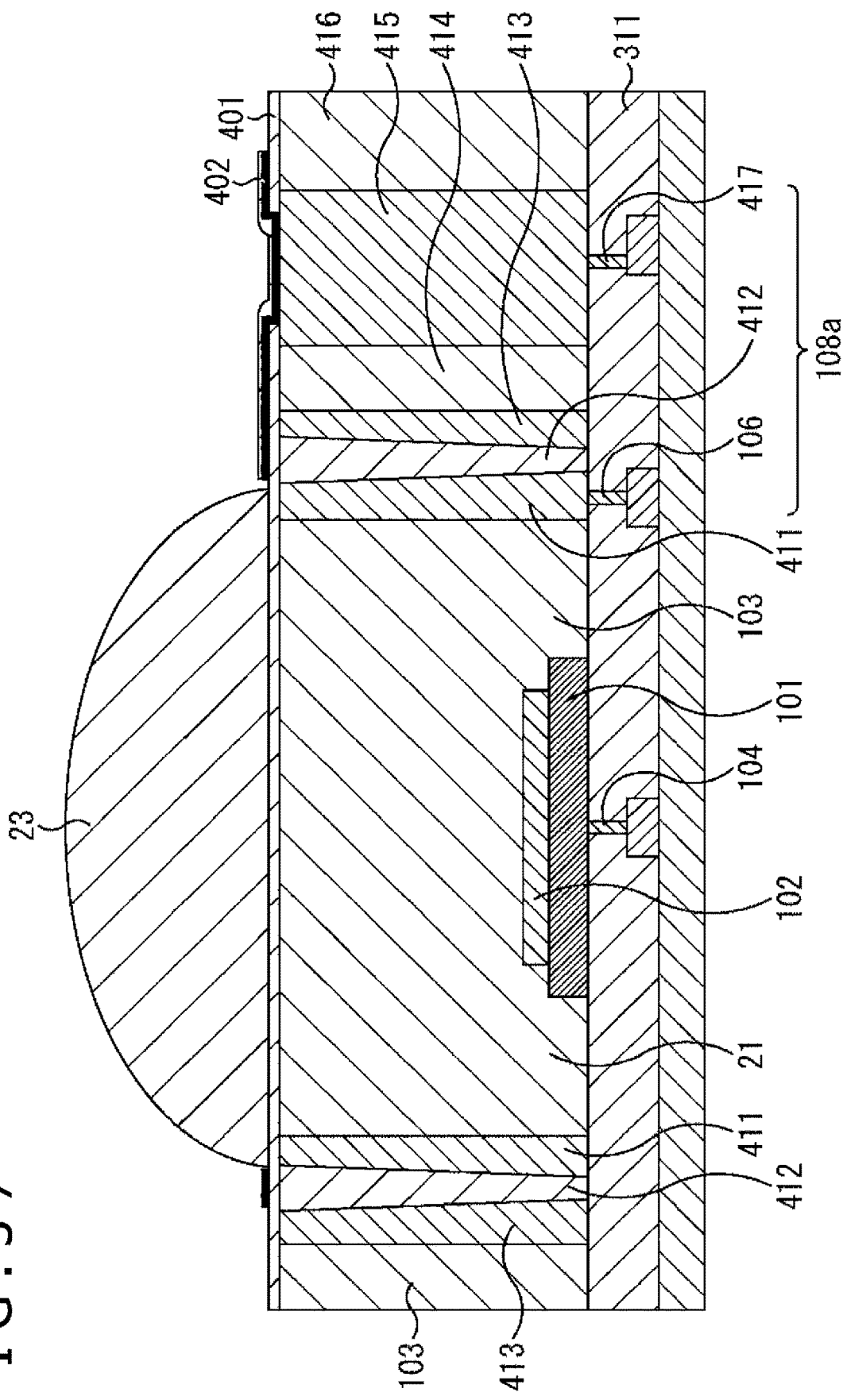
FIG. 37 is a sectional view of a configuration of an isolation region.

FIG. 37 is a figure depicting a configuration of an isolation region 108a in the first embodiment. In the following description, the light incidence surface is illustrated on the upper side. Besides, in the following description, the APD 21 appearing in the description is one of the APDs 21a to 21m in the first to twelfth embodiments described above.

On the light incidence surface side of the APD 21, an on-chip lens 23 is formed. A planarizing film 401 is formed between the on-chip lens 23 and the APD 21.

Isolation regions 108 are formed at both ends of a well layer 103 of the APD 21. Between the APDs 21 on the left side in the figure, the isolation region 108 includes a p-type semiconductor region 411, a trench 412, and a p-type semiconductor region 413.

In addition, between the APD 21 on the right side in the figure and the peripheral region A2, the isolation region 108 includes the p-type semiconductor region 411, the trench 412, the p-type semiconductor region 413, an n-type semiconductor region 414, and a p-type semiconductor region 415. An n-type semiconductor region 416 is a part forming the peripheral region A2.

Note that an anode 105 (not depicted in FIG. 40) is formed between the p-type semiconductor region 411 and a contact 106. In addition, while the p-type semiconductor region 411 is described to be included in the isolation region 108 for convenience of explanation, the p-type semiconductor region 411 can be a region corresponding, for example, to the above-mentioned hole accumulation region 107a in FIG. 3.

As depicted in FIG. 37, the isolation region 108a is a region in which the trench 412 is formed between the p-type semiconductor region 411 and the p-type semiconductor region 413.

For instance, the p-type semiconductor region 411 and the p-type semiconductor region 413 are a single p-type semiconductor region, the p-type semiconductor region is bored so as to penetrate from the front surface to the back surface, and an insulating film such as an oxide film or a nitride film is formed in the bore (through-hole). For example, at the time of forming the planarizing film 401, the material of the planarizing film 401 may be placed to fill the through-hole, whereby the trench 412 may be filled with a predetermined material. In this case, the planarizing film 401 and the trench 412 include the same material.

A light-shielding film 402 is formed on an upper portion (light incidence surface side) of the trench 412. The light-shielding film 402 includes a conductor such as a metal. The light-shielding film 402 is formed in an area ranging from an area on the p-type semiconductor region 415 to an area on the trench 412. A contact 417 is formed on a lower surface (the side on which the light-shielding film 402 is not formed) of the p-type semiconductor region 415, and is so configured that a predetermined voltage is impressed thereon.

Here, the same voltage is impressed on the contact 106 connected to the anode 105 and on the contact 417. The voltage applied to the contact 417 is applied also to the light-shielding film 402 through the p-type semiconductor region 415. Since the light-shielding film 402 is formed also on the trench 412, the same voltage as the voltage impressed on the contact 417 is impressed also on an upper portion of the trench 417.

With the light-shielding film 402 thus provided on the light incidence surface side and with the voltage thus impressed on the light-shielding film 402, pinning in the vicinity of the light-shielding film 402 can be secured. In addition, in applying the voltage on the light-shielding film 402, the voltage can be applied to the light-shielding film 402 through the p-type semiconductor region 415, even in the case in which the contact 417 is provided on the surface (the surface opposite to the light incidence surface side) different from the side on which the light-shielding film 402 is formed.

Therefore, the contacts (in FIG. 37, the contact 104, the contact 106, and the contact 417) can be formed on the same surface, so that connection thereof with wirings in the wiring layer 311 is facilitated.

Figure 38:
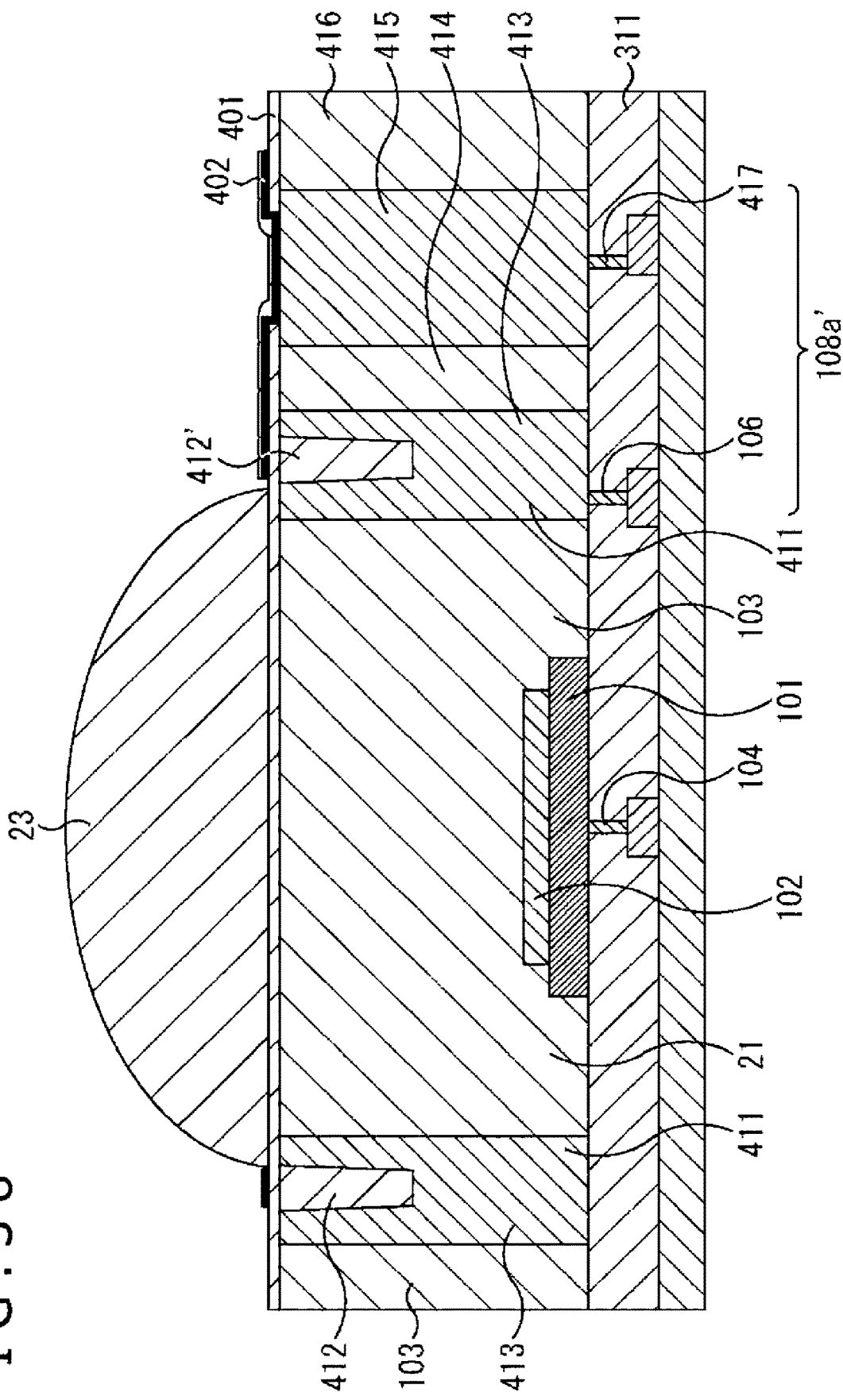
FIG. 38 is a sectional view of another configuration of an isolation region.

The trench 412 may be formed in part of the p-type semiconductor region, as depicted in FIG. 38, without penetrating the p-type semiconductor region. In the sensor chip 310 illustrated in FIG. 38, the trench 412' is formed on the light incidence surface side in the p-type semiconductor region 411, to extend to an intermediate portion of the p-type semiconductor region 411.

For instance, in a step prior to formation of the on-chip lens 23, boring is conducted from the light incidence surface side of the APD 21, to form the trench 412'. In the case of the penetrating trench 412 depicted in FIG. 37, deep boring is needed when the p-type semiconductor region 411 becomes deep; on the other hand, in the case of the trench 412' depicted in FIG. 38, deep boring into the p-type semiconductor region 411 is not needed, so that the trench 412' can be formed more easily than the trench 412 depicted in FIG. 37.

In addition, even in the case of the trench 412' as depicted in FIG. 38, pinning in the vicinity of the light-shielding film 402 can be secured, since a voltage can be applied to the light-shielding film 402.

In this way, the depth of the trench 412 may be so set that the trench 412 penetrates the p-type semiconductor region 411, or may be so set that the trench 412 is formed in part of the region of the p-type semiconductor region 411.

Second Embodiment of Isolation Region

A second embodiment of the isolation region will be described referring to FIG. 39. The isolation region 108*a* in the first embodiment of the isolation region described above has been described taking as an example a case in which the light-shielding film 402 is used as a wiring for connecting the p-type semiconductor region 415 and the trench 412. An isolation region 108*b* in the second embodiment of the isolation region differs from the isolation region 108*a* in the first embodiment of the isolation region, in that a wiring is formed to connect the p-type semiconductor region 415 and the trench 412.

Figure 39:
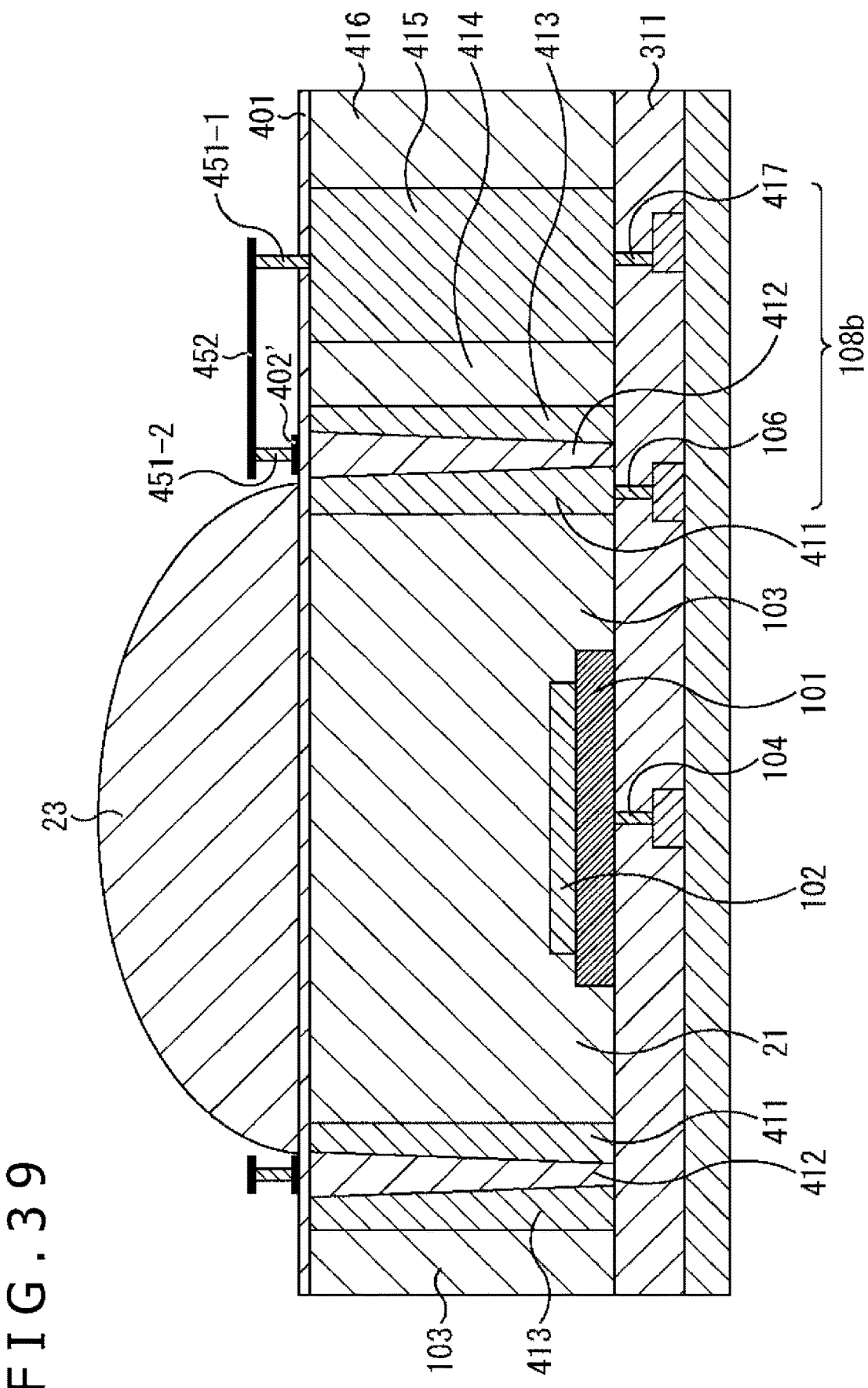
FIG. 39 is a sectional view of another configuration of an isolation region.

Referring to FIG. 39, a contact 451-1 is formed on the light incidence surface side of the p-type semiconductor region 415, and is connected to a wiring 452. In addition, a contact 451-2 is formed on a light-shielding film 402' on the light incidence surface side of the trench 412, and is connected to the wiring 452. Therefore, the p-type semiconductor region 415 and the trench 412 are connected to each other through the contact 451-1, the wiring 452, and the contact 451-2.

Also in such a case, the voltage impressed on the contact 417 is impressed also on the p-type semiconductor region 415, the contact 451-1, the wiring 452, and the contact 451-2, and is impressed also on the trench 412. Therefore, like in the first embodiment of the isolation region, pinning in the vicinity of the contact 451-2 (the light-shielding film 402') can be secured.

The configuration of the sensor chip 310 depicted in FIG. 38 can be applied to the configuration of the sensor chip 310 depicted in FIG. 39, to obtain a configuration in which the trench 412 is formed to extend to an intermediate portion of the p-type semiconductor region 411.

Third Embodiment of Isolation Region

Figure 40:
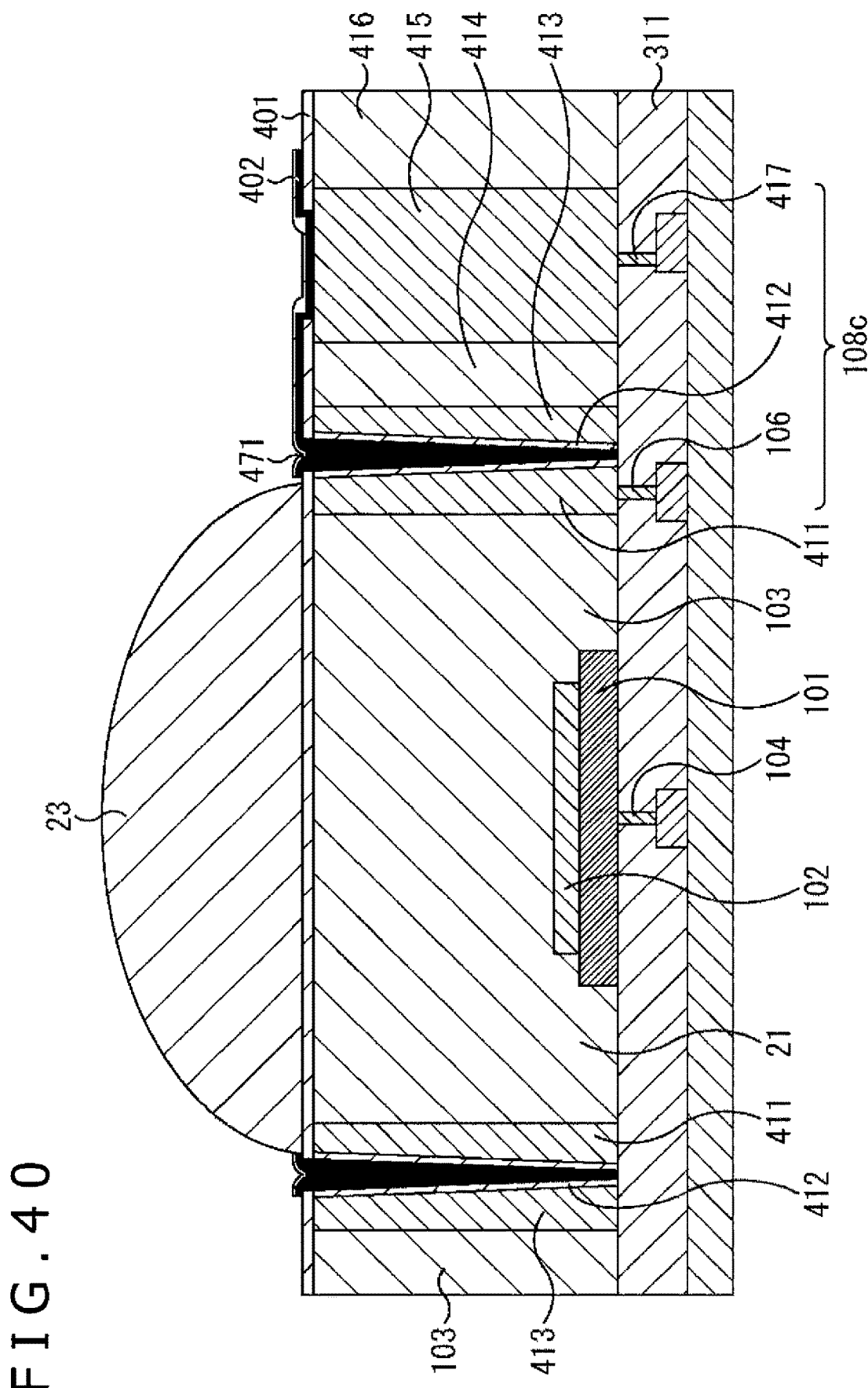
FIG. 40 is a sectional view of another configuration of an isolation region.

Referring to FIG. 40, a third embodiment of the isolation region will be described. In the first and second embodiments of the isolation region, the material placed to fill the trench 412 has been described to be, for example, the same material as that of the planarizing film 401 and to be, for example, an insulating material.

The trench 412 may be filled with a conductive material. Hereinafter, the conductive material placed to fill the trench 412 will be referred to appropriately as light-shielding wall. The light-shielding wall 471 can include the same material as that of the light-shielding film 402. Alternatively, the light-shielding wall 471 may include a material different from that of the light-shielding film 402.

The light-shielding wall 471 includes, for example, a metallic material such as W (tungsten), Al (aluminum), Cu (copper), etc. or such a material as polysilicon.

In addition, a contact portion between the light-shielding wall 471 and the p-type semiconductor region 411 (the p-type semiconductor region 413) is insulated by SiO2 (silicon dioxide) or SiN (silicon nitride). Specifically, the trench 412 has a configuration in which a central portion includes the light-shielding wall 471, and an insulating film is formed around the light-shielding wall 471.

According to the configuration of the sensor chip 310 illustrated in FIG. 40, a voltage impressed on the contact 417 is impressed also on the p-type semiconductor region 415, and is impressed also on the light-shielding film 402 in contact with the p-type semiconductor region 415. Further, since the light-shielding film 402 is in connection with the light-shielding wall 471 in the trench 412, the voltage is impressed also on the light-shielding wall 471.

Here, the voltage value of the voltage impressed on the contact 417 is assumed to be a voltage value A. The voltage impressed on the anode 105 (the voltage impressed on the contact 106) is also assumed to be a voltage value A. In other words, the voltage applied to the contact 106 and the voltage applied to the contact 417 are assumed to be the same voltage. With the voltages thus made to be the same voltage, no electric field stress is exerted between the p-type semiconductor region 411 adjacent to the light-shielding wall 471 and the trench 412, and between the p-type semiconductor region 413 and the trench 412, so that deterioration of these portions can be prevented (or alternatively, mitigated).

In addition, with the light-shielding wall 471 formed in the trench 412 and with the voltage impressed on the light-shielding wall 471, pinning can be secured. This configuration is a configuration corresponding to the APD 21*d'* depicted in FIG. 11.

Referring again to FIG. 11, a metallic film 171' is formed on one side surface of the isolation region 108, and a voltage is impressed on the metallic film 171'. With the voltage impressed on the metallic film 171', a hole accumulation region 107*d'* (not depicted in FIG. 11) is formed in the vicinity of the metallic film 171'.

The metallic film 171' in the APD 21*d'* depicted in FIG. 11 corresponds to the light-shielding wall 471 of the sensor chip 310 depicted in FIG. 40. Therefore, with the voltage impressed on the light-shielding wall 471, a hole accumulation region 107*d'* (not depicted in FIG. 40) is formed in the vicinity of the light-shielding wall 471.

Also in the case of the configuration in which the voltage is thus impressed on the light-shielding wall 471 to form the hole accumulation region 107*d'* (not depicted) in the vicinity of the light-shielding wall 471, electrons generated at an interface between the well layer 103 and an isolation region 108*c* (the p-type semiconductor region 411) can be trapped, so that a dark current generated at the interface can be reduced.

The isolation region 108 is formed also between the APDs 21. For example, as has been described referring to FIG. 4, in the plan view as viewed from the light incidence surface side, the isolation region 108 is formed to surround the APD 21. The isolation region 108*c* depicted in FIG. 40 also is formed to surround the APD 21, and, therefore, the trench 412 is also formed to surround the APD 21.

While the trenches 412 are illustrated as if they were formed at both ends of the APD 21 in FIG. 40, the trenches 412 depicted at both ends are continuous with each other. Therefore, the light-shielding wall 471 formed in the trench 412 is also formed to surround the APD 21. Besides, though not depicted, since the trench 412 is continuous also with the trenches 412 of the neighboring APDs 21, the light-shielding walls 471 formed in the neighboring trenches 412 are also formed in a continuous state.

In other words, the light-shielding wall 471 formed between the APDs 21 formed in the pixel region A1 is formed in a wholly continuous state. Therefore, as depicted in FIG. 40, when a voltage is impressed on the light-shielding wall 471 of the trench 412 in the isolation region 108c disposed in the peripheral region A2, the same voltage can be impressed on the light-shielding wall 471 surrounding each APD 21 of all the APDs 21 formed in the pixel region A1.

Accordingly, hole accumulation regions can be formed in all the APDs 21, the electrons generated at the interface between the well layer 103 and the isolation region 108c (the p-type semiconductor region 411) can be trapped, and the dark current generated at the interface can be reduced.

Figure 41:
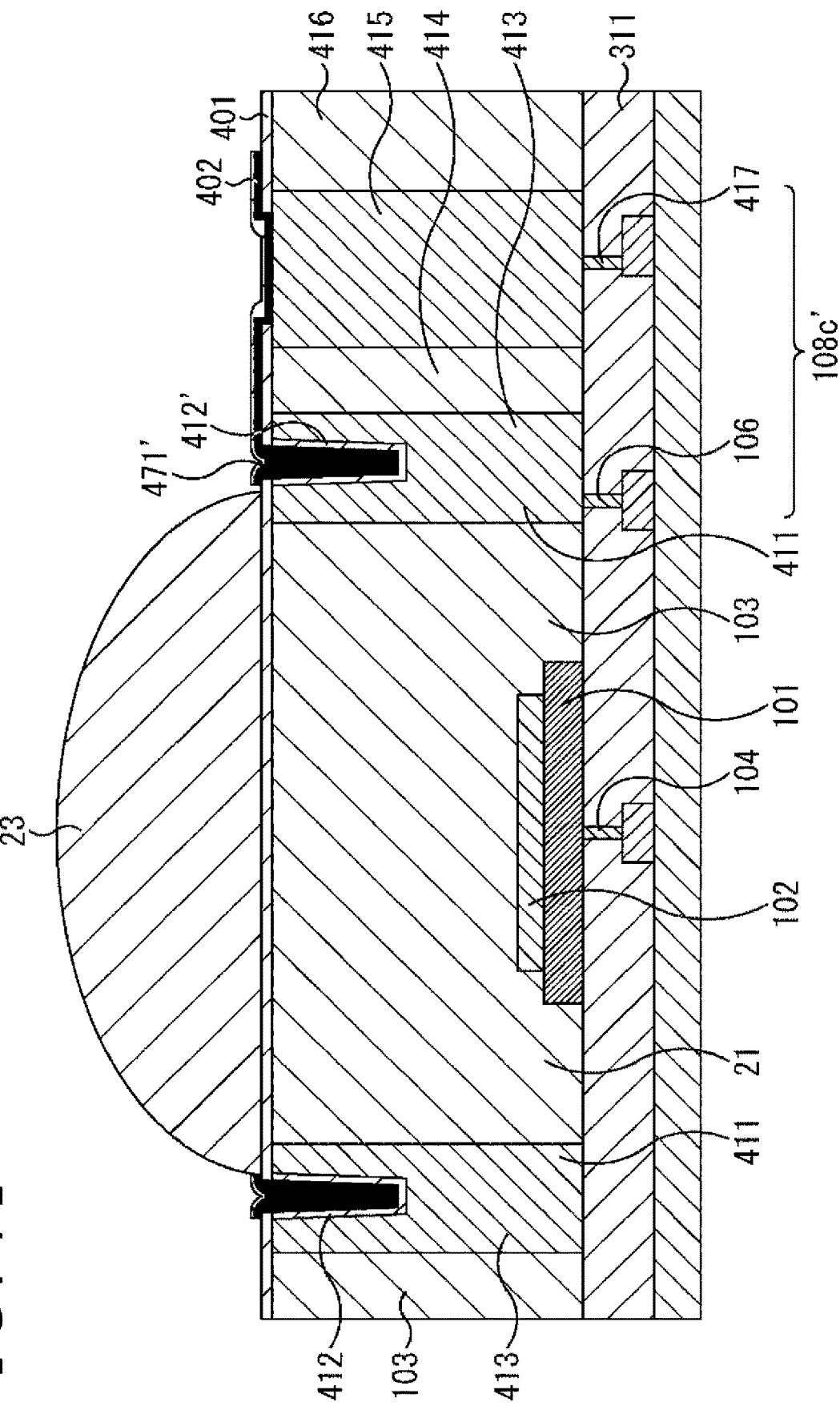
FIG. 41 is a sectional view of another configuration of an isolation region.

The trench 412 may be formed in part of the p-type semiconductor region, as depicted in FIG. 41, without penetrating the p-type semiconductor region. In the isolation region 108c' depicted in FIG. 41, the trench 412' is formed on the light incidence side in the p-type semiconductor region 411, and is formed to extend to an intermediate portion of the p-type semiconductor region 411. This point is similar to that in the isolation region 108a' depicted in FIG. 38. In the isolation region 108c' depicted in FIG. 41, a light-shielding wall 471' is also formed, and the light-shielding wall 471' is formed in the trench 412' which is formed to extend to an intermediate portion of the p-type semiconductor region 411.

Even in the case of the trench 412' and the light-shielding wall 471' as depicted in FIG. 41, a voltage can be impressed on the light-shielding wall 471', whereby pinning in the vicinity of the light-shielding wall 471' can be secured.

In this way, the depth of the trench 412 may be so set that the trench 412 penetrates the p-type semiconductor region 411, or may be so set that the trench 412 is formed in part of the region of the p-type semiconductor region 411.

Fourth Embodiment of Isolation Region

In the first to third embodiments of the isolation region, an example in which the trench 412 is formed has been described. With the trench 412 formed, isolation between pixels and between the pixel region A1 and the peripheral region A2 can be performed securely, and, by impressing a voltage on the light-shielding film 402 connected to the trench 412, pinning can be secured.

Figure 42:
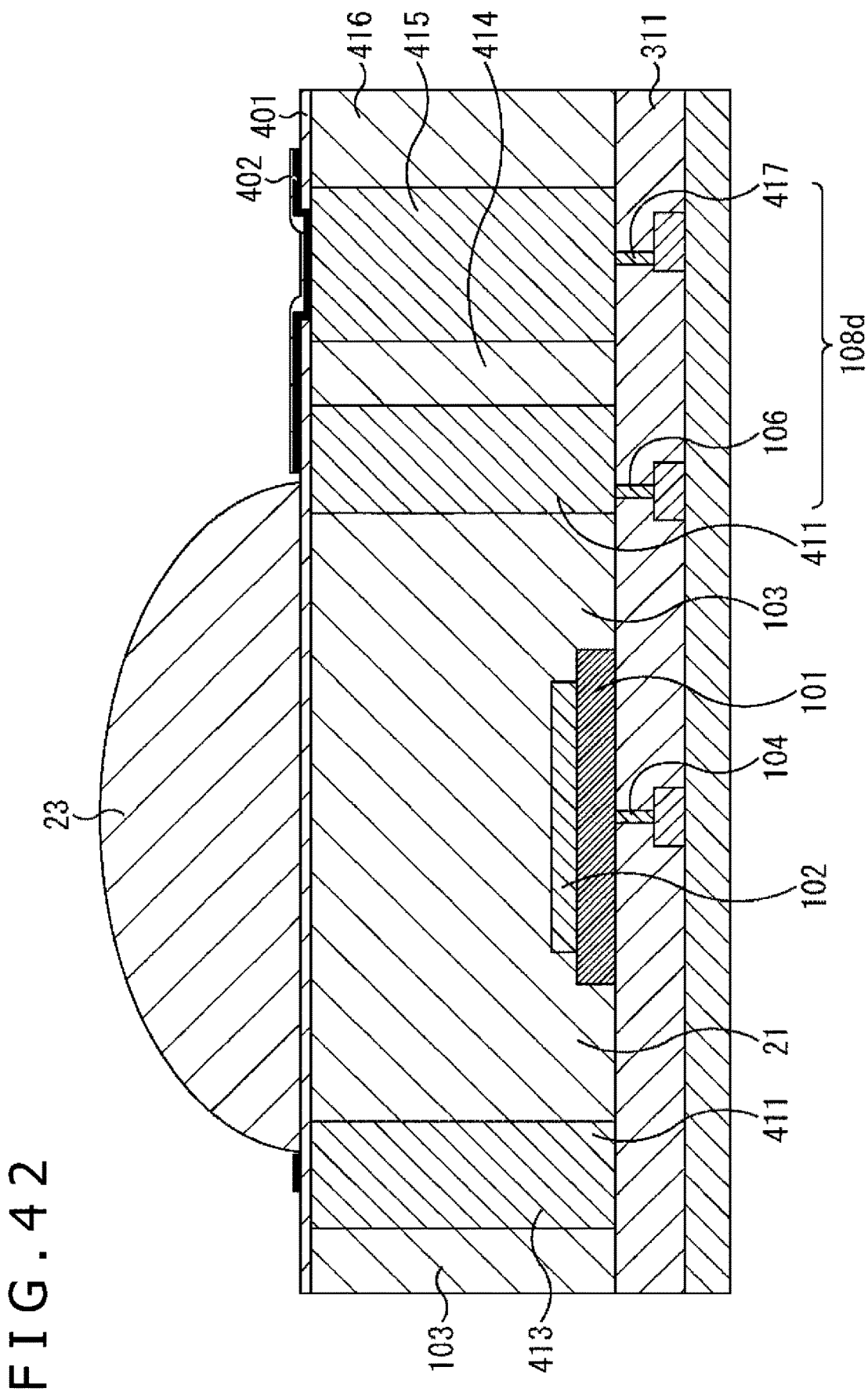
FIG. 42 is a sectional view of another configuration of an isolation region.

As a configuration in which pinning can be secured, there may also be applied a form in which no trench 412 is formed, as depicted in FIG. 42. A sensor chip 310 depicted in FIG. 42 has a configuration in which the trench 412 is eliminated from the isolation region 108a in the first embodiment of the isolation region depicted in FIG. 37, for example.

In the configuration of the isolation region 108d depicted in FIG. 42, the contact 417 is connected to the p-type semiconductor region 415, the p-type semiconductor region 415 is connected to the light-shielding film 402, and the light-shielding film 402 is connected to the p-type semiconductor region 411. The p-type semiconductor region 411 is not provided with any trench 412.

Even in this case, when a predetermined voltage is impressed on the contact 417, the voltage is impressed also on the light-shielding film 402. Therefore, in the vicinity of that portion of the p-type semiconductor region 411 which is in contact with the light-shielding film 402, pinning can be secured.

Fifth Embodiment of Isolation Region

In the first to fourth embodiments of the isolation region, an example is described in which the p-type semiconductor region 415 and the trench 412 are connected through the light-shielding film 402 provided on the light incidence surface side, as seen, for example, when referring again to the isolation region 108a depicted in FIG. 37. A configuration in which the p-type semiconductor region 415 and the trench 412 are connected on the side of the wiring layer 311 will be described below, as a fifth embodiment of the isolation region.

Figure 43:
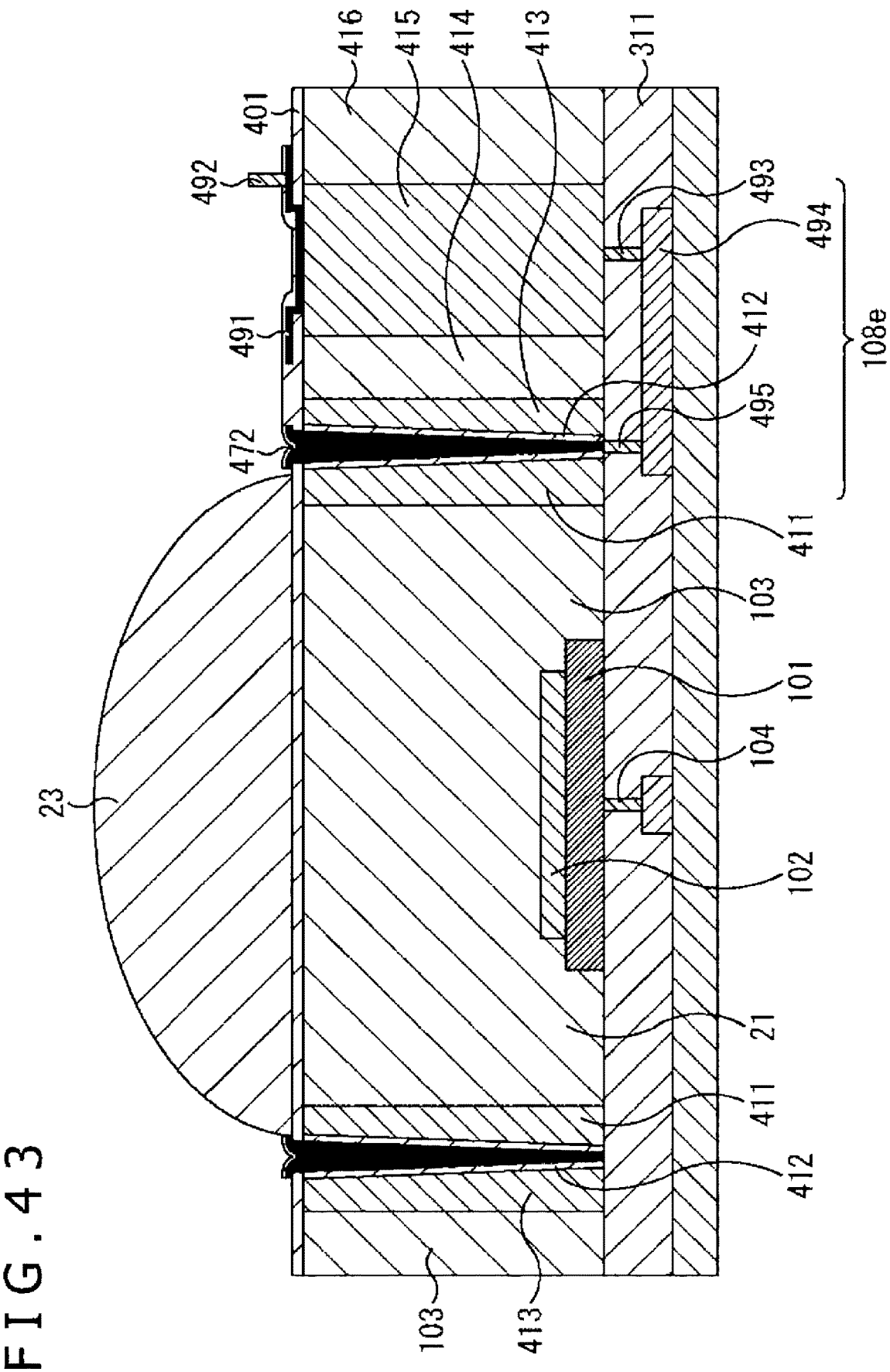
FIG. 43 is a sectional view of another configuration of an isolation region.

In an isolation region 108e depicted in FIG. 43, a light-shielding film 491 is formed on the light incidence surface side of the p-type semiconductor region 415. Unlike the above-mentioned light-shielding film 402 (for example, FIG. 37), the light-shielding film 491 is not formed to extend to the trench 412. In other words, as depicted in FIG. 43, the light-shielding film 491 is not connected to the trench 412.

In addition, the light-shielding film 491 is formed with a contact 492, and a voltage is impressed on the contact 492. The voltage impressed on the contact 492 is made to be the voltage impressed on the contact 417 (for example, FIG. 37) in the above embodiments. In other words, in the fifth embodiment of the isolation region, the voltage is impressed from the light incidence surface side through the light-shielding film 491 and the contact 492 which are formed on the light incidence surface side.

The voltage impressed on the light-shielding film 491 is impressed also on the p-type semiconductor region 415, and is impressed also on the light-shielding wall 472 formed in the trench 412, through contacts and a wiring which are formed in the wiring layer 311.

A contact 493 is formed on the wiring layer 311 side of the p-type semiconductor region 415, and the contact 493 is connected to a wiring 494. The contact 493 is connected to one end side of the wiring 494, and a contact 495 is connected to the other end side. The contact 495 is connected to the light-shielding wall 472.

Since the light-shielding film 491, the p-type semiconductor region 415, the contact 493, the wiring 494, the contact 495, and the light-shielding wall 472 are thus connected, a configuration can be realized in which the voltage impressed on the light-shielding film 491 is impressed also on the p-type semiconductor region 415, the contact 493, the wiring 494, the contact 495, and the light-shielding wall 472.

In this case, also, with the voltage impressed on the light-shielding wall 472, a hole accumulation region can be formed in the vicinity of the light-shielding wall 472. With the hole accumulation region formed, electrons generated at the interface between the well layer 103 and the isolation region 108e (the p-type semiconductor region 411) can be trapped, so that a dark current generated at the interface can be reduced.

Sixth Embodiment of Isolation Region

In the first to fifth embodiments of the isolation region, an anti-flare film for preventing (or alternatively, mitigating) light reflection (flare) on the light-shielding film may be formed on the light-shielding film 402 (light-shielding film 491). Here, a case of forming an anti-flare film on the light-shielding film 402 in the third embodiment of the isolation region depicted in FIG. 40 is depicted in FIG. 44, as a sixth embodiment of the isolation region, and description will be continued.

Figure 44:
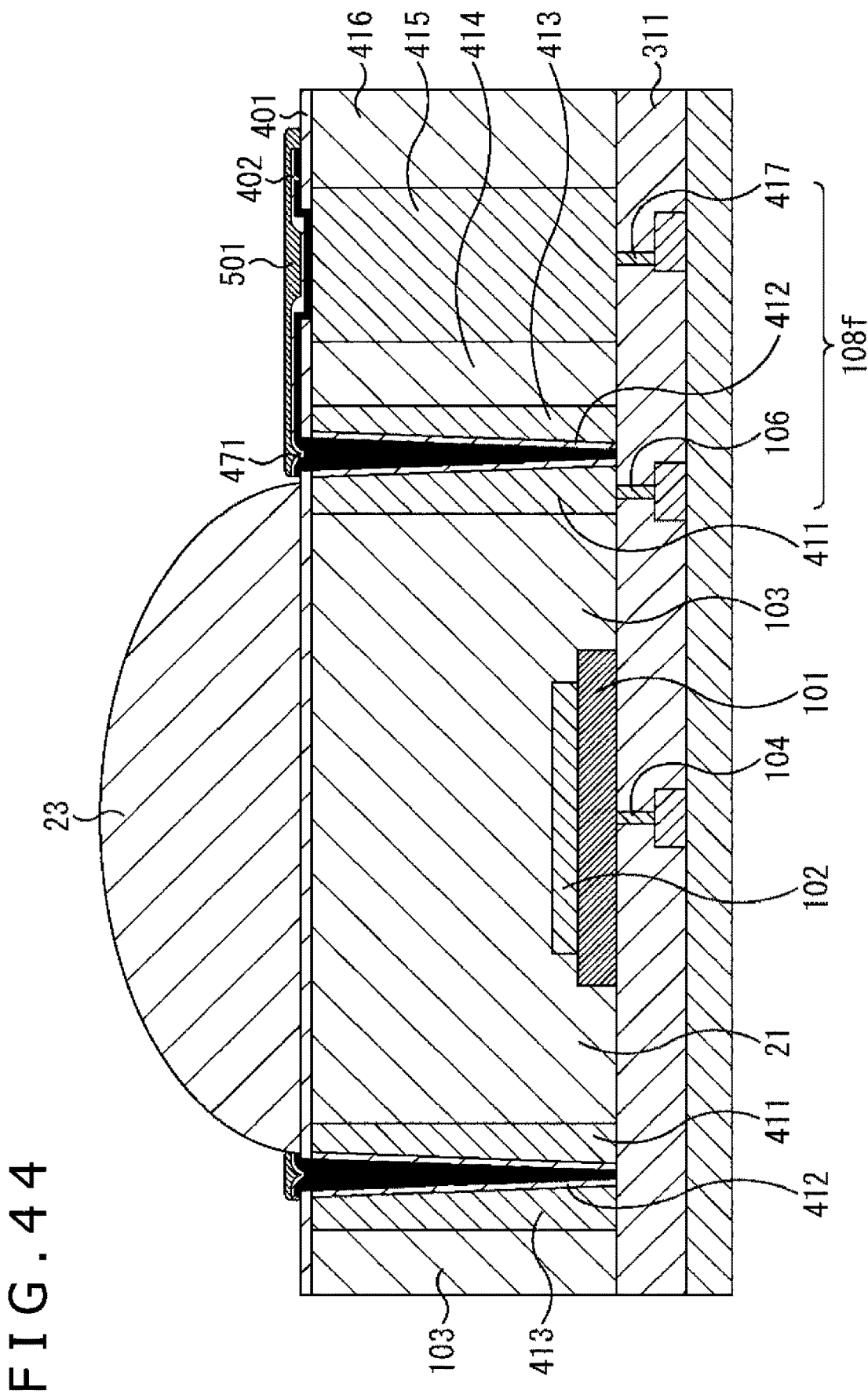
FIG. 44 is a sectional view of another configuration of an isolation region.

In a sensor chip 310 depicted in FIG. 44, an anti-flare film 501 is formed on the light-shielding film 402. With the anti-flare film 501 formed, reflection from the light-shielding film 402 can be reduced.

Figure 45:
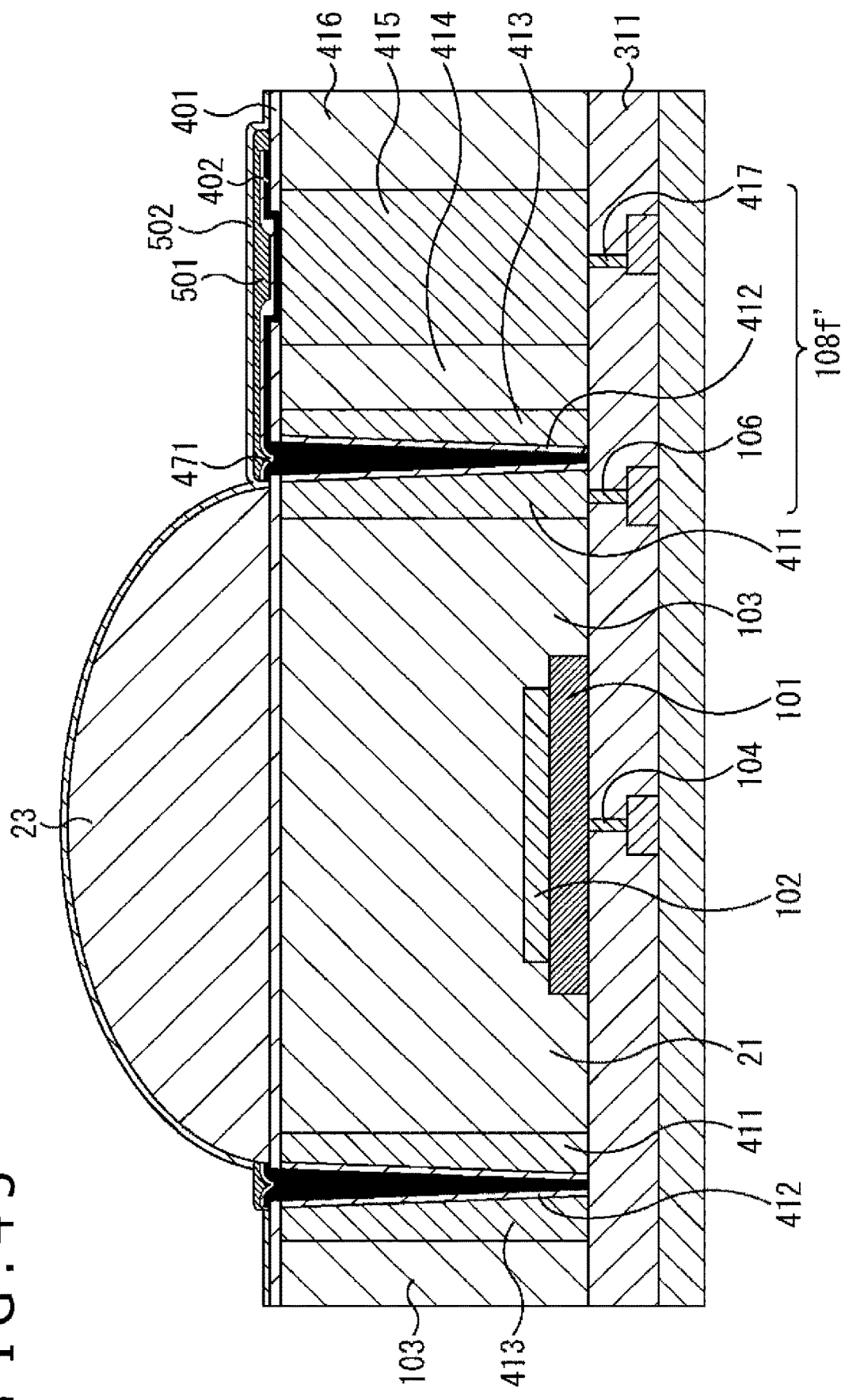
FIG. 45 is a sectional view of another configuration of an isolation region.

Further, as depicted in FIG. 45, an anti-reflection film can be formed. Referring to FIG. 45, an anti-reflection film 502 is formed on the light-shielding film 402 (the anti-flare film 501 formed on the light-shielding film 402) and an on-chip lens 23. With the anti-reflection film 502 thus formed, influences of reflection of light from the light-shielding film 402, the light-shielding wall 471 and the like can be reduced.

Figure 46:
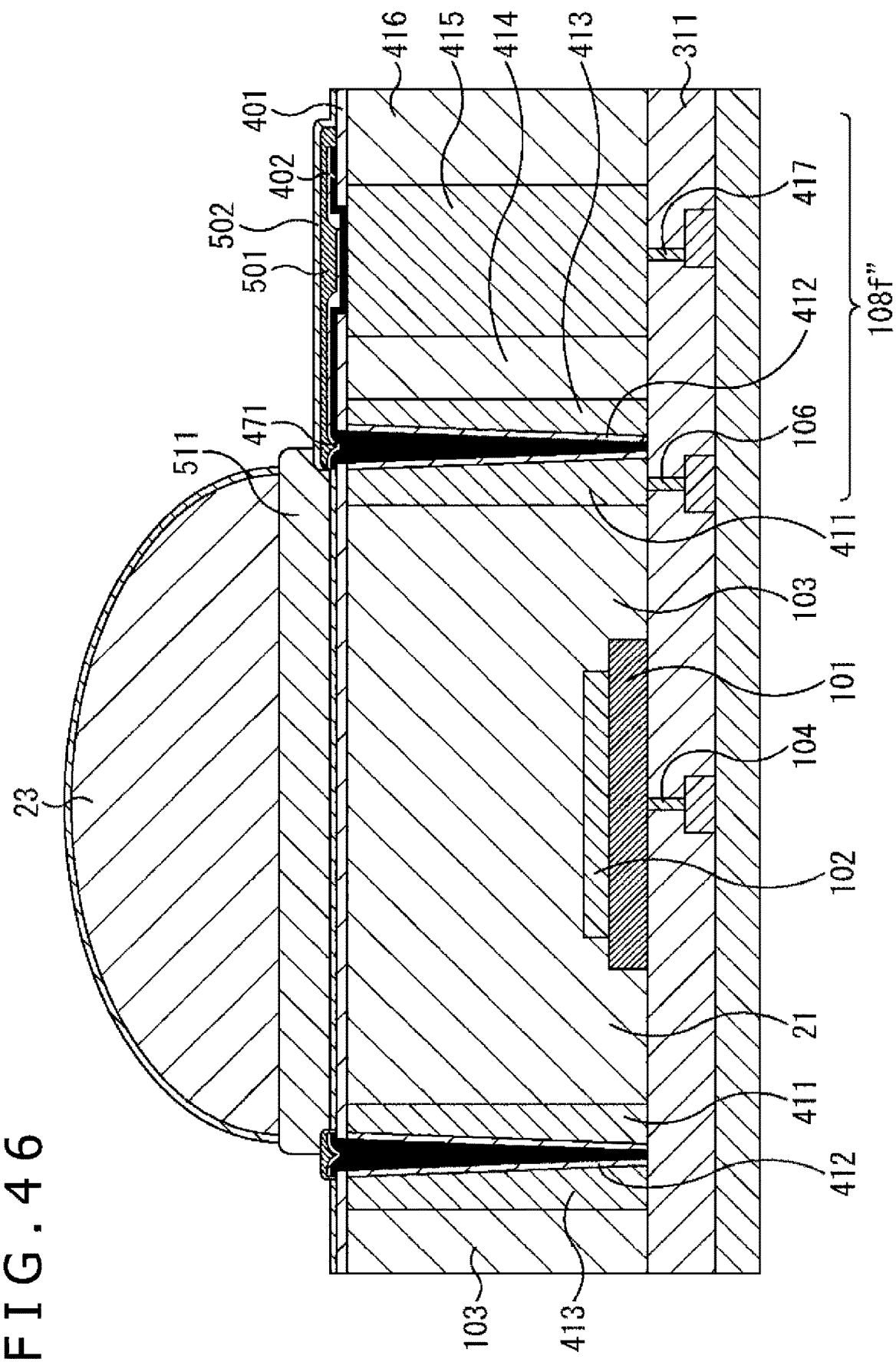
FIG. 46 is a sectional view of another configuration of an isolation region.

Further, as depicted in FIG. 46, a color filter 511 can be formed. While an example in which the APD 21 is formed with a color filter 511 has not been described in any of the above embodiments, the APD 21 can be formed with a color filter 511 in any of the embodiments.

As depicted in FIG. 46, the color filter 511 is formed between the on-chip lens 23 and the planarizing film 401. The color filter 511 may be, for example, a filter transmissive to a specific color such as red (R), green (G), blue (B), white (W) or the like, or may be a filter transmissive to infrared light or ultraviolet light or the like.

Seventh Embodiment of Isolation Region

In the first to sixth embodiments of the isolation region, the p-type semiconductor region 411, the trench 412, the p-type semiconductor region 413, the n-type semiconductor region 414, and the p-type semiconductor region 415 are aligned, as seen, for example, when referring to the isolation region 108c depicted in FIG. 40. All these regions can be formed as p-type semiconductor regions.

Figure 47:
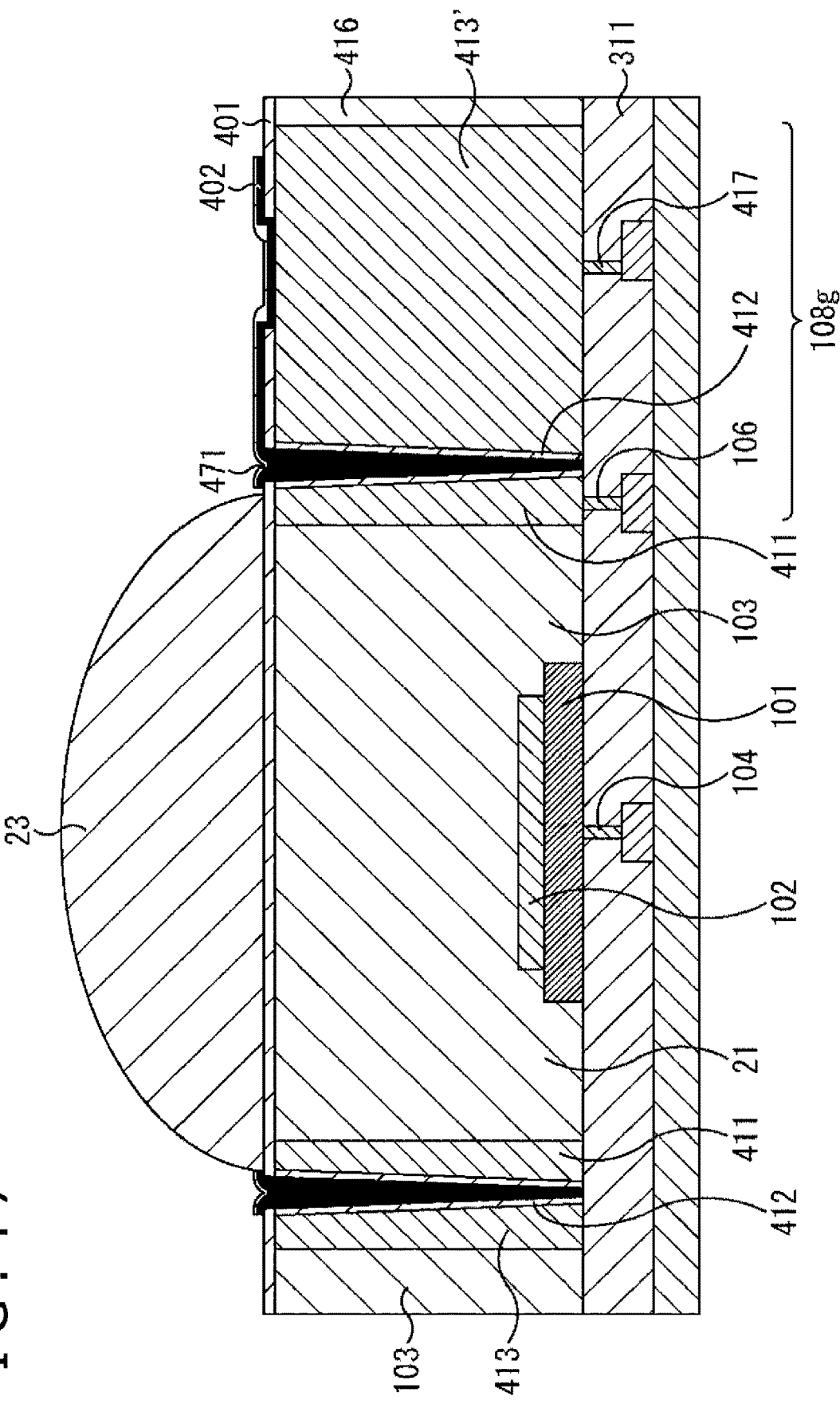
FIG. 47 is a sectional view of another configuration of an isolation region.
Figure 48:
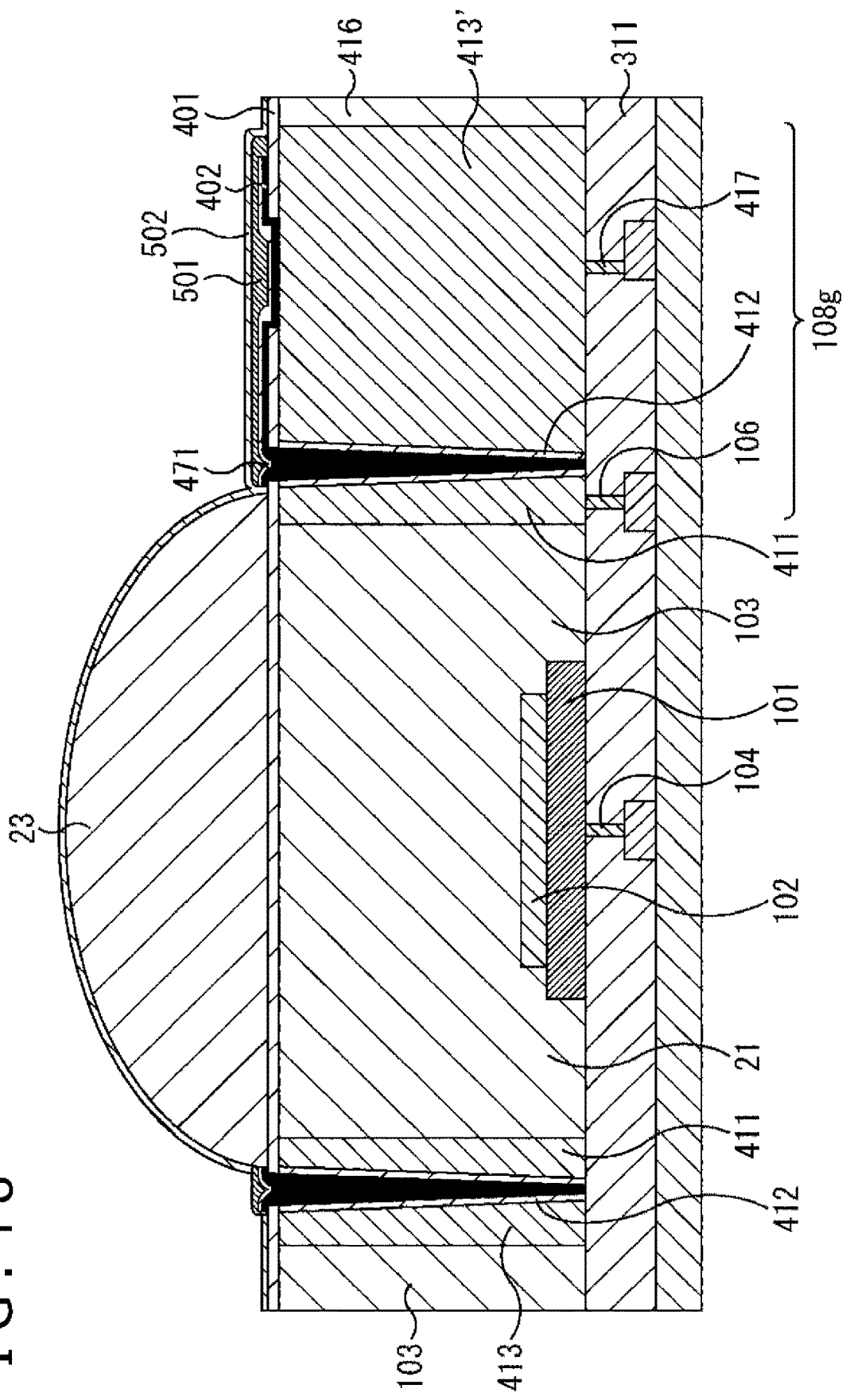
FIG. 48 is a sectional view of another configuration of an isolation region.

FIGS. 47 and 48 are figures depicting a configuration of an isolation region 108g in a seventh embodiment of the isolation region. FIG. 47 illustrates a case in which the isolation region 108c depicted in FIG. 40 includes only a p-type semiconductor region. FIG. 48 illustrates a case in which the isolation region 108f' depicted in FIG. 45 includes only a p-type semiconductor region.

The isolation region 108g depicted in FIGS. 47 and 48 includes a p-type semiconductor region 411, a trench 412, and a p-type semiconductor region 413'. The p-type semiconductor region 413' is formed in a region corresponding, for example, to the p-type semiconductor region 413, the n-type semiconductor region 414, and the p-type semiconductor region 415 in the isolation region 108c depicted in FIG. 40.

A contact 417 is connected to the p-type semiconductor region 413'. Therefore, like in the isolation region 108c depicted in FIG. 40, also in the isolation region 108g depicted in FIG. 47, when a voltage at a predetermined voltage value is impressed on the contact 417, the voltage can be impressed also on the p-type semiconductor region 413', the light-shielding film 402, and the light-shielding wall 471.

Also in this case, therefore, a configuration in which a voltage can be impressed on the light-shielding wall 471 can be obtained, and a hole accumulation region can be formed in the vicinity of the light-shielding wall 471. With the hole accumulation region formed, electrons generated at the interface between the well layer 103 and the isolation region 108g (the p-type semiconductor region 411) can be trapped, so that a dark current generated at the interface can be reduced.

Note that though not illustrated, the seventh embodiment concerning the configuration in which the above-mentioned regions are formed only of the p-type semiconductor region can be applied to isolation regions 108 other than the isolation region 108c depicted in FIG. 40 and the isolation region 108f' depicted in FIG. 45.

Eighth Embodiment of Isolation Region

In the first to seventh embodiments of the isolation region, a configuration in which a voltage is impressed on the trench 412 through the p-type semiconductor region 413' (415) has been taken as an example and described. A configuration can also be adopted in which a voltage is impressed directly on the light-shielding wall 471 formed in the trench 412.

Figure 49:
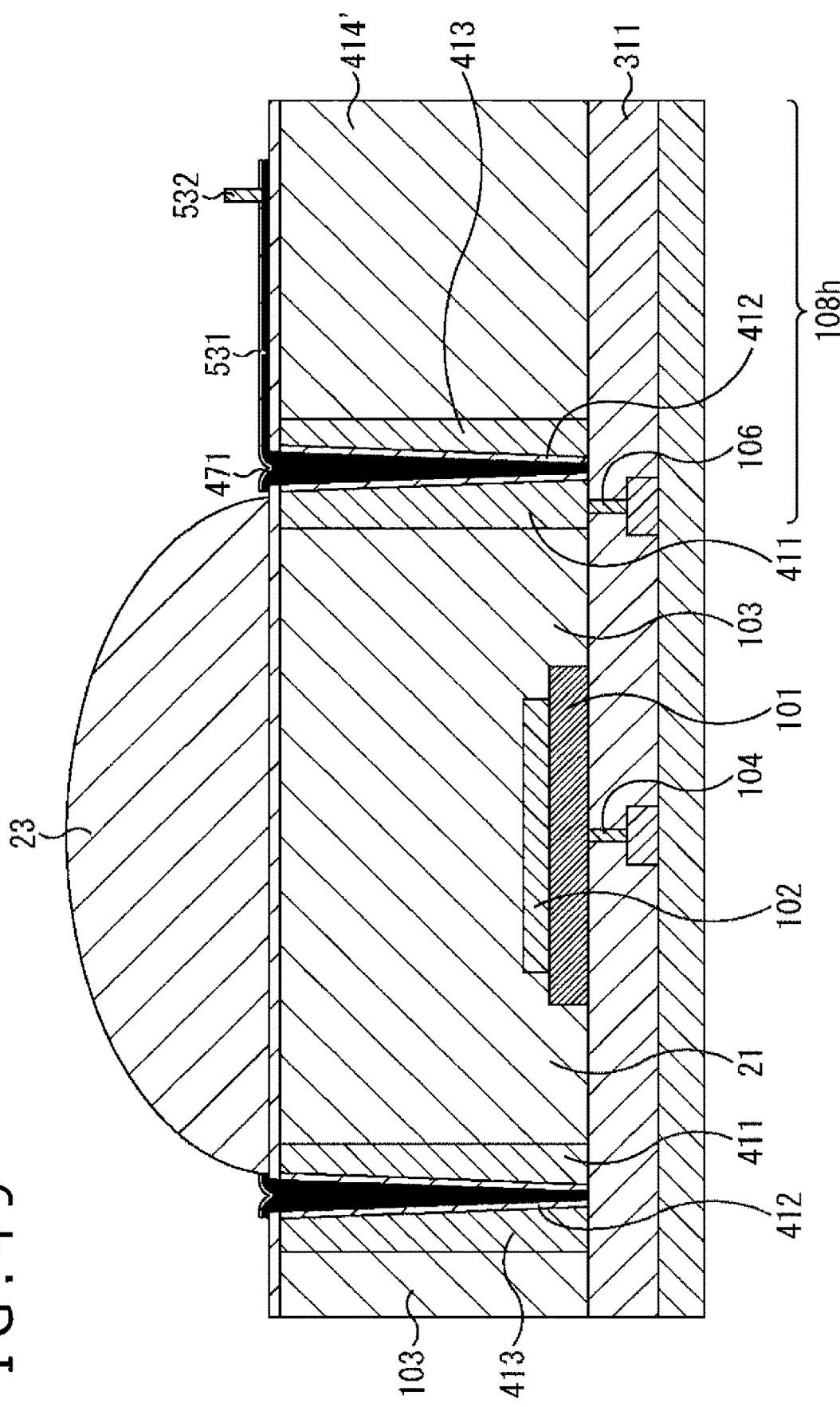
FIG. 49 is a sectional view of another configuration of an isolation region.

FIG. 49 is a figure for explaining a configuration of an isolation region 108h in an eighth embodiment of the isolation region. The trench 412 of the isolation region 108h is formed with the light-shielding wall 471. A wiring 531 is connected to the light-shielding wall 471. The wiring 531 may be formed on the isolation region 108h to function also as a light-shielding film, in the same manner as the light-shielding film 402 (for example, FIG. 48).

The wiring 531 is formed with a contact 532. When a predetermined voltage is impressed on the contact 532, the voltage is impressed also on the wiring 531 and the light-shielding wall 471. Therefore, in this case, also, the voltage can be impressed on the light-shielding wall 471, whereby a hole accumulation region is formed in the vicinity of the light-shielding wall 471, and a dark current generated at the interface can be reduced.

According to the configuration of the isolation region 108h depicted in FIG. 49, the voltage is not impressed on the light-shielding wall 471 through the p-type semiconductor region, and, therefore, the region formed under the wiring 531 is an n-type semiconductor region 414'. In this case, the isolation region 108h includes the p-type semiconductor region 411, the trench 412, the p-type semiconductor region 413, and the n-type semiconductor region 414'.

Figure 50:
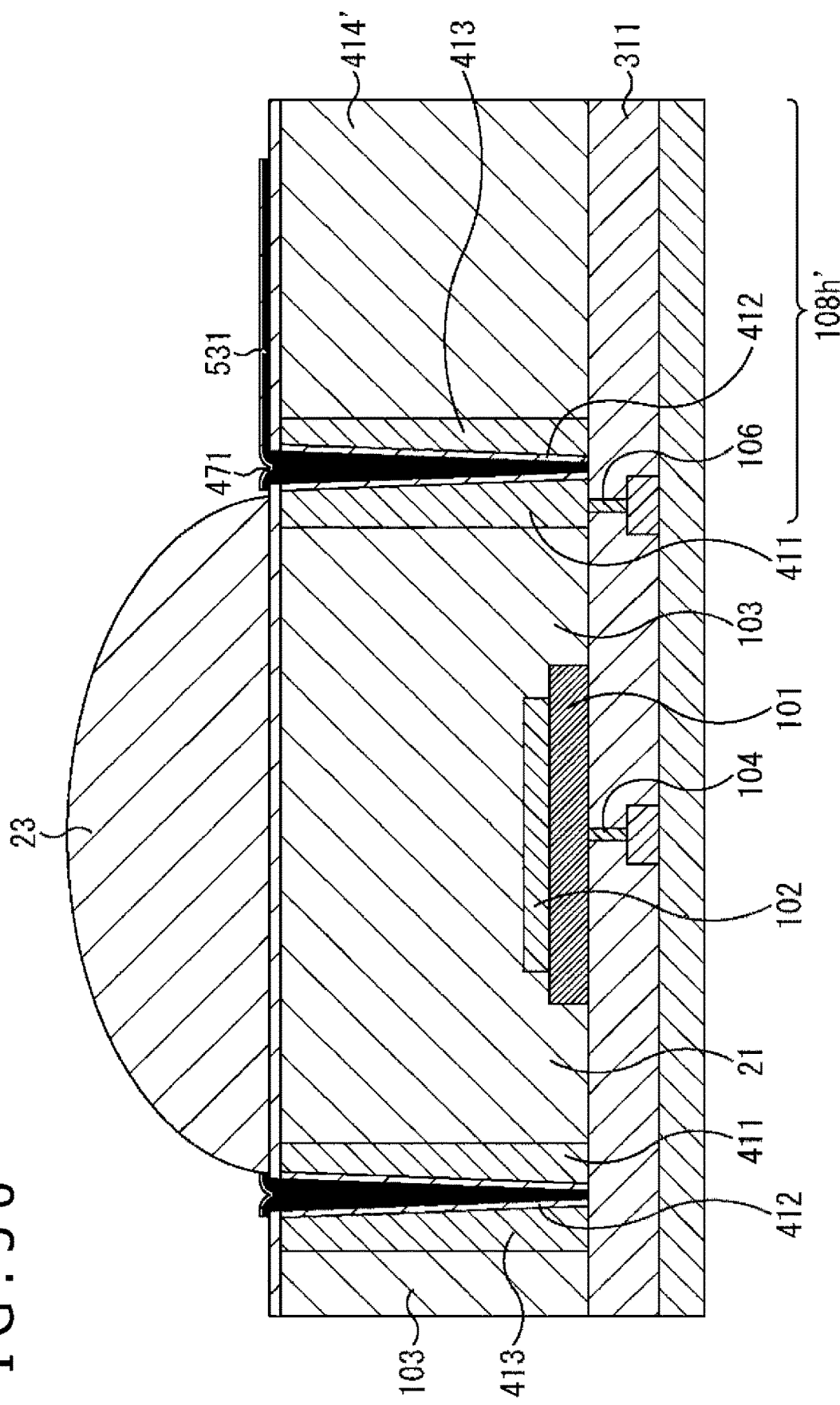
FIG. 50 is a sectional view of another configuration of an isolation region.

A configuration can also be adopted in which the trench 412 is formed with the light-shielding wall 471, and the voltage is not impressed on the light-shielding wall 471. FIG. 50 is a figure illustrating a configuration of the isolation region 108h in the case in which no voltage is impressed on the light-shielding wall 471. An isolation region 108h' depicted in FIG. 50 is similar in configuration to the isolation region 108h depicted in FIG. 49, except that the contact 532 is eliminated from the isolation region 108h depicted in FIG. 49.

The light-shielding wall 471 in the isolation region 108h' depicted in FIG. 50 functions as a light-shielding wall for preventing (or alternatively, mitigating) influences of stray light coming from the neighboring APDs 21.

In this way, a configuration in which a voltage is impressed on the light-shielding wall 471 is possible, and, also, a configuration in which no voltage is impressed on the light-shielding wall 471 is possible. In the case in which no voltage is impressed on the light-shielding wall 471, an effect of shielding stray light coming from the neighboring APDs 21 can be obtained. In the case in which a voltage is impressed on the light-shielding wall 471, an effect such that pinning can be secured can further be obtained.

Thus, in the first to eighth embodiments of the isolation region obtained by application of the present technology, a voltage can be impressed on a desired part, for example, the trench 412 (FIG. 37), even if a physical through electrode is not formed.

For instance, referring again to FIG. 37, at the time of impressing a voltage on the light-shielding film 402, application of the voltage on the contact 417 results in that the voltage is impressed on the light-shielding film 402 through the p-type semiconductor region 415. In this case, a configuration in which the voltage is impressed on the light-shielding film 402 can be realized by forming a through electrode in the p-type semiconductor region 415 and connecting the contact 417 and the light-shielding film 402 to each other. In the present embodiment, however, a configuration in which the voltage is impressed on the light-shielding film 402 can be realized even though a through electrode is not formed, as above-mentioned.

In addition, in the case in which the light-shielding film 402 is formed and a voltage is impressed on the light-shielding film 402 so as thereby to secure pinning, it is unnecessary for a current to flow in the light-shielding film 402 or the trench 412. In other words, a configuration in which pinning in the vicinity of the light-shielding film 402 can be secured even without a configuration in which a current flows from the light-shielding film 402 into the trench 412 through the planarizing film 401.

For this reason, it is unnecessary to secure ohmic contact at the connection portion between the light-shielding film 402 and the trench 412, so that manufacturing steps can be simplified.

Configuration of Peripheral Region

A configuration of the peripheral region A2 formed between the pixel region A1 (FIG. 35) and the pad region A3 will be described below.

A comparatively high voltage is constantly impressed on the APDs 21. In other words, a comparatively high voltage is constantly impressed on the pixel region A1. On the other hand, in the peripheral region A2 outside of the pixel region A1, it is necessary to suppress a voltage to GND (keep a reference voltage). For this reason, it is necessary to secure an isolating property between the pixels and the peripheral region and reliability thereof, against application of a high voltage.

For instance, a high voltage impressed on the pixel region A1 may generate a high-electric-field region in the isolation region, whereby breakdown may be generated. Therefore, a configuration in which such a breakdown would not be generated should be provided.

In view of this, as will be described below, a trench is formed in the peripheral region A2 to thereby secure an isolating property between pixels and the peripheral region and reliability thereof.

First Embodiment of Peripheral Region

Figure 51:
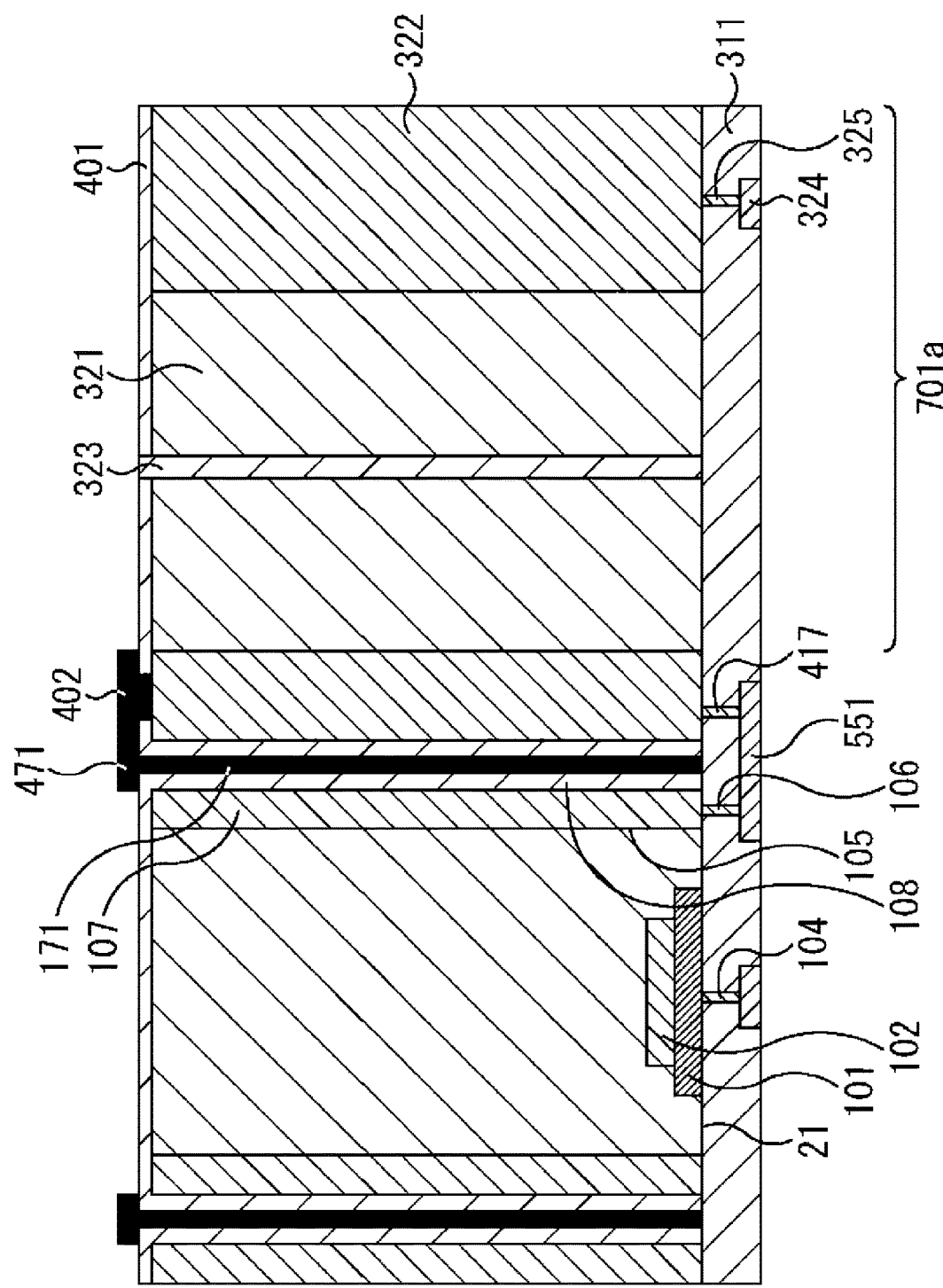
FIG. 51 is a sectional view of a configuration of a peripheral region.

FIG. 51 is a figure illustrating a configuration of a peripheral region in a first embodiment of the peripheral region.

FIG. 51 depicts an APD 21 and a peripheral region 701a. As the APD 21, one of the APDs 21a to 21m in the first to twelfth embodiments can be applied. In addition, as an isolation region 108 between the APD 21 and the peripheral region 701a, one of the isolation regions 108a to 108h in the first to eighth embodiments of the isolation region can be applied.

The peripheral region 701a depicted in FIG. 51 includes an n-type semiconductor region 321 and a p-type semiconductor region 322. The n-type semiconductor region 321 is formed therein with a trench 323. A contact 325 is connected to the p-type semiconductor region 322.

A reference voltage is impressed on the contact 325 connected to the p-type semiconductor region 322 (the contact 325 is kept at GND), and the p-type semiconductor region 322 is also maintained at the reference voltage.

The trench 323 formed in the n-type semiconductor region 321 is formed to penetrate from the light incidence surface side to the side of a wiring layer 311. Inside the trench 323 is formed an insulating film such as an oxide film or a nitride film (the inside is filled with a material capable of forming such an insulating film). While an example in which the position of the trench 323 is substantially central to the n-type semiconductor region 321 is depicted in FIG. 51, the trench 323 may be formed in a position other than the central position.

Figure 52:
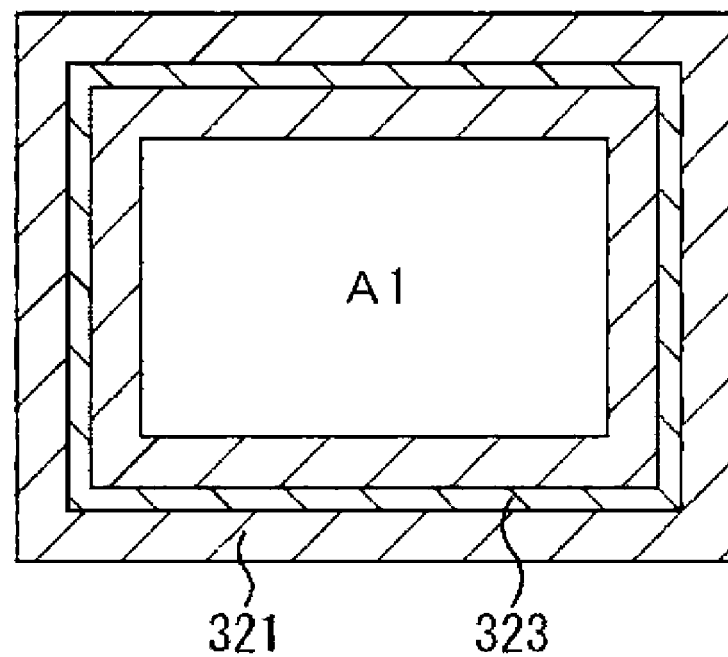
FIG. 52 is a plan view for explaining a shape of a trench in the configuration of the peripheral region.

FIG. 52 is a plan view, as viewed from the light incidence surface side, of a sensor chip 310 in which one trench 323 is formed in the n-type semiconductor region 321 as depicted in FIG. 51. The pixel region A1 is disposed in a central portion of the sensor chip 310, and the peripheral region A2 is formed around the pixel region A1. In this case, the peripheral region A2 is the peripheral region 701a.

The trench 323 is formed in the peripheral region 701a, and the trench 323 is also disposed continuously around the pixel region A1. In the example depicted in FIG. 52, a case in which the trench 323 is formed in a tetragonal shape is illustrated.

The shape of the trench 323 is not limited to a tetragonal shape; as depicted in FIG. 53A, the shape may be a shape as if obtained by cutting off angular portions (corner portions) of a tetragonal shape, with a circumference having a series of obtuse angles. Further, as depicted in FIG. 53B, the shape may be a shape obtained by changing the angular portions of a tetragon into arcuate shapes so that the shape has no angular portion.

With the trench 323 set in a shape free of acute angle portions, as depicted in FIGS. 53A and 53B, the trench 323 can be formed in a state in which its line width is maintained at a constant line width, whereby a filling-up property and an insulating property at corner portions can be enhanced.

By thus forming the trench 323 in the peripheral region 701a, in other words, by forming an insulating film in the peripheral region 701a such as to surround the pixel region A1, an isolating property between the pixels and the peripheral region and reliability thereof can be secured.

Figure 54:
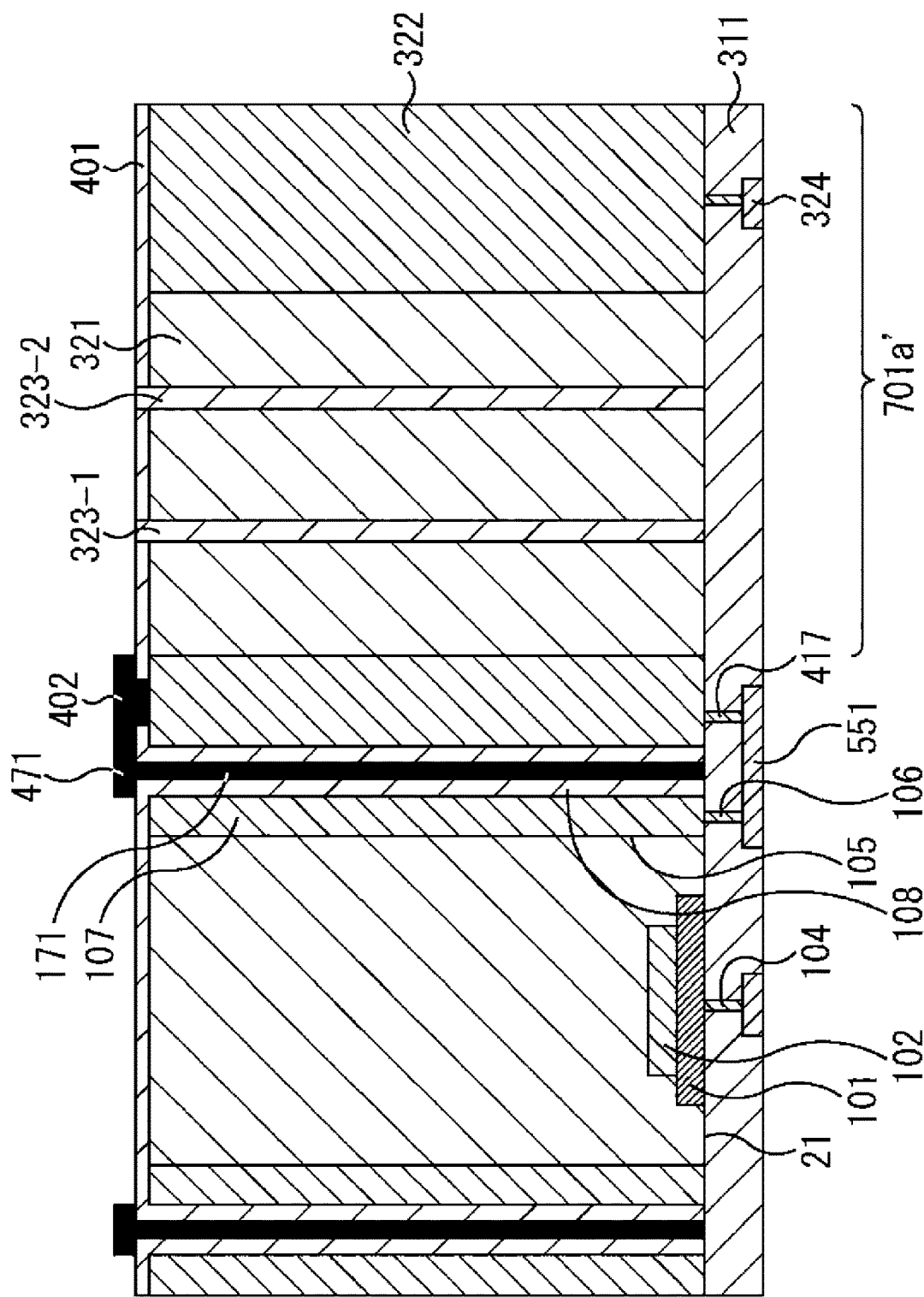
FIG. 54 is a sectional view of another configuration of a peripheral region.

Further, by providing two trenches 323, as depicted in FIG. 54, the insulating property between the pixels and the peripheral region and reliability thereof can be secured more assuredly. Two trenches 323-1 and 323-2 are formed in the n-type semiconductor region 321 in a peripheral region 701a' depicted in FIG. 54.

The number of the trenches 323 thus provided in the peripheral region 701 is not limited to two, and it is sufficient that the number is at least one. Further, though not depicted, three or more trenches 323 may be formed. With the number of the trenches 323 increased, the isolating property between the pixels and the peripheral region and reliability thereof can be secured more assuredly.

Figure 55:
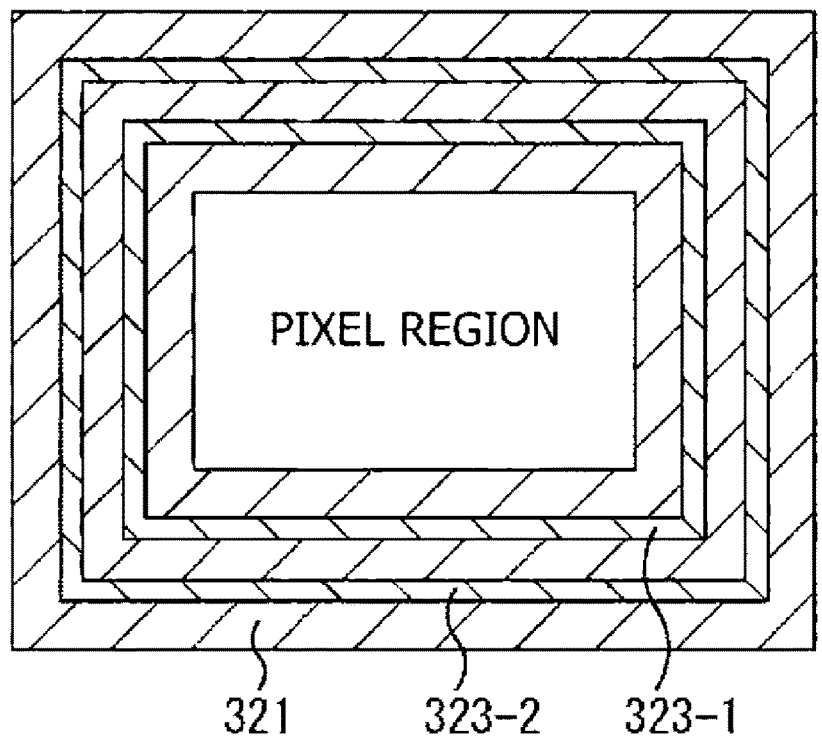
FIG. 55 is a plan view for explaining a shape of a trench in the configuration of the peripheral region.

FIG. 55 is a plan view, as viewed from the light incidence surface side, of a sensor chip 310 in which the two trenches 323-1 and 323-2 are formed in the n-type semiconductor region 321 as depicted in FIG. 54. The peripheral region A2

(peripheral region 701a') is formed around the pixel region A1 disposed in a central portion of the sensor chip 310.

The trench 323-1 is formed in the peripheral region 701a' on the side nearer to the pixel region A1, and the trench 323-2 is formed in the peripheral region 701a' on the side farther from the pixel region A1. The trenches 323-1 and 323-2 are each formed continuously around the pixel region A1.

While a case in which the trenches 323-1 and 323-2 are formed in a tetragonal shape is illustrated in the example depicted in FIG. 55, the shape may be a shape in which corner portions are formed in an obtuse angle shape or an arcuate shape, like the trenches 323 depicted in FIG. 53A.

In the case in which a plurality of trenches 323 are formed in the n-type semiconductor region 321, the materials placed to fill the plurality of trenches 323 (the materials of insulating films formed in the trenches 323) may be the same material or may be different materials.

Second Embodiment of Peripheral Region

A peripheral region 701 in a second embodiment of the peripheral region will be described referring to FIG. 56. Note that in the following description, a case in which two trenches 323 are formed will be taken as an example.

Figure 56:
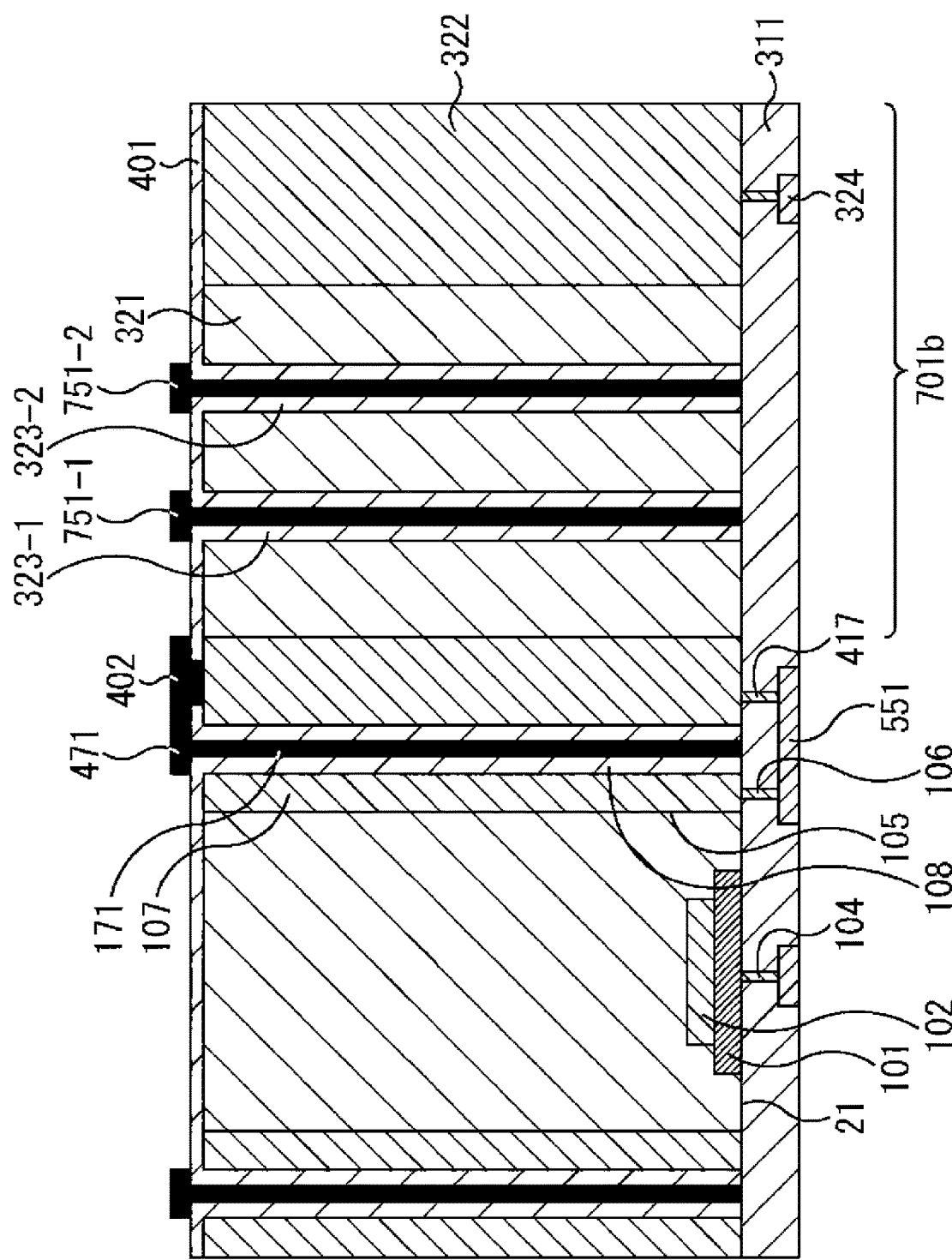
FIG. 56 is a sectional view of another configuration of a peripheral region.

In a peripheral region 701b illustrated in FIG. 56, two trenches, namely, a trench 323-1 and a trench 323-2 are formed. In the trenches 323-1 and 323-2, insulating films are formed, and light-shielding walls 751-1 and 751-2 including a metal or a conductive material are also formed.

While the light-shielding walls 751 are provided for insulation between the pixel region A1 and the peripheral region A2 and are not walls provided for the purpose of shielding light, they can include a material similar to that of the above-mentioned light-shielding wall 472 (FIG. 43) and can be produced by a similar production step; for this reason, they are referred to as light-shielding walls here. In addition, while the light-shielding walls 751 are provided for the purpose of insulation, as a result of the provision of the light-shielding walls 751, influences of stray light coming from the peripheral region A2 to the pixel region A1 can be reduced, so that a light-shielding effect can also be obtained.

The light-shielding walls 751 include, for example, a metallic material such as Ti (titanium), TiN (titanium nitride), Ta (tantalum), TaN (tantalum nitride), W (tungsten), WN (tungsten nitride), Al (aluminum), Cu (copper), etc. or such a material as polysilicon.

In addition, a contact part between the light-shielding wall 751 and the n-type semiconductor region 321 is insulated by $SiO_2$ (silicon dioxide) or SiN (silicon nitride). In other words, of the trench 323, a central portion includes the light-shielding wall 751, and the insulating film is formed thereabout.

With not only the insulating films but also the light-shielding walls 751 thus formed, the insulating property between the pixels and the peripheral region and reliability thereof can be secured more assuredly.

Third Embodiment of Peripheral Region

A peripheral region 701 in a third embodiment of the peripheral region will be described referring to FIG. 57.

Figure 57:
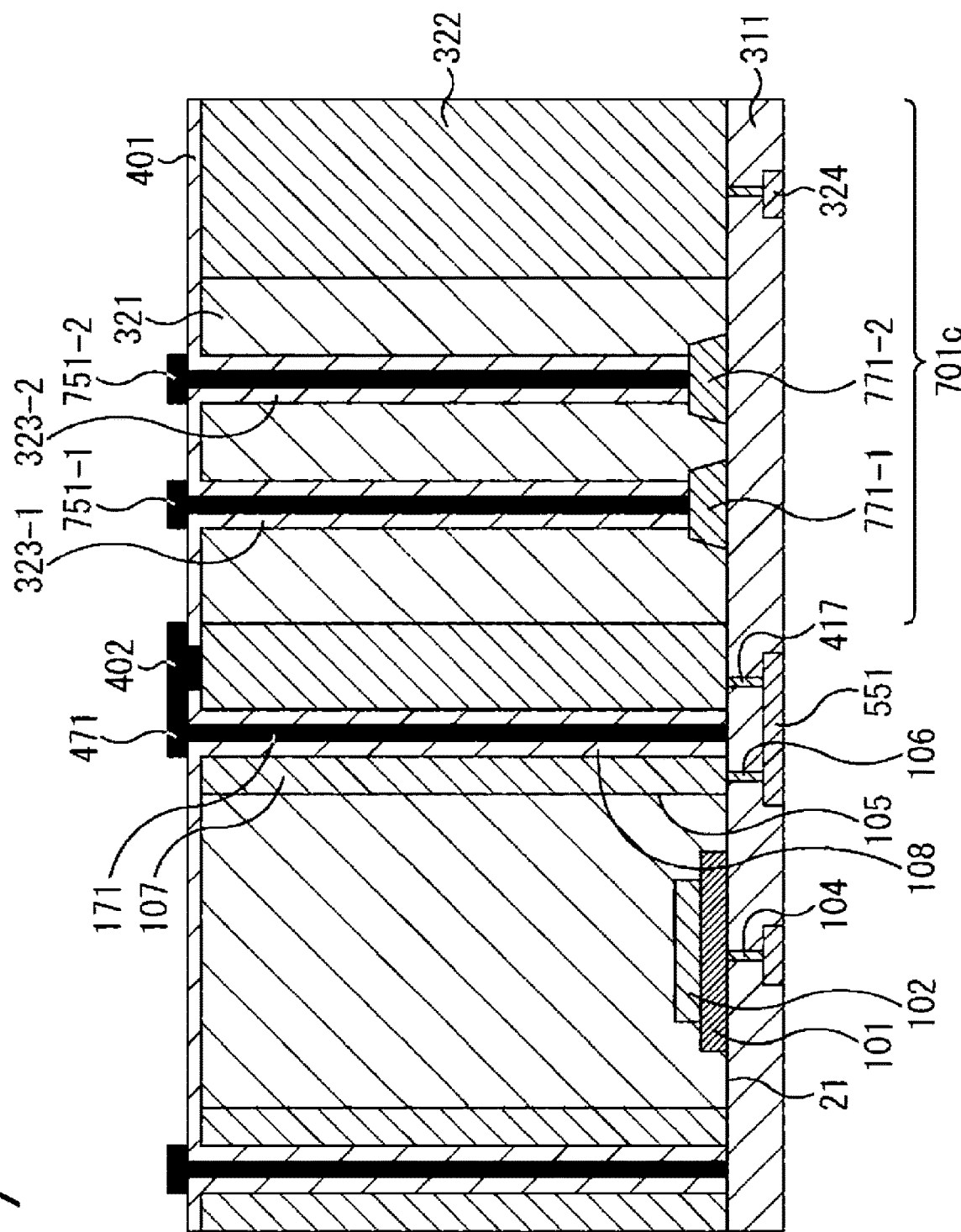
FIG. 57 is a sectional view of another configuration of a peripheral region.

A peripheral region 701c depicted in FIG. 57 differs from the peripheral region 701b depicted in FIG. 56 in that STIs (Shallow Trench Isolations) 771 are added.

An STI 771-1 is formed on the wiring layer 311 side of a trench 323-1 (light-shielding wall 751-1), and an STI 771-2 is formed on the wiring layer 311 side of a trench 323-2 (light-shielding wall 751-2). While the STI 771 is a technique at the time of forming an element isolation region, here it is used as a stopper at the time of forming the trench 323.

In the case of forming the trench 323 by boring from the light incidence surface side, the STI 771 is formed on the side which is on the wiring layer 311 side of the n-type semiconductor region 321, after which boring is conducted using the thus formed STI 771 as a stopper at the time of boring. After the boring, formation of an insulating film and formation of the light-shielding wall 751 are performed.

Thus, a configuration can be adopted in which the STIs 771 are formed in the peripheral region 701c, and, by using the STIs 771 as a stopper at the time of forming the trenches 323, the trenches 323 and the light-shielding walls 751 are formed.

In the case of this configuration, also, the isolating property between pixels and the peripheral region and reliability thereof can be secured more assuredly, like in the above-mentioned embodiments.

Fourth Embodiment of Peripheral Region

A peripheral region 701 in a fourth embodiment of the peripheral region will be described referring to FIG. 58.

Figure 58:
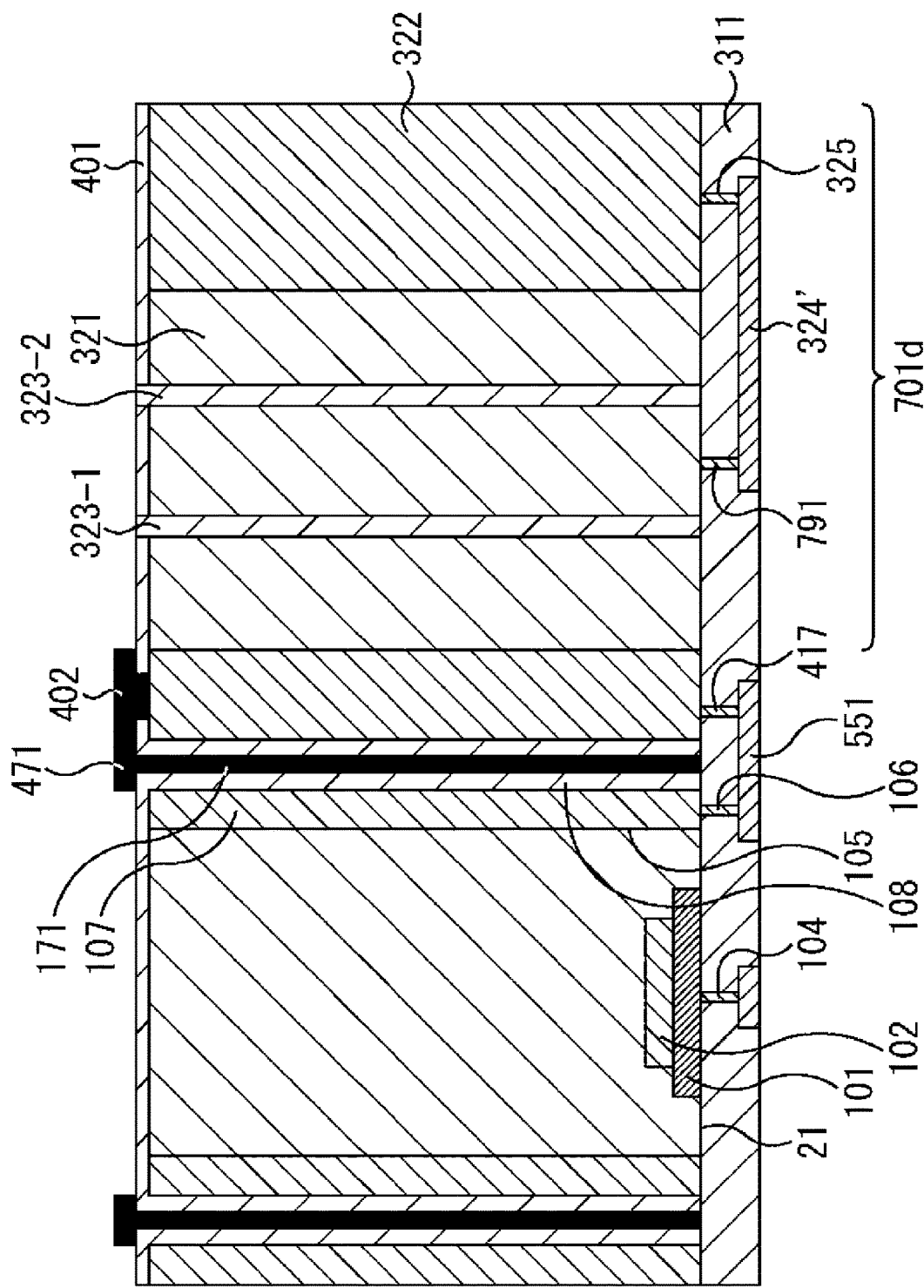
FIG. 58 is a sectional view of another configuration of a peripheral region.

A peripheral region 701d depicted in FIG. 58 differs from the peripheral region 701a' depicted in FIG. 54 in that a wiring 324' obtained by extending the wiring 324 is provided, and a contact 791 is added.

In the case in which a plurality of trenches 323 are formed, floating may occur between the trenches 323. For preventing (or alternatively, mitigating) a floating state from occurring between the trenches 323, such a configuration as the peripheral region 701d depicted in FIG. 58 is provided.

Referring to FIG. 58, a contact 791 is formed on an n-type semiconductor region 321 located between a trench 323-1 and a trench 323-2. The contact 791 is connected to a wiring 324'. The wiring 324' is connected also to a contact 325 which is connected to a p-type semiconductor region 322.

In such a configuration, the n-type semiconductor region 321 located between the trench 323-1 and the trench 323-2 and the p-type semiconductor region 322 are connected to each other through the wiring 324'.

Since a reference voltage is impressed on the wiring 324', the n-type semiconductor region 321 and the p-type semiconductor region 322 are at the same voltage, for example, 0 volt. The configuration in which the potential of the n-type semiconductor region 321 is fixed in this way makes it possible to prevent (or alternatively, mitigate) a floating state from occurring between the trench 323-1 and the trench 323-2.

Fifth Embodiment of Peripheral Region

A peripheral region 701 in a fifth embodiment of the peripheral region will be described referring to FIG. 59.

Figure 59:
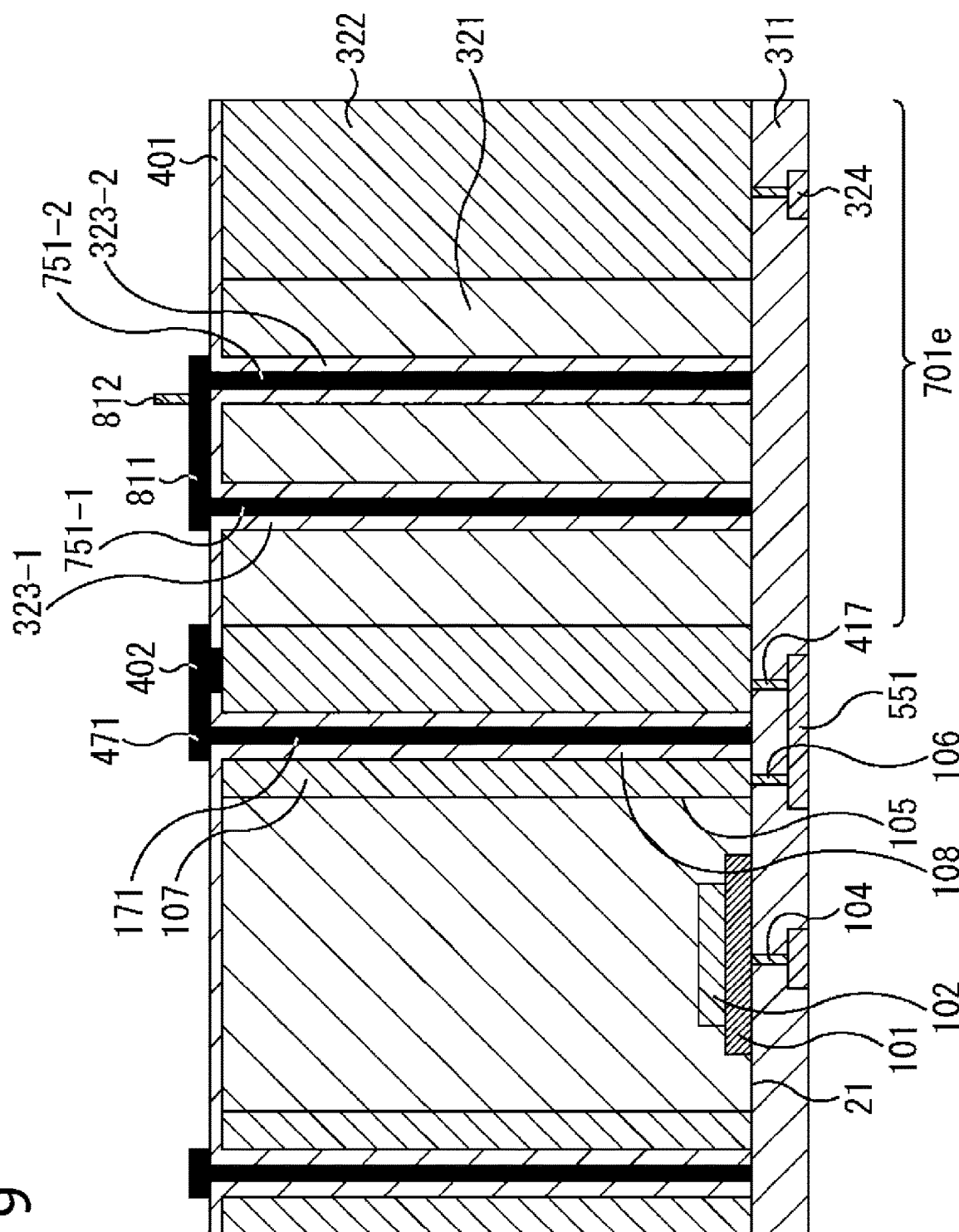
FIG. 59 is a sectional view of another configuration of a peripheral region.

A peripheral region 701e depicted in FIG. 59 has a configuration in which light-shielding walls 751 are formed in trenches 323, like the peripheral region 701b depicted in FIG. 56. The light-shielding walls 751 are formed using a conductive material, and a voltage is impressed thereon. A light-shielding wall 751-1 and a light-shielding wall 751-2 are connected to a wiring 811. A contact 812 is connected to the wiring 811, and the contact 812 is connected to a circuit for impressing a voltage which is not illustrated.

When a voltage at a predetermined voltage value is impressed on the contact 812, the voltage at the predetermined voltage value is impressed also on the wiring 811, the light-shielding wall 751-1 and the light-shielding wall 751-2 which are connected to the contact 812.

Here, for example, let the voltage value of a voltage impressed on an anode 105 of an APD 21 be a voltage value A, and let the voltage value of a voltage impressed on a p-type semiconductor region 322 be a voltage value B, then the voltage value C of a voltage impressed on the light-shielding walls 751 is set in a relation of voltage value A>voltage value C>voltage value B.

With such a voltage impressed, a state in which voltage is not abruptly varied but is varied gradually can be produced in the peripheral region 701e.

Note that, while a configuration in which the same voltage is impressed on the light-shielding wall 751-1 and the light-shielding wall 751-2 has been taken as an example in describing the example depicted in FIG. 59, a configuration can be adopted in which voltages at different voltage values are individually impressed.

For example, let the voltage value of a voltage impressed on the light-shielding wall 751-1 be a voltage value C-1, and let the voltage value of a voltage impressed on the light-shielding wall 751-2 be a voltage value C-2, then voltages such that voltage value A>voltage value C-1>voltage value C-2>voltage value B may be individually impressed on the light-shielding wall 751-1 and the light-shielding wall 751-2.

With such a configuration, it is possible to prevent (or alternatively, mitigate) a situation in which a high voltage impressed on the pixel region A1 might generate a high-electric-field region in the isolation region, bringing about breakdown, and to secure an isolating property between pixels and the peripheral region and reliability thereof, against application of a high voltage.

Sixth Embodiment of Peripheral Region

A peripheral region 701 in a sixth embodiment of the peripheral region will be described referring to FIG. 60.

Figure 60:
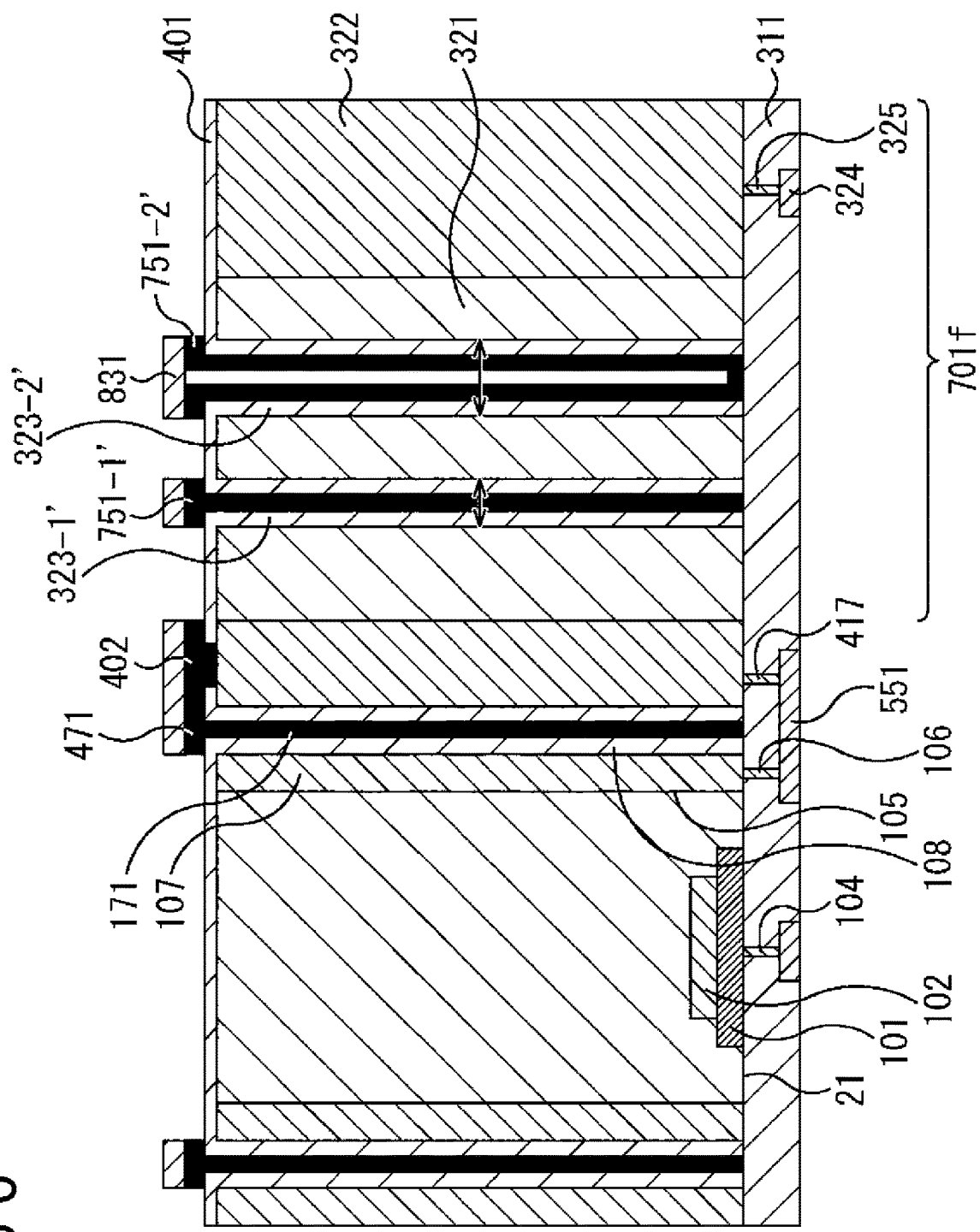
FIG. 60 is a sectional view of another configuration of a peripheral region.

A peripheral region 701f depicted in FIG. 60 differs from the peripheral regions 701a' to 701e in the first to fifth embodiments of the peripheral region described above in that trenches 323 of different sizes are formed.

Two trenches, namely, a trench 323-1' and a trench 323-2' are formed in the peripheral region 701f in the sixth embodiment of the peripheral region illustrated in FIG. 60. The trench 323-1' is formed to be smaller in line width than the trench 323-2'.

Note that a case in which the trench 323-1' is smaller than the trench 323-2' in line width is depicted in FIG. 60, but the trench 323-1' may be formed to be greater than the trench 323-2' in line width.

In addition, though not illustrated here, in the case in which three or more trenches 323 are formed, the trenches 323 may be formed to be different in line width.

Figure 61:
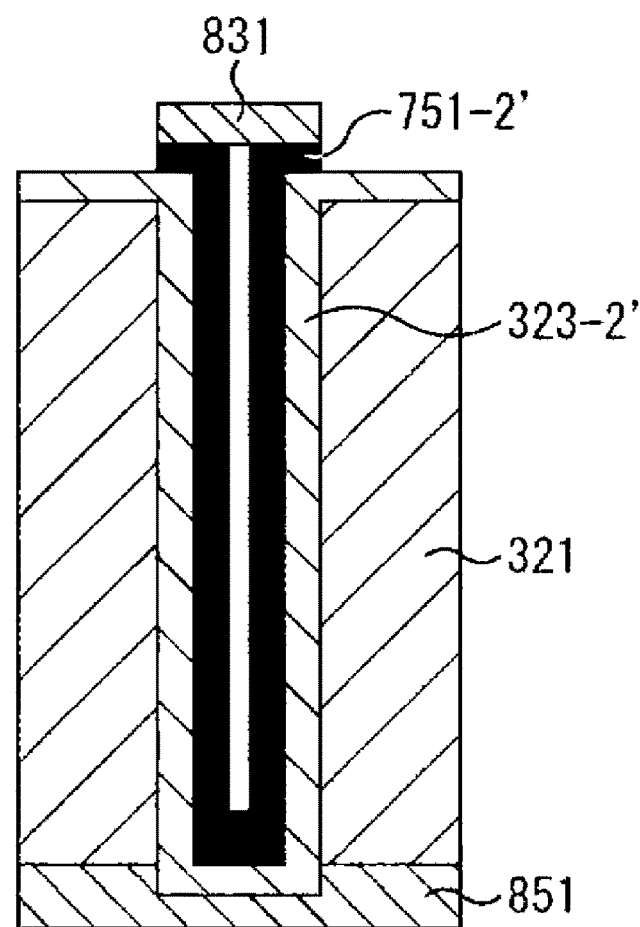
FIG. 61 is a figure for explaining a shape of a trench.

FIG. 61 depicts a figure in which the part of the trench 323-2' is depicted in an enlarged form. In the case in which the line width of the trench 323-2' is increased, the inside of the trench 323-2' may not be completely filled up with an insulating film and/or a light-shielding wall 751-2' formed in the trench 323-2'.

In the case in which the light-shielding wall 751-2' is formed in the trench 323-2', as exemplified in FIG. 61, the inside of the trench 323-2' may not be completely filled up with the material of the light-shielding wall 751-2', and a gap may be formed. Even in the case in which such a gap is formed, a configuration can be obtained in which an insulating film 831 is formed to form a lid on the gap.

For instance, after the trench 323-2' (light-shielding wall 751-2') is formed, the insulating film 831 can be formed by plasma CVD, sputtering or the like. As depicted in FIG. 60, the insulating film 831 is formed also on a light-shielding film 402 and on an insulating wall 751-1' (trench 323-1').

The formation of the insulating film 831 in this way ensures that even if a gap is formed in a part, a configuration in which the part is covered with the insulating film 831 can be obtained. Therefore, it is possible to realize a product (in this case, a sensor chip 310) which is resistant to variability of products and is high in yield.

Note that at the time of production, a stopper 851 is formed at a lower portion of the trench 323-2', as depicted in FIG. 61. The stopper 851 includes SiN, for example. At the time of forming the trench 323, the stopper 851 is formed at a timing before boring, and then boring down to the stopper 851 is conducted. After the boring, the insulating film and/or the light-shielding wall is formed in the trench thus formed.

While the stopper 851 has not been illustrated in the aforementioned embodiments, it is formed as a layer between the wiring layer 311 and the trench 323 also in, for example, the sensor chip 310 depicted in FIG. 60. Note that a configuration in which the stopper 851 is not left in the sensor chip 310 can also be obtained, by such a treatment as polishing.

In the case in which the stopper 851 is formed on a surface opposite to the light incidence surface side (a surface on the wiring layer 311 side) as depicted in FIG. 61, the boring is conducted from the light incidence surface side (the upper side in the figure), to form the trench 323. In the case in which the trench 323 is formed by conducting the boring from the light incidence surface side, the shape of the trench 323 in detail is as illustrated in FIG. 62.

Figure 62:
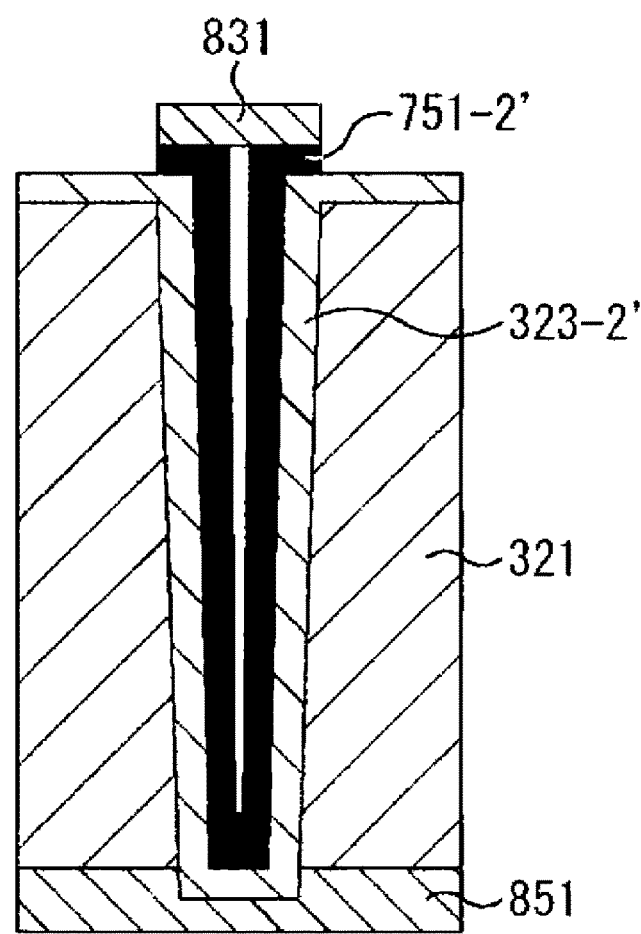
FIG. 62 is a figure for explaining a shape of a trench.

Like FIG. 61, FIG. 62 is a figure in which the part of the trench 323-2' is depicted in an enlarged form. The trench 323-2' depicted in FIG. 62 has a line width greater on the light incidence surface side (upper portion) than on the wiring layer 311 side (lower portion). Thus, the line width of the trench 323 is greater on the boring starting side and smaller on the boring ending side.

When observing the trench 323 formed in a sensor chip 310 and comparing the line width at an upper portion of the trench 323 and the line width at a lower portion of the trench 323, the side of a larger line width is the boring starting side, and the side of a smaller line width is the boring ending side. This can be made to be a criterion in determining the boring starting side at the time of production of a sensor chip 310, based on the trench of the finished sensor chip 310.

With the trench 323 formed by conducting boring from the light incidence side, controllability of film thickness of a Si film at the time of production can be enhanced, and variability of pixel characteristics such as PDE and jitter can be suppressed.

Seventh Embodiment of Peripheral Region

A peripheral region 701 in a seventh embodiment of the peripheral region will be described referring to FIG. 63.

Figure 63:
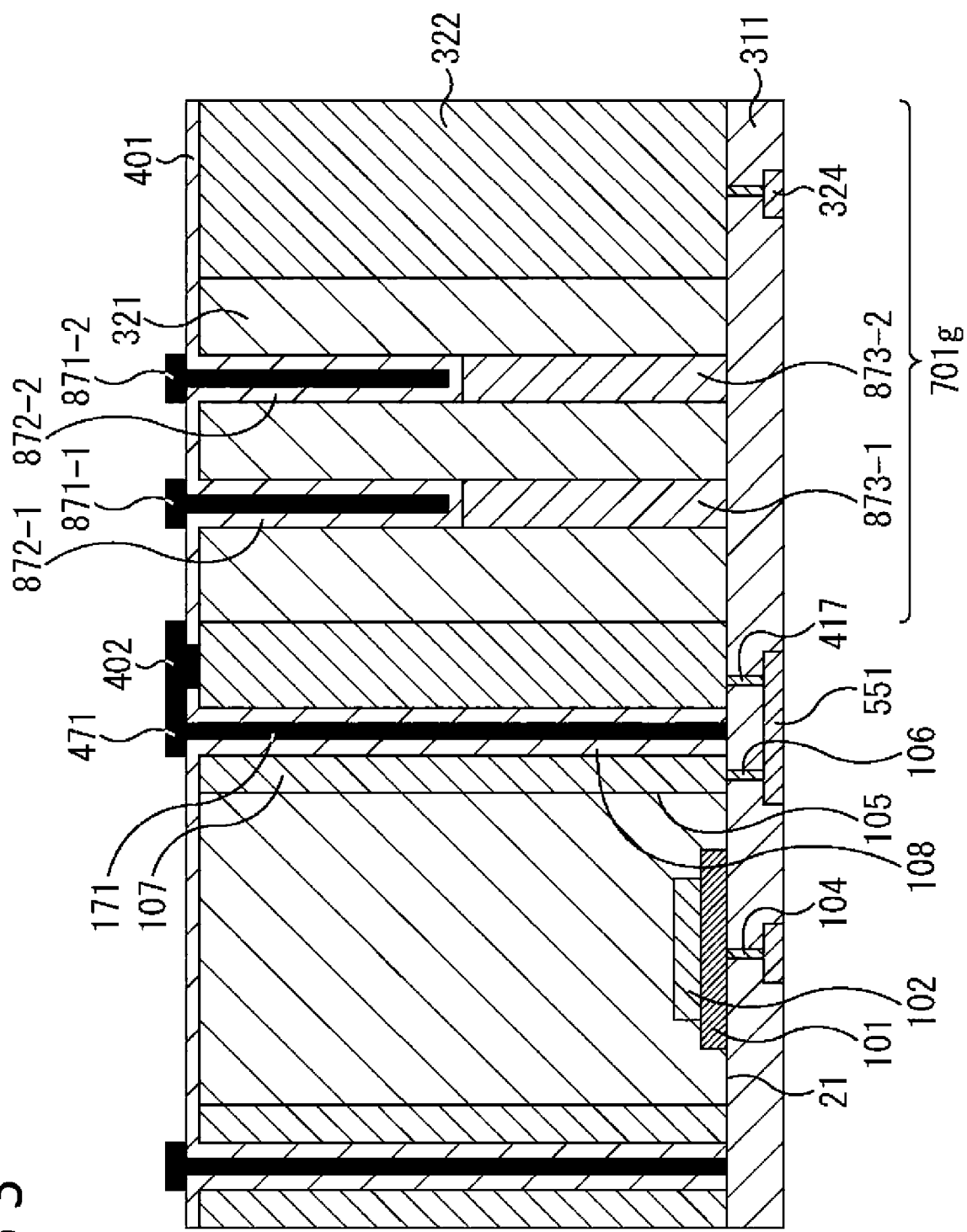
FIG. 63 is a sectional view of another configuration of a peripheral region.

A peripheral region 701g depicted in FIG. 63 is different compared to the first to sixth embodiments of the peripheral region in that the trench is formed by conducting boring in a downward direction (from an upper side) and in an upward direction (from a lower side) in regard of the substrate. The first to sixth embodiments of the peripheral region have been described without any particular limitation on the boring direction at the time of producing the trench 323.

In the first to sixth embodiments of the peripheral region, the trench may be formed by conducting boring from the light incidence surface side, or the trench may be formed by conducting boring from the side of a surface connected to the wiring layer 311.

In the peripheral region 701g depicted in FIG. 63, trenches 872-1 and 872-2 are formed by performing boring from the light incidence surface side, whereas trenches 873-1 and 873-2 are formed by conducting boring from the surface on the side opposite to the light incidence surface. Thus, penetrating trenches can also be formed by conducting boring in the downward direction (from the upper side) and in the upward direction (from the lower side).

With the penetrating trenches thus formed by conducting boring in the downward direction (from the upper side) and in the upward direction (from the lower side), the penetrating trenches can be formed even in the case in which, for example, the sensor chip 310 (exclusive of the wiring layer 311) has a large-thickness structure.

In addition, in the case in which the trenches are formed by conducting boring in different directions, the trenches can be filled up with different materials, to form trenches with different properties. For instance, in the example illustrated in FIG. 63, a light-shielding wall 871-1 (871-2) is formed in the trench 872-1 (872-2), whereas the trench 873-1 (873-2) is filled up with an insulating material.

Note that the trenches 872 and the trenches 873 can be filled up, or the light-shielding wall can be formed therein, by using the same material.

By any of the first to seventh embodiments of the peripheral region, an isolating property between pixels and the peripheral region and reliability thereof can be secured, against application of a high voltage.

In addition, any of the first to seventh embodiments of the peripheral region and any of the first to eighth embodiments of the isolation region can be combined with each other.

For instance, in the case of a combination with the first embodiment of the isolation region depicted in FIG. 37, the trench 412 is formed also in the isolation region 108a. An influence of a dark current or white defect or the like arising from this trench 412 may be generated. The influence can be reduced by applying any of the first to seventh embodiments of the peripheral region.

In other words, by applying any of the first to seventh embodiments of the peripheral region, an insulating property between pixels and the peripheral region and reliability thereof can be secured, against application of a high voltage, and the influence of the trench provided in the isolation region can also be reduced, since the insulating property between the pixels and the peripheral region and reliability thereof are secured.

Application to Imaging Apparatus

The aforementioned APD 21 can be applied to a distance measuring device. Here, taking as an example a case in which the APD 21 is applied to a distance measuring device for measuring distance, an example of application of the APD 21 will be described.

Figure 64:
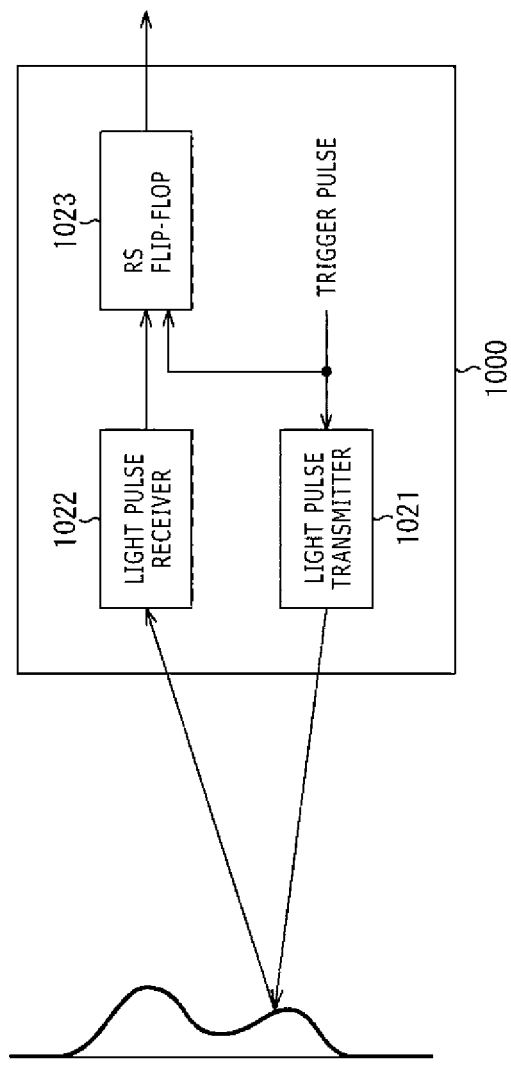
FIG. 64 is a figure illustrating a configuration of an imaging apparatus.

FIG. 64 is a figure illustrating a configuration of an embodiment of a distance measuring device to which the APD 21 according to the application of the present technology is applied. A distance measuring device 1000 depicted in FIG. 64 includes a light pulse transmitter 1021, a light pulse receiver 1022, and an RS flip-flop 1023.

A case of using a TOF (Time Of Flight) system as a method for measuring distance is taken as an example in the following description. The aforementioned APD 21 can be used as a TOF type sensor.

A TOF type sensor is a sensor for measuring the distance from itself to an object by measuring the time taken until light emitted from itself impinges on the object, is reflected on the object and returns to itself. The TOF type sensor operates, for example, at timings depicted in FIG. 65.

Figure 65:
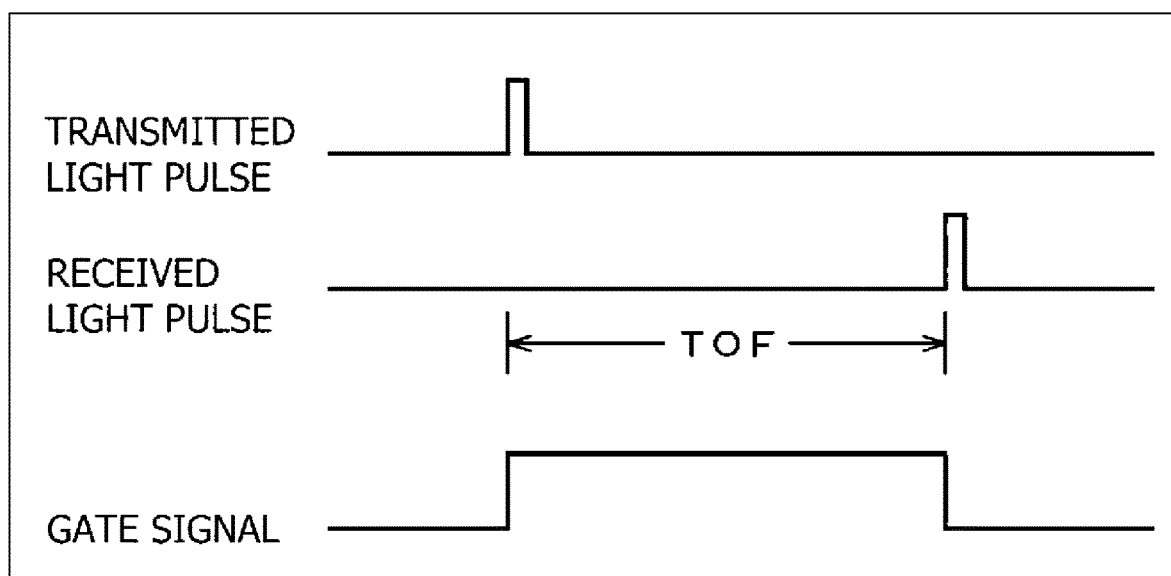
FIG. 65 is a figure for explaining a TOF.

Referring to FIG. 65, an operation of the distance measuring device 1000 will be described. The light pulse transmitter 1021 emits light (light transmission pulse), based on a trigger pulse supplied thereto. The light emitted impinges on an object, and is reflected as reflected light, which is received by the light pulse receiver 1022. The above-mentioned APD 21 can be used as the light pulse receiver 1022.

The difference between the time at which the transmitted light pulse is emitted and the time at which the received light pulse is received corresponds to the distance between the distance measuring device 1000 and the object, or the time of flight TOF.

The trigger pulse is supplied to the light pulse transmitter 1021, and is supplied also to the flip-flop 1023. With the trigger pulse supplied to the light pulse transmitter 1021, a short-time light pulse is transmitted and is supplied to the flip-flop 1023, whereby the flip-flop 1023 is reset.

In the case in which the APD 21 is used as the light pulse receiver 1022, a photon is generated when the received light pulse is received by the APD 21. By the photon (electrical pulse) thus generated, the flip-flop 1023 is reset.

By such an operation, a gate signal having a pulse width corresponding to the time of flight TOF can be produced. The gate signal thus produced is counted by use of a clock signal or the like, whereby the TOF can be calculated (outputted as a digital signal).

In the distance measuring device 1000, distance information is produced by the above-mentioned processing. The aforementioned APD 21 can be used for such a distance measuring device 1000.

Example of Application to Mobile Body

The technology according to the present disclosure (present technology) is applicable to various products. For example, the technology according to the present disclosure may be realized as a device to be mounted on a mobile body of any of such kinds as automobiles, electric vehicles, hybrid electric vehicles, motorcycles, bicycles, personal mobilities, airplanes, drones, ships, and robots.

Figure 66:
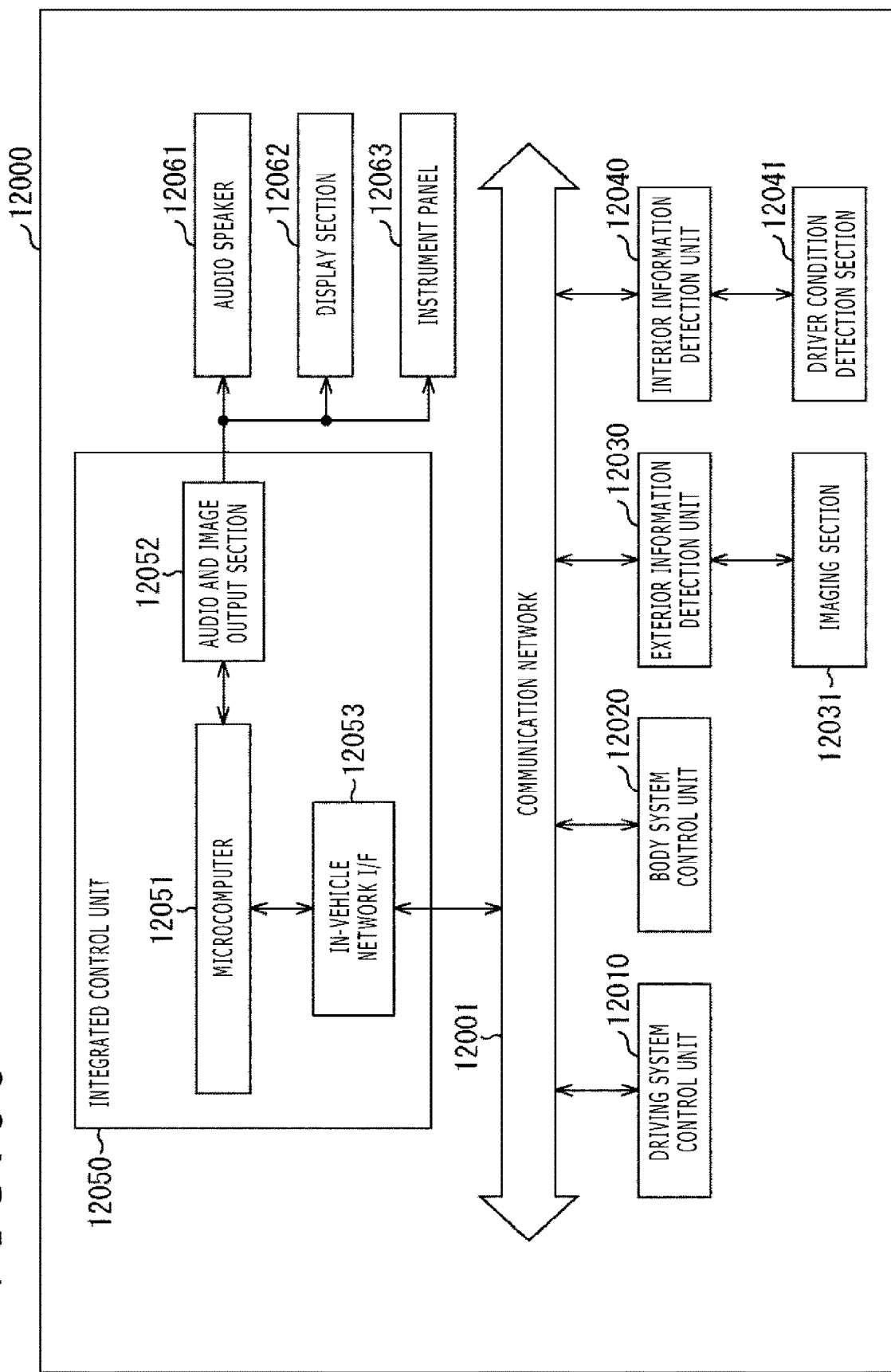
FIG. 66 is a block diagram depicting an example of general configuration of a vehicle control system.

FIG. 66 is a block diagram depicting a general configuration example of a vehicle control system, which is an example of mobile body control system to which the technology according to the present disclosure can be applied.

A vehicle control system 12000 includes a plurality of electronic control units interconnected through a communication network 12001. In the example depicted in FIG. 66, the vehicle control system 12000 includes a driving system control unit 12010, a body system control unit 12020, an exterior information detection unit 12030, an interior information detection unit 12040, and an integrated control unit 12050. In addition, as functional components of the integrated control unit 12050, there are depicted a microcomputer 12051, an audio and image output section 12052, and an in-vehicle network I/F (interface) 12053.

The driving system control unit 12010 controls operations of devices concerned to a driving system of the vehicle, according to various programs. For instance, the driving system control unit 12010 functions as a controller for a driving force generating device that generates a driving force of the vehicle, such as an internal combustion engine or a driving motor, a driving force transmission mechanism for transmitting the driving force to a wheel or wheels, a steering mechanism for regulating a steering angle of the vehicle, and a brake device for generating a braking force of the vehicle.

The body system control unit 12020 controls operations of each of devices provided on a vehicle body, according to various programs. For example, the body system control unit 12020 functions as a controller for a keyless entry system, a smart key system, a power window device, or various lamps such as headlamp, tail lamp, brake lamp, turn signal lamps or fog lamp. In this case, electric waves emitted from a mobile device representing a key or signals from various switches may be inputted to the body system control unit 12020. The body system control unit 12020 accepts these inputs of electric waves or signals, and controls a door lock device, the power window device, the lamps and the like of the vehicle.

The exterior information detection unit 12030 detects information in the exterior of the vehicle on which the vehicle control system 12000 is mounted. For instance, an imaging section 12031 is connected to the exterior information detection unit 12030. The exterior information detection unit 12030 causes the imaging section 12031 to pick up an image of the vehicle exterior, and receives the picked-up image. The exterior information detection unit 12030 may perform object detection processing or distance measurement processing in regard of humans, vehicles, obstacles, signs, characters on the road surface, etc., based on the received image.

The imaging section 12031 is an optical sensor that receives light and outputs an electrical signal according to the amount of light received. The imaging section 12031 can output the electrical signal as an image, or can output the electrical signal as information regarding distance measurement. In addition, the light received by the imaging section 12031 may be visible light, or invisible light such as infrared rays.

The interior information detection unit 12040 detects information in the vehicle interior. The interior information detection unit 12040 is connected, for example, with a driver condition detection section 12041 for detecting the condition of a driver. The driver condition detection section 12041 includes, for example, a camera for imaging the driver, and the interior information detection unit 12040 may calculate the degree of fatigue or the degree of concentration of the driver, and may determine whether or not the driver is dozing in a sitting position based on the detected information inputted from the driver condition detection section 12041.

The microcomputer 12051 can calculate control setpoints for the driving force generating device, the steering mechanism or the brake device, based on exterior or interior information acquired by the exterior information detection unit 12030 or the interior information detection unit 12040, and can output control commands to the driving system control unit 12010. For instance, the microcomputer 12051 can perform cooperative control for the purpose of realizing the function of ADAS (Advanced Driver Assistance System) that includes vehicle collision avoidance or shock mitigation, following traveling based on inter-vehicle distance, vehicle speed maintaining running, vehicle collision alarm, lane departure alarm, etc.

In addition, the microcomputer 12051 controls the driving force generating device, the steering mechanism, the brake device or the like, based on the information regarding the surroundings of the vehicle acquired by the exterior information detection unit 12030 or the interior information detection unit 12040, whereby cooperative control aimed at automatic driving for autonomously traveling without depending on the driver's operation, or the like can be performed.

Besides, the microcomputer 12051 can output control commands to the body system control unit 12020, based on the exterior information acquired by the exterior information detection unit 12030. For instance, the microcomputer 12051 can perform cooperative control aimed at anti-glare such as switching from a high beam mode to a low beam mode, by controlling the headlamp according to the position of the leading vehicle or the oncoming vehicle that is detected by the exterior information detection unit 12030.

The audio and image output section 12052 emits at least one output signal of audio and image signals to an output device capable of giving audio or visual information to the rider on the vehicle or to the exterior of the vehicle. In the example depicted in FIG. 66, an audio speaker 12061, a display section 12062 and an instrument panel 12063 are depicted as examples of the output device. The display section 12062 may include at least one of an on-board display and a head-up display, for example.

Figure 67:
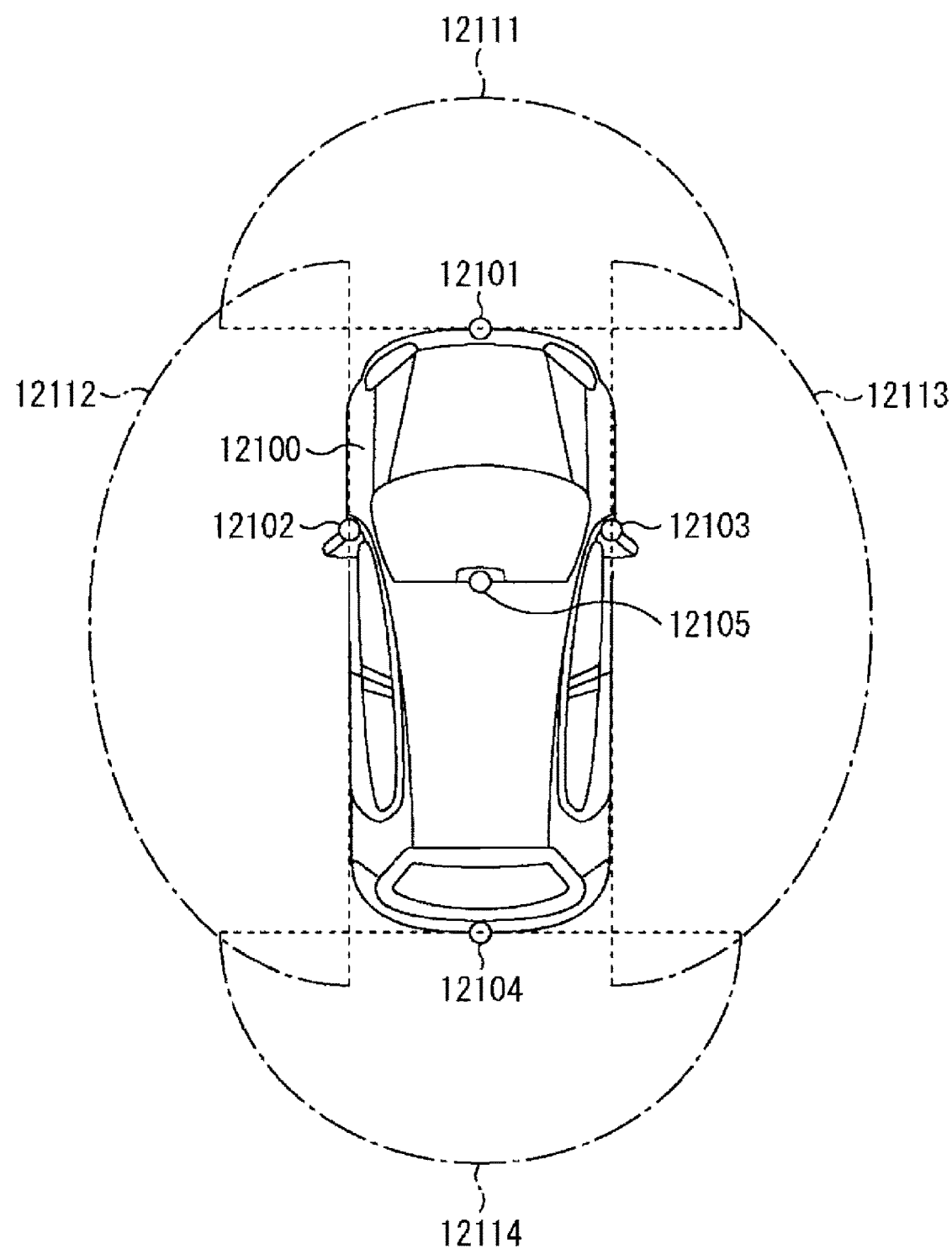
FIG. 67 illustrates an example of layout positions of exterior information detection units and imaging sections.

FIG. 67 depicts an example of layout position of the imaging section 12031.

In FIG. 67, imaging sections 12101, 12102, 12103, 12104, and 12105 are provided as the imaging section 12031.

The imaging sections 12101, 12102, 12103, 12104, and 12105 are provided, for example, at such positions as a front nose, side mirrors, a rear bumper, or a back door of the vehicle 12100, and an upper portion of a front glass in the vehicle compartment. The imaging section 12101 provided at the front nose and the imaging section 12105 provided at the upper portion of the front glass in the vehicle compartment acquire mainly an image of the front side of the vehicle 12100. The imaging sections 12102 and 12103 provided on the side mirrors acquire mainly images on the lateral sides of the vehicle 12100. The imaging section 12104 provided on the rear bumper or the back door acquires mainly an image of the rear side of the vehicle 12100. The imaging section 12105 provided at the upper portion of the front glass in the vehicle compartment is used primarily for detection of a leading vehicle, pedestrians, obstacles, signals, traffic signs, traffic lanes, etc.

Note that FIG. 67 depicts an example of imaging ranges of the imaging sections 12101 to 12104. An imaging range 12111 represents an imaging range of the imaging section 12101 provided at the front nose; imaging ranges 12112 and 12113 represent imaging ranges of the imaging sections 12102 and 12103 provided individually on the side mirrors; and an imaging range 12114 represents an imaging range of the imaging section 12104 provided on the rear bumper or the back door. For instance, where the image data picked up by the imaging sections 12101 to 12104 are superimposed, a bird's-eye view image as if obtained by viewing the vehicle 12100 from above is obtained.

At least one of the imaging sections 12101 to 12104 may have a function to acquire distance information. For instance, at least one of the imaging sections 12101 to 12104 may be a stereo camera including a plurality of imaging elements, or may be an imaging element having pixels for phase difference detection.

For example, the microcomputer 12051 may obtain the distance to each solid object within the imaging ranges 12111 to 12114 and time variation of this distance (relative velocity with reference to the vehicle 12100), based on the distance information acquired from the imaging sections 12101 to 12104. By this, particularly, a solid object which is on the traveling path of the vehicle 12100, is the nearest to the vehicle 12100 and is running at a predetermined speed (for example, not less than 0 km/h) in substantially the same direction as the vehicle 12100 can be extracted as the leading vehicle. Further, the microcomputer 12051 can set an inter-vehicle distance to be preliminarily secured between the vehicle 12100 and the leading vehicle, and can perform an automatic brake control (inclusive of a following stop control) or an automatic acceleration control (inclusive of a following start control). In this way, it is possible to perform cooperative control aimed at automatic driving for autonomously traveling without depending on the driver's operation.

For instance, the microcomputer 12051 can extract solid object data concerning solid objects while classifying them into two-wheel vehicles, ordinary-sized vehicles, heavy duty vehicles, pedestrians, electric poles, and other solid objects, based on the distance information obtained from the imaging sections 12101 to 12104, and can use the extracted solid object data for automatic avoidance of obstacles. For example, the microcomputer 12051 discriminates the obstacles in the surroundings of the vehicle 12100 into obstacles that can be visually recognized by the driver of the vehicle 12100 and obstacles that are difficult to visually recognize. Then, the microcomputer 12051 determines collision risk representing the degree of danger of collision with each obstacle. In a situation in which the collision risk is not less than a preset value and there is a possibility of collision, the microcomputer 12051 causes an alarm to be outputted to the driver through the audio speaker 12061 and/or the display section 12062, or causes forced deceleration or avoiding steering to be performed through the driving system control unit 12010, whereby driving assistance for avoiding collision can be performed.

At least one of the imaging sections 12101 to 12104 may be an infrared camera for detection of infrared rays. For example, the microcomputer 12051 can recognize a pedestrian by determining whether or not a pedestrian is present in the images picked up by the imaging sections 12101 to 12104. Such recognition of a pedestrian is conducted, for example, by a procedure of extracting characteristic points in the images picked up by the imaging sections 12101 to 12104 as infrared cameras, and a procedure of determining whether or not an object is a pedestrian by performing pattern matching processing on a series of characteristic points representing the profile of the object. When the microcomputer 12051 determines that a pedestrian is present in the images picked up by the imaging sections 12101 to 12104 and recognizes the pedestrian, the audio and image output section 12052 controls the display section 12062 such that a rectangular profile line for emphasis is superimposed on the recognized pedestrian. In addition, the audio and image output section 12052 may control the display section 12062 such that an icon or the like representing a pedestrian is displayed at a desired position.

Note that the effects described herein are merely exemplary and are not restrictive, and other effects may exist.

Note that embodiments of the present technology are not restricted to the above-described embodiments, and various modifications are possible without departing from the scope of the gist of the present technology.

Note that the present technology can take the following configurations.

(1)

A sensor, comprising:

a first substrate including at least a first pixel, the first pixel including:
  an avalanche photodiode to convert incident light into electric charge and including an anode and a cathode, wherein the cathode is in a well region of the first substrate;
  an isolation region that isolates the well region from at least a second pixel that is adjacent to the first pixel; and
  a hole accumulation region between the isolation region and the well region, wherein the hole accumulation region is electrically connected to the anode.

(2)

The sensor of (1), further comprising:

a lens on the first substrate to focus incident light toward the well region, wherein the hole accumulation region includes a portion between the lens and the well region.

(3)

The sensor of (2), further comprising:

a second substrate including:
  a first contact electrically connected to the anode;
  a second contact electrically connected to the cathode;
  a first wiring layer electrically connected to the first contact; and
  a second wiring layer electrically connected to the second contact.

(4)

The sensor of (3), further comprising:

a third substrate on the second substrate and electrically connected to the first wiring layer and the second wiring layer.

(5)

The sensor of (1), wherein the well region includes a first region of a first conductivity type, a second region of a second conductivity type and in contact with the first region, and a third region of the second conductivity type or the first conductivity type in contact with the hole accumulation region.

(6)

The sensor of (5), wherein if the third region is of the second conductivity type, the second region and the third region have different impurity concentrations of the second conductivity type, and wherein, if the third region is of the first conductivity type, the first region and the third region have different impurity concentrations of the first conductivity type.

(7)

The sensor of (6), wherein the first conductivity type is n-type and the second conductivity type is p-type.

(8)

The sensor of (6), wherein, in a plan view, the first region is surrounded by the third region, and the third region is surrounded by the anode, and the anode is surrounded by the isolation region.

(9)
The sensor of (2), further comprising:
an oxide film between the isolation region and the hole accumulation region, and between the hole accumulation region and the lens.

(10)
The sensor of (2), further comprising:
a conductive film between the isolation region and at least the second pixel.

(11)
The sensor of (2), further comprising:
a light shielding film on a same surface of the first substrate as the lens;
a first contact electrically connected to the light shielding film and configured to receive a bias voltage; and
a second contact electrically connected to the isolation region and configured to receive the bias voltage.

(12)
A sensor, comprising:
a substrate including at least one pixel, the at least one pixel including:
an avalanche photodiode to convert incident light into electric charge and including a cathode of a first conductivity type and an anode of a second conductivity type, wherein the cathode is in a well region of the first conductivity type or the second conductivity type, and wherein the anode is at a perimeter of the well region;
a first material of the second conductivity type around the well region, wherein the first material is electrically connected to the anode; and
an insulating material around the first material and the anode.

(13)
The sensor of (12), further comprising:
a lens on the substrate, wherein the first material includes a portion between the lens and the well region.

(14)
The sensor of (13), further comprising:
an oxide film between the insulating material and the first material, and between the first material and the lens.

(15)
The sensor of (12), further comprising:
a metal film around the insulating material.

(16)
The sensor of (12), wherein the well region includes a first area of the second conductivity type and in contact with the cathode, and a second area of the first conductivity type or the second conductivity type in contact with the cathode and the anode.

(17)
The sensor of (14), wherein, the second area is the second conductivity type, and the first area and the second area have different impurity concentrations of the second conductivity type.

(18)
A sensor, comprising:
a first substrate including at least a first pixel in a pixel region, the first pixel including:
an avalanche photodiode to convert incident light to electric charge and including a first region, a second region, and a third region, wherein the first region is a first conductivity type, the second region is a second conductivity type, the third region is the first conductivity type or the second conductivity type, and the first and third regions are stacked;
an isolation region that isolates the third region from at least a second pixel, wherein the isolation region penetrates through the first substrate; and
a charge accumulation region of the second conductivity type between the third region and the isolation region, wherein the charge accumulation region is electrically connected to the second region.

(19)
The sensor of (18), wherein the charge accumulation region is between the isolation region and the third region and extends from a first surface of the first substrate toward a second surface of the first substrate opposite the first surface, wherein the first surface is at a light incident side of the first substrate.

(20)
The sensor of (18), wherein the isolation region includes:
a metal film penetrated through the first substrate.

(21)
The sensor of (18), further comprising:
a fourth region between the first region and third region, wherein the fourth region is the second conductivity type.

(22)
The sensor of (18), further comprising:
a lens on the first substrate to focus incident light toward the third region.

(23)
The sensor of (18), further comprising:
a second substrate including:
a first contact electrically connected to the first region;
a second contact electrically connected to the second region;
a first wiring electrically connected to the first contact; and
a second wiring electrically connected to the second contact.

(24)
The sensor of (23), further comprising:
a third substrate on the second substrate and electrically connected to the first wiring and the second wiring.

(25)
The sensor of (24), wherein the third substrate includes a third wiring and a fourth wiring, the first wiring is electrically connected to the third wiring, and the second wiring is electrically connected to the fourth wiring.

(26)
The sensor of (18), further comprising:
an oxide film between the isolation region and the charge accumulation region.

(27)
The sensor of (18), wherein if the third region is the first conductivity type, the first region and the third region have different impurity concentrations of the first conductivity type, wherein if the third region is the second conductivity type, the second region and the third region have different impurity concentrations of the second conductivity type, and wherein the second region and the charge accumulation region have different impurity concentrations of the second conductivity type.

(28)
The sensor of (18), further comprising:
a lens on the first substrate to focus incident light toward the third region;
a light shielding film on a same surface of the first substrate as the lens;
a first contact electrically connected to the light shielding film and configured to receive a bias voltage; and a second contact electrically connected to the isolation region and configured to receive the bias voltage.

(29)
The sensor of (24), further comprising:
a trench region in the first substrate, the trench region being in a peripheral region of the first substrate other than the pixel region.

(30)
The sensor of (29), further comprising:
a connection via penetrating through the first and second substrates to a wiring of the third substrate, wherein the trench region is between the pixel region and the connection via.

(31)
A photodetector comprising:
a high-electric-field region;
an isolation region for isolation from neighboring pixels; and
a hole accumulation region that traps electrons on a side wall of the isolation region,
wherein the hole accumulation region is electrically connected with an anode.

(32)
The photodetector according to (31),
wherein the hole accumulation region is formed also on a back surface side.

(33)
The photodetector according to (31),
wherein the hole accumulation region is a p-type semiconductor region.

(34)
The photodetector according to (31),
wherein the hole accumulation region is formed by induction of holes by a negative fixed charge film.

(35)
The photodetector according to (31),
wherein the hole accumulation region is formed by induction of holes by impressing of a voltage on a metallic film formed in the isolation region.

(36)
The photodetector according to (31),
wherein of a cathode constituting the high-electric-field region, other portion than a portion connected with a contact is embedded in a substrate,
a hole accumulation region is formed at a surface of the substrate in a region other than the portion connected with the contact, and
a potential of the hole accumulation region formed at the surface of the substrate is different from a potential of the anode.

(37)
The photodetector according to (36),
wherein the potential of the hole accumulation region formed at the surface of the substrate is identical to a ground potential or a potential of the cathode.

(38)
The photodetector according to (36),
wherein the portion connected with the contact is formed in a substantially central portion of the high-electric-field region.

(39)
The photodetector according to (36),
wherein the portion connected with the contact is formed near an end of the high-electric-field region, and
the hole accumulation region formed at the surface of the substrate is formed in a central portion of the high-electric-field region.

(40)
The photodetector according to (31),
wherein the anode is formed at a portion adjacent to the isolation region.

(41)
A photodetector comprising:
a high-electric-field region;
an isolation region for isolation from neighboring pixels; and
an electron accumulation region that traps holes on a side wall of the isolation region,
wherein the electron accumulation region is electrically connected with a cathode.

(42)
The photodetector according to (41),
wherein the electron accumulation region is formed also on a back surface side.

(43)
The photodetector according to (41),
wherein the electron accumulation region is an n-type semiconductor region.

(44)
The photodetector according to (41),
wherein the electron accumulation region is formed by induction of electrons by a positive fixed charge film.

(45)
The photodetector according to (41),
wherein the electron accumulation region is formed by induction of electrons by impressing of a voltage on a metallic film formed in the isolation region.

(46)
The photodetector according to (41),
wherein of an anode constituting the high-electric-field region, other portion than a portion connected with a contact is embedded in a substrate,
an electron accumulation region is formed at a surface of the substrate in a region other than the portion connected with the contact, and
a potential of the electron accumulation region formed at the surface of the substrate is different from a potential of the cathode.

(47)
The photodetector according to (46),
wherein the potential of the electron accumulation region formed at the surface of the substrate is identical to a ground voltage or a voltage of the anode.

(48)
The photodetector according to (46),
wherein the portion connected with the contact is formed in a substantially central portion of the high-electric-field region.

(49)
The photodetector according to (46),
wherein the portion connected with the contact is formed near an end of the high-electric-field region, and
the electron accumulation region formed at the surface of the substrate is formed in a central portion of the high-electric-field region.

(50)
The photodetector according to (41),
wherein the cathode is formed at a portion adjacent to the isolation region.

REFERENCE SIGNS LIST

21 APD
23 On-chip lens 101 n-type semiconductor region
102 p-type semiconductor region
103 Well layer
104 Contact
105 Anode
106 Contact
107 Hole accumulation region
108 Isolation region
151 Fixed charge film
171 Metallic film

What is claimed is:

1. A light detecting device, comprising:
a first semiconductor layer, including:
a first avalanche photodiode, including:
a first semiconductor region of a first conductivity type; and
a second semiconductor region of a second conductivity type, wherein the first avalanche photodiode is disposed in a pixel region of the light detecting device;
a first isolation region;
a third semiconductor region of the second conductivity type, wherein the third semiconductor region is disposed in a peripheral region; and
a light shielding film,
wherein the first isolation region is disposed between the pixel region and the peripheral region,
wherein a first portion of the light shielding film is disposed in the first isolation region and a second portion of the light shielding film is disposed on the third semiconductor region, and
wherein a portion of the light shielding film is in direct contact with at least a portion of a surface of the third semiconductor region.

2. The light detecting device of claim 1, further comprising:
a wiring layer, the wiring layer including:
a first wiring, wherein the first wiring is coupled to the first semiconductor region;
a second wiring, wherein the second wiring is coupled to the second semiconductor region; and
a third wiring, wherein the third wiring is coupled to the third semiconductor region.

3. The light detecting device of claim 2, wherein a first voltage applied to the second wiring is same as a second voltage applied to the third wiring.

4. The light detecting device of claim 2, wherein the wiring layer is on a side of the first semiconductor layer opposite a light incident surface side of the first semiconductor layer.

5. The light detecting device of claim 1, wherein the light shielding film includes at least one of tungsten, aluminum, copper, or polysilicon.

6. The light detecting device of claim 1, wherein the first conductivity type is opposite the second conductivity type.

7. The light detecting device of claim 2, wherein the first semiconductor layer is part of a first chip, the light detecting device further comprising:
a second chip.

8. The light detecting device of claim 7, wherein the second chip includes a fourth wiring, and a fifth wiring, wherein the fourth wiring is electrically connected to the first wiring, and wherein the fifth wiring is electrically connected to the second wiring.

9. The light detecting device of claim 8, wherein the second chip is stacked on the first chip.

10. The light detecting device of claim 8, wherein the first, second, third, fourth, and fifth wirings are one of copper or aluminum.

11. The light detecting device of claim 8, wherein the first wiring is directly bonded to the fourth wiring, and wherein the second wiring is directly bonded to the fifth wiring.

12. The light detecting device of claim 2, wherein the first, second, and third wirings are in a same layer of the wiring layer.

13. The light detecting device of claim 1, wherein the first isolation region extends from a light incident surface of the first semiconductor layer to a surface of the first semiconductor layer opposite the light incident surface.

14. The light detecting device of claim 1, wherein the light shielding film is electrically conductive.

15. The light detecting device of claim 14, wherein the light shielding film is formed from a metal.

16. The light detecting device of claim 14, wherein the light shielding film electrically connects the first isolation region and the third semiconductor region.

17. The light detecting device of claim 1, wherein the first isolation region includes a trench filled with an electrically conductive material.

18. The light detecting device of claim 1, wherein the first isolation region surrounds the first semiconductor region.

19. The light detecting device of claim 18, further comprising:
an on-chip lens, wherein the on-chip lens is disposed on a light incident surface side of the first semiconductor layer, and wherein the on-chip lens is adjacent an area encompassing the first avalanche photodiode.

20. The light detecting device of claim 1, wherein a third portion of the light shielding film is disposed on a planarizing film.

* * * * *